(12) United States Patent
Erickson, II et al.

(10) Patent No.: US 12,228,609 B2
(45) Date of Patent: Feb. 18, 2025

(54) ELECTRONICS TESTER

(71) Applicant: AEHR TEST SYSTEMS, Fremont, CA (US)

(72) Inventors: Gaylord Lewis Erickson, II, San Jose, CA (US); Jovan Jovanovic, Santa Clara, CA (US)

(73) Assignee: AEHR TEST SYSTEMS, Fremont, CA (US)

( * ) Notice: Subject to any disclaimer, the term of this patent is extended or adjusted under 35 U.S.C. 154(b) by 0 days.

(21) Appl. No.: 18/488,619

(22) Filed: Oct. 17, 2023

(65) Prior Publication Data

US 2024/0044971 A1 Feb. 8, 2024

Related U.S. Application Data

(62) Division of application No. 17/493,847, filed on Oct. 5, 2021, now Pat. No. 11,835,575.

(60) Provisional application No. 63/088,635, filed on Oct. 7, 2020.

(51) Int. Cl.
 *G01R 31/28* (2006.01)

(52) U.S. Cl.
 CPC ................ *G01R 31/2889* (2013.01)

(58) Field of Classification Search
 CPC ............ G01R 31/2889; G01R 31/2865; G01R 31/2893
 See application file for complete search history.

(56) References Cited

U.S. PATENT DOCUMENTS

| | | |
|---|---|---|
| 3,149,897 A | 9/1964 | Martineck |
| 3,413,613 A | 11/1968 | Bahrs |
| 3,482,201 A | 12/1969 | Schneck |
| 4,240,021 A | 12/1980 | Kashima et al. |
| 4,298,237 A | 11/1981 | Griffith et al. |
| 4,400,049 A | 8/1983 | Schuck |
| 4,473,798 A | 9/1984 | Cedrone et al. |
| 4,477,170 A | 10/1984 | Yamada et al. |
| 4,517,512 A | 5/1985 | Petrich et al. |
| 4,582,386 A | 4/1986 | Martens |
| 4,591,217 A | 5/1986 | Reimer |
| 4,608,679 A | 8/1986 | Rudy et al. |
| 4,719,411 A | 1/1988 | Buehler |
| 4,814,573 A | 3/1989 | Check et al. |

(Continued)

FOREIGN PATENT DOCUMENTS

| | | |
|---|---|---|
| CN | 1482660 A | 3/2004 |
| CN | 100348982 C | 11/2007 |

(Continued)

OTHER PUBLICATIONS

"Extended European Search Report issued on Dec. 7, 2020", European Patent Application No. 18761604.0, (9 pages).

(Continued)

*Primary Examiner* — Eman A Alkafawi
*Assistant Examiner* — Suresh K Rajaputra
(74) *Attorney, Agent, or Firm* — Stephen M. De Klerk

(57) ABSTRACT

A tester apparatus is described. Various components contribute to the functionality of the tester apparatus to facilitate movement of a wafer pack holding a vacuum without human oversight. These functionalities include a latch system to keep the wafer pack intact and a pressure sensing system to detect and relay a pressure in the wafer pack.

45 Claims, 24 Drawing Sheets

(56) References Cited

U.S. PATENT DOCUMENTS

| | | |
|---|---|---|
| 4,816,754 A | 3/1989 | Buechele et al. |
| 4,968,931 A | 11/1990 | Littlebury et al. |
| 4,981,449 A | 1/1991 | Buchter |
| 4,995,814 A | 2/1991 | Weidler |
| 5,008,615 A | 4/1991 | Littlebury |
| 5,034,688 A | 7/1991 | Moulene et al. |
| 5,086,269 A | 2/1992 | Nobi |
| 5,108,302 A | 4/1992 | Pfaff |
| 5,247,521 A | 9/1993 | Akao et al. |
| 5,461,326 A | 10/1995 | Woith et al. |
| 5,467,024 A | 11/1995 | Swapp |
| 5,515,126 A | 5/1996 | Baxter et al. |
| 5,517,126 A | 5/1996 | Yamaguchi |
| 5,534,785 A | 7/1996 | Yoshizaki et al. |
| 5,550,466 A | 8/1996 | Botka |
| 5,559,446 A | 9/1996 | Sano |
| 5,666,288 A | 9/1997 | Jones et al. |
| 5,773,986 A | 6/1998 | Thompson et al. |
| 5,808,896 A | 9/1998 | Weber |
| 5,821,440 A | 10/1998 | Khater et al. |
| 5,851,143 A | 12/1998 | Hamid |
| 5,886,535 A | 3/1999 | Budnaitis |
| 5,894,225 A | 4/1999 | Coffin |
| 5,928,036 A | 7/1999 | Thrush |
| 5,945,834 A | 8/1999 | Nakata et al. |
| 5,973,285 A | 10/1999 | Dietrich et al. |
| 5,982,183 A | 11/1999 | Sano |
| 6,005,401 A | 12/1999 | Nakata et al. |
| 6,023,173 A | 2/2000 | Khater et al. |
| 6,040,700 A | 3/2000 | Berar |
| 6,057,696 A | 5/2000 | Orso et al. |
| 6,084,215 A | 7/2000 | Furuya et al. |
| 6,084,419 A | 7/2000 | Sato et al. |
| 6,091,060 A | 7/2000 | Getchel et al. |
| 6,094,059 A | 7/2000 | Frankeny et al. |
| 6,094,060 A | 7/2000 | Frankeny et al. |
| 6,124,725 A | 9/2000 | Sato |
| 6,135,699 A | 10/2000 | Yutaka et al. |
| 6,137,303 A | 10/2000 | Deckert et al. |
| 6,203,582 B1 | 3/2001 | Berner |
| 6,244,874 B1 | 6/2001 | Tan |
| 6,255,834 B1 | 7/2001 | Smith |
| 6,268,740 B1 | 7/2001 | Iida |
| 6,318,243 B1 | 11/2001 | Jones |
| 6,339,321 B1 | 1/2002 | Yamashita et al. |
| 6,340,895 B1 | 1/2002 | Uher et al. |
| 6,358,061 B1 | 3/2002 | Regnier |
| 6,381,283 B1 | 4/2002 | Bhardwaj et al. |
| 6,384,613 B1 | 5/2002 | Cheng |
| 6,421,754 B1 | 7/2002 | Kau et al. |
| 6,509,751 B1 | 1/2003 | Mathieu et al. |
| 6,515,497 B1 | 2/2003 | Matsuzawa |
| 6,535,824 B1 | 3/2003 | Mansky et al. |
| 6,593,763 B2 | 7/2003 | Weber |
| 6,625,557 B1 | 9/2003 | Perkins et al. |
| 6,628,520 B2 | 9/2003 | Patel et al. |
| 6,644,982 B1 | 11/2003 | Ondricek et al. |
| 6,744,269 B1 | 6/2004 | Johnson et al. |
| 6,853,209 B1 | 2/2005 | Jovanovic |
| 6,867,608 B2 | 3/2005 | Richmond et al. |
| 6,876,321 B1 | 4/2005 | Slutzky et al. |
| 6,888,343 B1 | 5/2005 | Holt et al. |
| 6,994,563 B2 | 2/2006 | Amini et al. |
| 7,053,644 B1 | 5/2006 | Lindsey et al. |
| 7,108,517 B2 | 9/2006 | Harper |
| 7,137,849 B2 | 11/2006 | Nagata |
| 7,260,303 B2 | 8/2007 | Bench et al. |
| 7,332,918 B2 | 2/2008 | Sugiyama et al. |
| 7,382,142 B2 | 6/2008 | Chong et al. |
| 7,453,260 B2 | 11/2008 | Boyle et al. |
| 7,480,129 B2 | 1/2009 | Brown et al. |
| 7,762,822 B2 | 7/2010 | Richmond, II |
| 7,800,382 B2 | 9/2010 | Lindsey et al. |
| 7,826,995 B2 | 11/2010 | Maenner |
| 7,969,175 B2 | 6/2011 | Hendrickson et al. |
| 8,030,957 B2 | 10/2011 | Lindsey et al. |
| 8,035,406 B2 | 10/2011 | Mueller |
| 8,057,263 B1 | 11/2011 | Howard et al. |
| 8,118,618 B2 | 2/2012 | Richmond, II et al. |
| 8,228,085 B2 | 7/2012 | Lindsey et al. |
| 8,299,935 B2 | 10/2012 | Kiyokawa et al. |
| 8,388,357 B2 | 3/2013 | Richmond, II et al. |
| 8,444,107 B2 | 5/2013 | Akouka et al. |
| 8,462,471 B2 | 6/2013 | Huang et al. |
| 8,465,327 B2 | 6/2013 | Springer et al. |
| 8,506,335 B2 | 8/2013 | Richmond et al. |
| 8,628,336 B2 | 1/2014 | Richmond, II |
| 8,947,116 B2 | 2/2015 | Lindsey et al. |
| 8,974,116 B2 | 3/2015 | Okamoto et al. |
| 9,250,291 B2 | 2/2016 | Lindsey et al. |
| 9,316,683 B2 | 4/2016 | Richmond, II |
| 9,625,521 B2 | 4/2017 | Lindsey et al. |
| 9,880,197 B2 | 1/2018 | Lindsey et al. |
| 10,269,678 B1 | 4/2019 | Viswanathan et al. |
| 10,297,339 B2 | 5/2019 | Thordarson et al. |
| 10,401,385 B2 | 9/2019 | Lindsey et al. |
| 11,112,429 B2 | 9/2021 | Lindsey et al. |
| 11,255,903 B2 | 2/2022 | Richmond, II et al. |
| 11,488,695 B2 | 9/2022 | Lindsey et al. |
| 11,592,465 B2 | 2/2023 | Lindsey et al. |
| 11,835,575 B2 * | 12/2023 | Erickson, II ....... G01R 31/2889 |
| 2001/0012726 A1 | 8/2001 | O'Neal et al. |
| 2001/0032663 A1 | 10/2001 | Pelrine |
| 2002/0003432 A1 | 1/2002 | Leas et al. |
| 2002/0030502 A1 * | 3/2002 | Uher .................. G01R 31/2855 |
| | | 324/750.05 |
| 2002/0032896 A1 | 3/2002 | Fukuda et al. |
| 2002/0036342 A1 | 3/2002 | Koide |
| 2002/0048826 A1 | 4/2002 | Richmond et al. |
| 2002/0050402 A1 | 5/2002 | Japp et al. |
| 2002/0066726 A1 | 6/2002 | Cole, Sr. et al. |
| 2002/0067180 A1 | 6/2002 | Jaimsomporn et al. |
| 2002/0106927 A1 | 8/2002 | Bosy et al. |
| 2002/0139169 A1 | 10/2002 | Lueth, II et al. |
| 2002/0144213 A1 | 10/2002 | Ramaswamy et al. |
| 2003/0020459 A1 | 1/2003 | Lambert |
| 2003/0057130 A1 | 3/2003 | Fix et al. |
| 2003/0077932 A1 | 4/2003 | Lewinnek |
| 2003/0115037 A1 | 6/2003 | Sumida |
| 2003/0122550 A1 | 7/2003 | Kanamaru et al. |
| 2003/0137317 A1 | 7/2003 | Kim et al. |
| 2003/0237061 A1 | 12/2003 | Miller et al. |
| 2004/0113640 A1 | 6/2004 | Cooper et al. |
| 2004/0113645 A1 | 6/2004 | Richmond, II et al. |
| 2004/0113646 A1 | 6/2004 | Yamashita |
| 2004/0124829 A1 | 7/2004 | Swettlen et al. |
| 2004/0183561 A1 | 9/2004 | Takekoshi et al. |
| 2004/0212382 A1 | 10/2004 | Cram |
| 2004/0217772 A1 | 11/2004 | Kline |
| 2004/0223309 A1 | 11/2004 | Haemer |
| 2005/0007137 A1 | 1/2005 | Gunn et al. |
| 2005/0042932 A1 | 2/2005 | Mok et al. |
| 2005/0077281 A1 | 4/2005 | Hamilton et al. |
| 2005/0093561 A1 | 5/2005 | Watanabe et al. |
| 2005/0103034 A1 * | 5/2005 | Hamilton ........... G01R 31/2862 |
| | | 62/186 |
| 2005/0111944 A1 | 5/2005 | Aho et al. |
| 2005/0125712 A1 | 6/2005 | Co et al. |
| 2006/0091212 A1 | 5/2006 | Chein et al. |
| 2006/0125502 A1 | 6/2006 | Lindsey et al. |
| 2006/0132159 A1 | 6/2006 | Tamaishi |
| 2006/0139042 A1 | 6/2006 | Kasukabe |
| 2006/0170435 A1 | 8/2006 | Granicher et al. |
| 2006/0186904 A1 | 8/2006 | Natsuhara et al. |
| 2006/0198211 A1 | 9/2006 | Frankowsky |
| 2006/0263925 A1 | 11/2006 | Chandler |
| 2007/0001790 A1 | 1/2007 | Richmond, II et al. |
| 2007/0018681 A1 | 1/2007 | Sartschev |
| 2007/0028834 A1 | 2/2007 | Awazu et al. |
| 2007/0029979 A1 | 2/2007 | Williams et al. |
| 2007/0107656 A1 | 5/2007 | Shinozaki et al. |
| 2007/0273216 A1 | 11/2007 | Farbarik |
| 2007/0296422 A1 | 12/2007 | Miller |
| 2008/0022695 A1 | 1/2008 | Welle |

(56) References Cited

U.S. PATENT DOCUMENTS

| | | |
|---|---|---|
| 2008/0048688 A1 | 2/2008 | Mathieu et al. |
| 2008/0079451 A1 | 4/2008 | Maenner |
| 2008/0124951 A1 | 5/2008 | Cox et al. |
| 2008/0150125 A1 | 6/2008 | Braunisch et al. |
| 2008/0186046 A1 | 8/2008 | Yun et al. |
| 2008/0224723 A1 | 9/2008 | Washio et al. |
| 2009/0015282 A1* | 1/2009 | Steps ............. G01R 31/2863 324/750.01 |
| 2009/0143923 A1 | 6/2009 | Breed |
| 2009/0160468 A1* | 6/2009 | Lindsey ........... G01R 31/31908 324/555 |
| 2009/0212803 A1 | 8/2009 | Yamamoto et al. |
| 2009/0237102 A1 | 9/2009 | Lou et al. |
| 2010/0063637 A1 | 3/2010 | Crowell et al. |
| 2010/0141288 A1 | 6/2010 | Di Lello |
| 2010/0175866 A1 | 7/2010 | Tani et al. |
| 2010/0213957 A1 | 8/2010 | Richmond et al. |
| 2010/0213960 A1 | 8/2010 | Mok et al. |
| 2010/0244866 A1 | 9/2010 | Lindsey et al. |
| 2011/0006800 A1 | 1/2011 | Lindsey et al. |
| 2011/0248737 A1 | 10/2011 | Takeshita et al. |
| 2011/0271159 A1 | 11/2011 | Ahn et al. |
| 2011/0273831 A1 | 11/2011 | Kyle |
| 2011/0298630 A1 | 12/2011 | Kiyokawa et al. |
| 2011/0316577 A1 | 12/2011 | Lindsey et al. |
| 2012/0043984 A1 | 2/2012 | Yashar et al. |
| 2012/0075807 A1 | 2/2012 | Refai-Ahmed et al. |
| 2012/0136614 A1 | 5/2012 | Liu et al. |
| 2012/0142210 A1 | 6/2012 | Di Stefano |
| 2012/0229159 A1 | 9/2012 | Kim et al. |
| 2012/0280704 A1 | 11/2012 | Lindsey et al. |
| 2013/0055184 A1 | 2/2013 | Shroff |
| 2013/0224891 A1 | 8/2013 | Takizawa |
| 2013/0304412 A1 | 11/2013 | Richmond, II et al. |
| 2013/0342236 A1 | 12/2013 | Song et al. |
| 2014/0125371 A1 | 5/2014 | Chung et al. |
| 2014/0232424 A1 | 8/2014 | Richmond, II et al. |
| 2015/0109011 A1 | 4/2015 | Lindsey et al. |
| 2015/0137842 A1 | 5/2015 | Murakami et al. |
| 2015/0204942 A1 | 7/2015 | Scocchetti |
| 2015/0260793 A1 | 9/2015 | Chen |
| 2015/0309114 A1 | 10/2015 | Barabi et al. |
| 2016/0103179 A1 | 4/2016 | Lindsey et al. |
| 2017/0134587 A1 | 5/2017 | Lawson et al. |
| 2017/0358515 A1 | 12/2017 | Murdock |
| 2018/0080981 A1 | 3/2018 | Steps et al. |
| 2018/0182599 A1 | 6/2018 | Stowell et al. |
| 2019/0019711 A1 | 1/2019 | Tamura |
| 2019/0339303 A1 | 11/2019 | Lindsey et al. |
| 2020/0033404 A1 | 1/2020 | Hyakudomi et al. |
| 2020/0300908 A1 | 9/2020 | Steps et al. |
| 2020/0411410 A1 | 12/2020 | Klein et al. |
| 2022/0107358 A1 | 4/2022 | Erickson, II et al. |
| 2022/0137121 A1 | 5/2022 | Richmond, II et al. |

FOREIGN PATENT DOCUMENTS

| | | |
|---|---|---|
| CN | 101084447 A | 12/2007 |
| CN | 101137947 A | 3/2008 |
| CN | 101675350 A | 3/2010 |
| CN | 101750558 A | 6/2010 |
| CN | 101952733 A | 1/2011 |
| CN | 104865414 A | 8/2015 |
| CN | 110383092 B | 4/2022 |
| DE | 3914669 A1 | 11/1989 |
| DE | 19781822.6 | 9/2004 |
| EP | 0320660 A2 | 6/1989 |
| EP | 0639777 A1 | 8/1994 |
| EP | 2772768 A1 | 9/2014 |
| GB | 2285348 A | 7/1995 |
| JP | 61-065319 | 4/1986 |
| JP | 02-071540 A | 3/1990 |
| JP | H06-186283 A | 7/1994 |
| JP | H06-347477 A | 12/1994 |
| JP | 08-005666 A | 1/1996 |
| JP | H07-169806 A | 7/1996 |
| JP | 08-340030 A | 12/1996 |
| JP | 09-115971 | 5/1997 |
| JP | 10-116867 A | 5/1998 |
| JP | 10-256325 A | 9/1998 |
| JP | 1999-121569 A | 4/1999 |
| JP | H11-121550 A | 4/1999 |
| JP | 11-145216 A | 5/1999 |
| JP | 11-145234 A | 5/1999 |
| JP | H11-145225 A | 5/1999 |
| JP | H11-284037 A | 10/1999 |
| JP | 2001-203244 A | 7/2001 |
| JP | 2002-43381 A | 2/2002 |
| JP | 2002-90426 A | 3/2002 |
| JP | 2002-151558 A | 5/2002 |
| JP | 2003-139816 A | 5/2003 |
| JP | 2004-228313 A | 8/2004 |
| JP | 2005-516226 A | 6/2005 |
| JP | 2005-265786 A | 9/2005 |
| JP | 2006-98064 A | 4/2006 |
| JP | 2006-184044 A | 7/2006 |
| JP | 2007-024702 A | 2/2007 |
| JP | 2008-166306 A | 7/2008 |
| JP | 2008-232667 A | 10/2008 |
| JP | 2008-541415 A | 11/2008 |
| JP | 2010-066091 A | 3/2010 |
| JP | 5528617 B1 | 4/2014 |
| JP | 2015-103552 A | 6/2015 |
| JP | 2016-014614 A | 1/2016 |
| JP | 6538808 A1 | 6/2019 |
| JP | H11-121549 A | 4/2024 |
| KR | 10-1994-0032588 | 12/1994 |
| KR | 10-2005-0024395 | 3/2005 |
| KR | 10-2008-0011213 | 1/2008 |
| KR | 10-2012-0063576 | 6/2012 |
| SU | 1247600 A | 7/1986 |
| TW | 201632888 A | 9/2003 |
| TW | I225156 B | 12/2004 |
| TW | 200521443 | 7/2005 |
| TW | 200523562 A | 7/2005 |
| TW | 200627573 A | 8/2006 |
| TW | 200706888 A | 2/2007 |
| TW | 200710412 A | 3/2007 |
| TW | I276815 B | 3/2007 |
| TW | 200831932 A | 8/2008 |
| TW | 201115164 A1 | 5/2011 |
| TW | 201140105 A1 | 11/2011 |
| WO | 95/02196 A1 | 1/1995 |
| WO | 01/04641 A2 | 1/2001 |
| WO | 2001004641 A2 | 1/2001 |
| WO | 2003065064 A2 | 8/2003 |
| WO | 2004/003581 A1 | 1/2004 |
| WO | 2004/008163 | 1/2004 |
| WO | 2004095571 A1 | 11/2004 |
| WO | 2006/009061 | 1/2006 |
| WO | 2006038257 A1 | 4/2006 |
| WO | 2006/096361 A2 | 9/2006 |
| WO | 2006113708 A3 | 10/2006 |
| WO | 2006/116767 A1 | 11/2006 |
| WO | 2007010610 A1 | 1/2007 |
| WO | 2008/124068 A1 | 10/2008 |
| WO | 2017210108 A1 | 12/2017 |

OTHER PUBLICATIONS

"First Office Action mailed on Aug. 17, 2020 with English translation", Japanese Patent Application No. 2019-106294, (4 pages).
"First Office Action mailed on Dec. 14, 2022", R.O.C. Patent Application No. 111137536, (4 pages).
"First Office Action mailed on Dec. 27, 2022 with English translation", Japanese Patent Application No. 2021-197754, (4 pages).
"First Office Action mailed on Feb. 7, 2022 with English Translation", Japanese Patent Application No. 2019-548053, (6 pages).
"First Office Action mailed on Jul. 10, 2020 with English translation", Chinese Patent Application No. 201780011541.6, (68 pages).
"First Office Action mailed on Jul. 21, 2021 with English translation", Chinese Patent Application No. 201880015746.6, (20 pages).

(56) References Cited

OTHER PUBLICATIONS

"First Office Action mailed on Jun. 15, 2022 with English translation", Korean Patent Application No. 10-2019-7028508, (10 pages).
"First Office Action mailed on Mar. 9, 2022 with English translation", R.O.C. Patent Application No. 110115369, (12 pages).
"First Office Action mailed on Nov. 12, 2020 with English translation", Japanese Patent Application No. 2018-535825, (7 pages).
"First Office Action mailed on Sep. 28, 2021 with English translation", R.O.C Patent Application No. 107107096, (11 pages).
"International Search Report and Written Opinion", International Patent Application No. PCT/US2021/053445, Feb. 14, 2022, (14 pages).
"International Search Report and Written Opinion dated Jan. 14, 2016", International PCT Application No. PCT/US15/56429 with International Filing Date of Oct. 20, 2015, (11 pages).
"International Search Report and Written Opinion mailed on Jun. 25, 2018", International PCT Patent Application No. PCT/US2018/019934, (15 pages).
"International Search Report and Written Opinion mailed on Mar. 30, 2017", International PCT Application No. PCT/US2017/012597 with International Filing Date of Jan. 6, 2017, (11 pages).
"Invitation to Pay Additional Fees mailed on Apr. 12, 2018", International PCT Patent Application No. PCT/US2018/019934, (3 pages).
"Japanese Office Action—mailed on Jul. 18, 2017 (with English translation)", Japanese Patent Application No. 2016-184497, (9 pages).
"Non Final Office Action mailed on Apr. 9, 2021", United States U.S. Appl. No. 16/576,555, (17 pages).
"Non Final Office Action mailed on Aug. 19, 2020", U.S. Appl. No. 16/899,246, (13 pages).
"Non Final Office Action mailed on Dec. 11, 2019", U.S. Appl. No. 16/172,249, (11 pages).
"Non Final Office Action mailed on Feb. 9, 2018", U.S. Appl. No. 15/823,290, (7 pages).
"Non Final Office Action mailed on Jun. 29, 2021", U.S. Appl. No. 16/831,485, (14 pages).
"Non Final Office Action mailed on Sep. 20, 2022", U.S. Appl. No. 17/253,646, (8 pages).
"Notice of Allowance mailed on Jul. 18, 2023", U.S. Appl. No. 18/176,965, (10 pages).
"Notice of Grounds for Rejection mailed on Jun. 15, 2017 (with English Translation)", Korean Patent Application No. 10-2017-7004733, (14 pages).
"Notice of Reasons for Rejection mailed Oct. 15, 2018 with English translation", Japanese Patent Application No. 2017-228718, (6 pages).
"Office Action mailed on Apr. 13, 2023 with English translation", Japanese Patent Application No. 2022 045659, (3 pages).
"Office Action mailed on Feb. 27, 2020 with English Translation", R.O.C. Patent Application No. 106100392, (3 pages).
"Official Notification mailed on Sep. 6, 2021 with English translation", Japanese Patent Application No. 2020-197424, (6 pages).
"Search Report and Written Opinion", Singapore Patent Application No. 10202108629Y mailed on Feb. 24, 2022, (9 pages).
"Second Office Action mailed on Aug. 23, 2021 with English Translation", Japanese Patent Application No. 2018-535825, (5 pages).
"Second Office Action mailed on May 23, 2023", R.O.C. Patent Application No. 111137536, (8 pages).
"Extended European Search Report issued on Jan. 31, 2024", European Patent Application No. 23205767.9, (9 pages).
"First Office Action mailed Dec. 19, 2023 with English translation", Japanese Patent Application No. 2022-168114, (12 pages).
"First Office Action mailed Mar. 26, 2024 with English translation", Chinese Patent Application No. 202210265243.2, (7 pages).
"Notice of Allowance mailed on Jul. 17, 2024", U.S. Appl. No. 18/523,604, (8 pages).
"Office Action and Search Report mailed on Mar. 12, 2024", Singapore Patent Application No. 11202302449Y, (11 pages).
"Office Action mailed on Apr. 21, 2024 with English translation", Korean Patent Application No. 10-2018-7022771, (24 Pages).
"Office Action mailed on Oct. 26, 2023 with English translation", Korean Patent Application No. 10-2023-7003482, (17 pages).
"Extended European Search Report mailed on Sep. 30, 2024", European Patent Application No. 21878311.6, (9 pages).
"International Search Report and Written Opinion mailed on Aug. 2, 2024", International PCT Patent Application No. PCT/US2023/086080, (15 pages).
"Notice of Allowance mailed on Jul. 30, 2024", U.S. Appl. No. 18/485,716, (10 pages).
"Office Action mailed on Aug. 6, 2024", Japanese Patent Application No. 2023-131868, (7 pages).
"Second Office Action mailed on Aug. 29, 2024 with English translation", Chinese Patent Application No. 202210265243.2, (22 pages).
"Non Final Office Action mailed on Nov. 22, 2024", U.S. Appl. No. 17/813,298, (23 pages).
"Notice of Allowance mailed on Nov. 22, 2024", U.S. Appl. No. 18/825,962, (9 pages).
"Non Final Office Action mailed on Nov. 29, 2024", U.S. Appl. No. 18/825,970, (15 pages).
"Notification of Acceptance of Request for Invalidation with English Translation mailed on Nov. 15, 2022", Chinese Patent Application No. 201310159573.4, (147 pages).
"Office Action mailed on Nov. 7, 2024 with English translation", Japanese Patent Application No. 2023-521543, (9 pages).
Ivy, W.L, et al., "Sacrificial Metal Wafer Level Burn-In KGD", 2000 Proceedings. 50th Electronic Components and Technology Conference (Cat. No.00CH37070). May 21-24, 2000, (6 pages).

\* cited by examiner

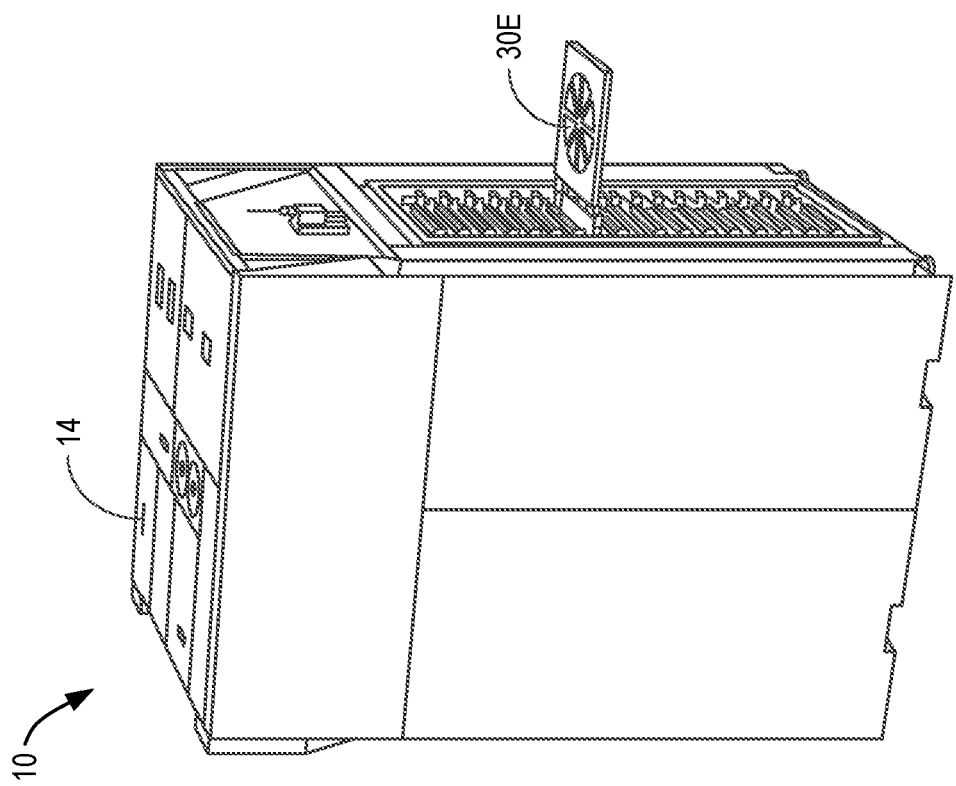

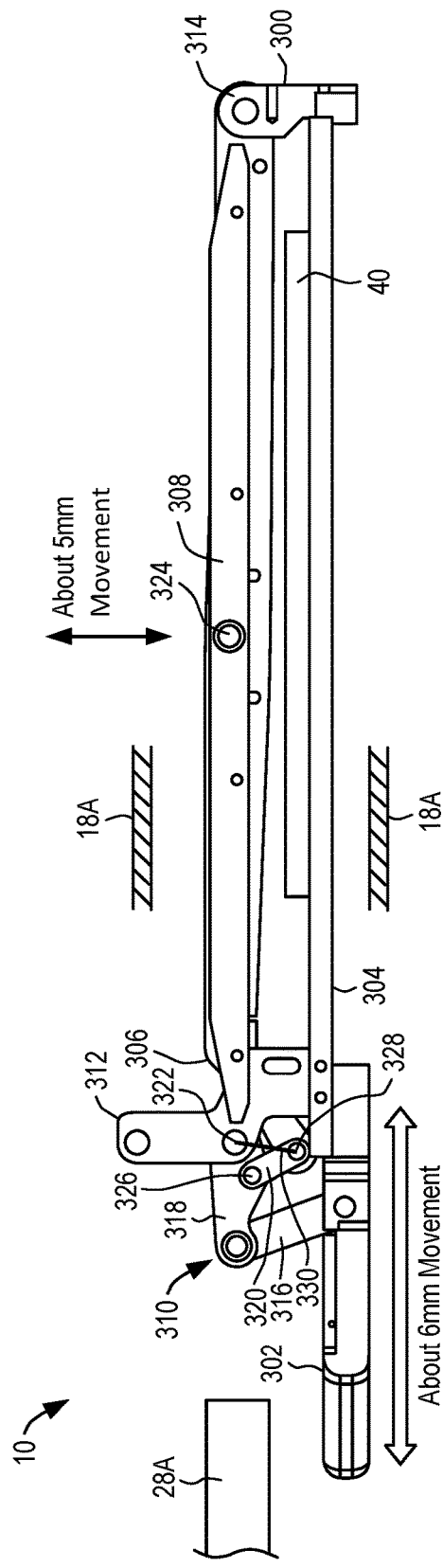
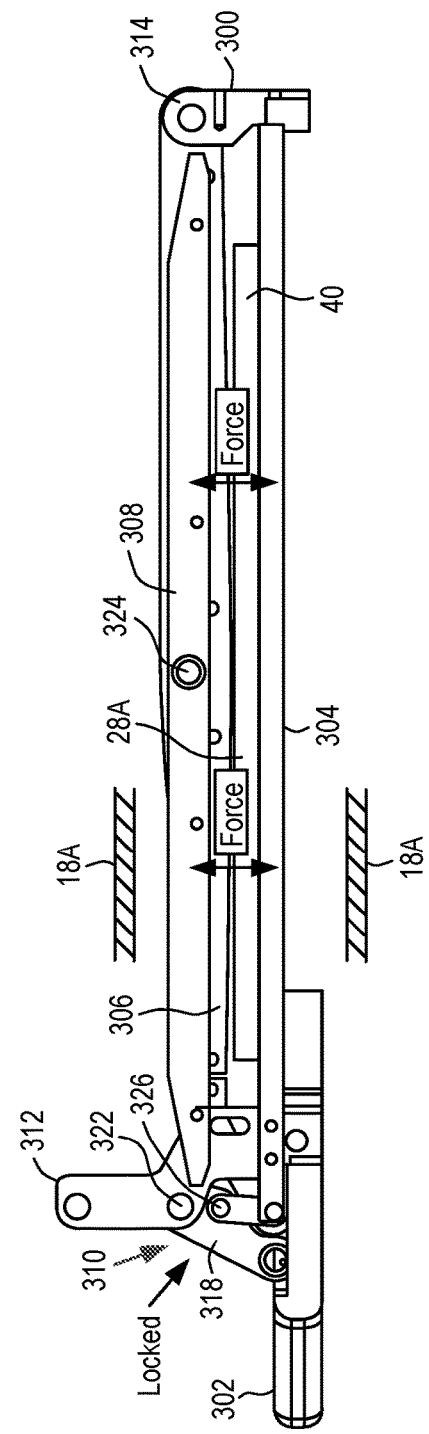
FIG. 9A
FIG. 9B

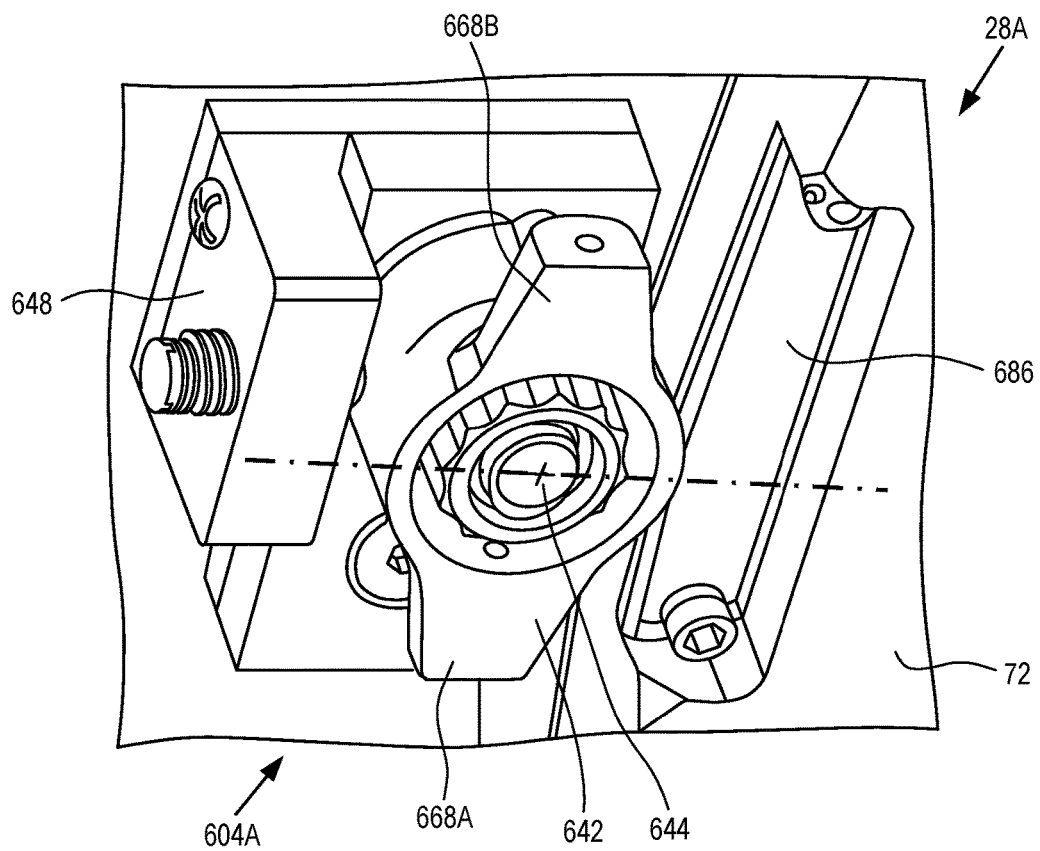
FIG. 18a(i)
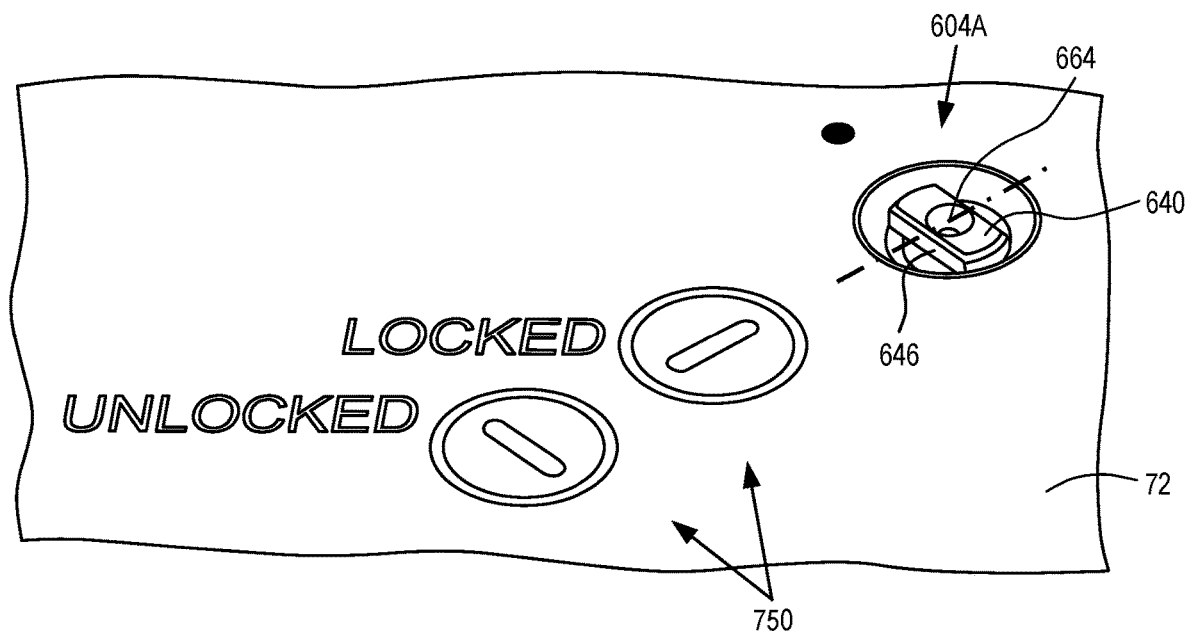
FIG. 18a(ii)

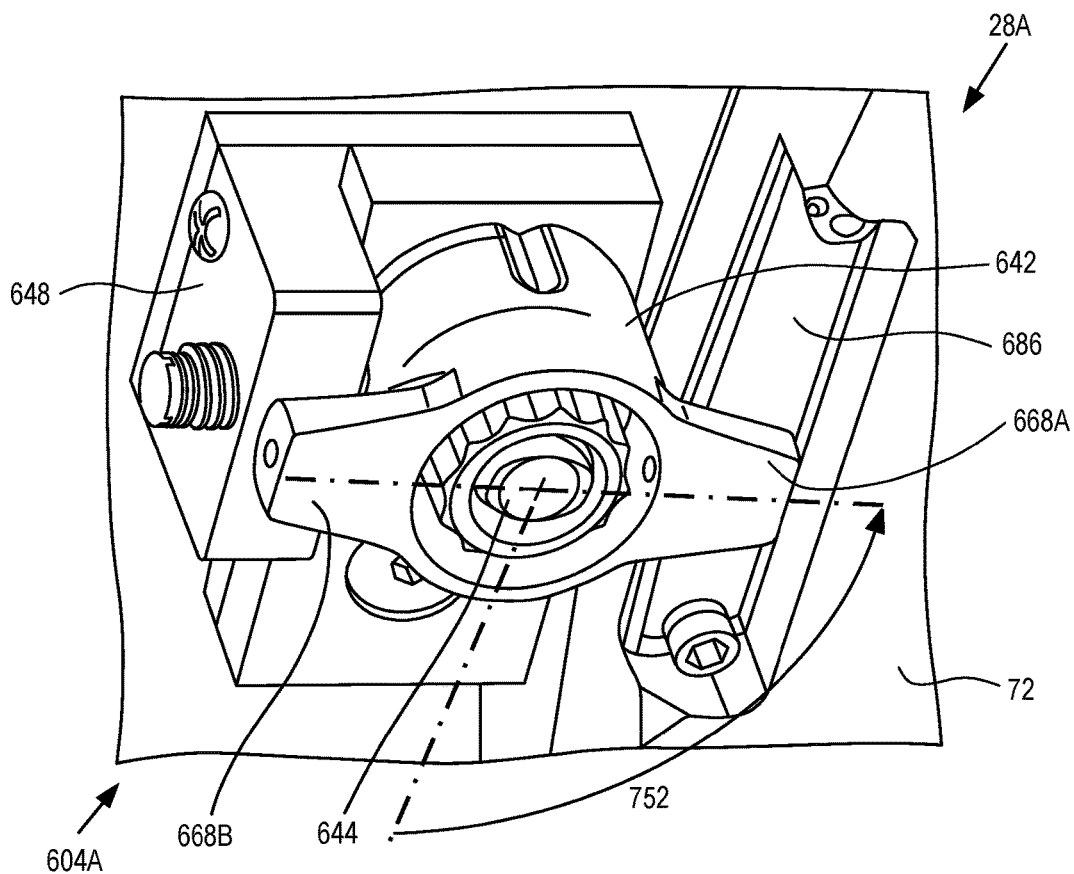
FIG. 18b(i)
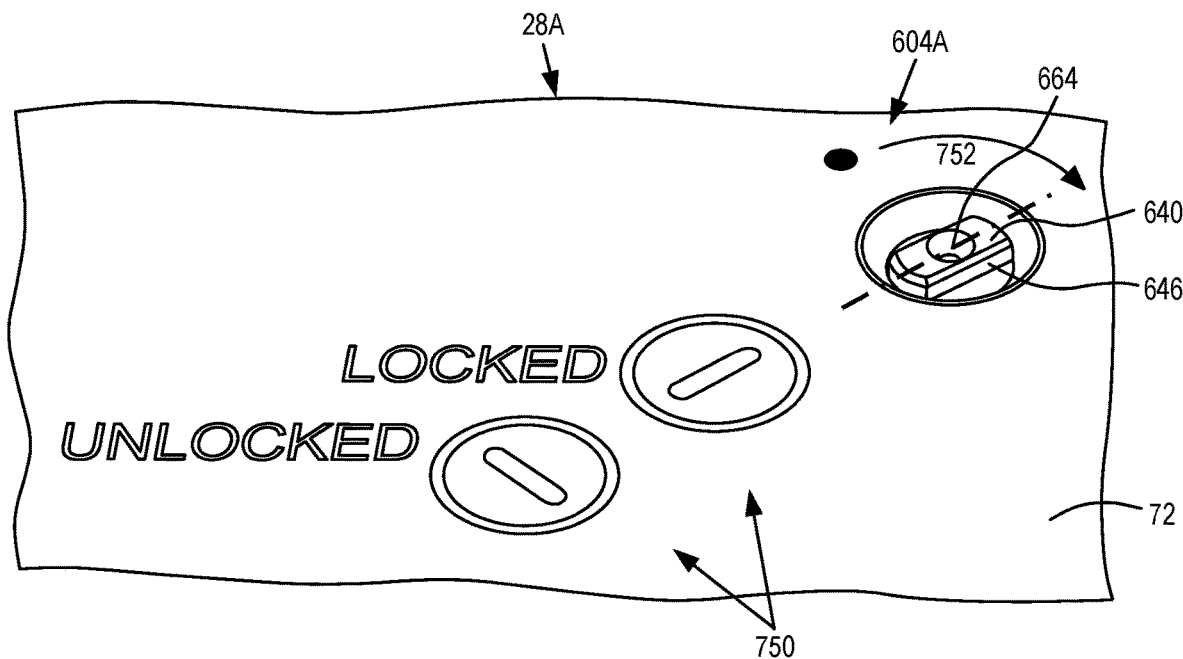
FIG. 18b(ii)

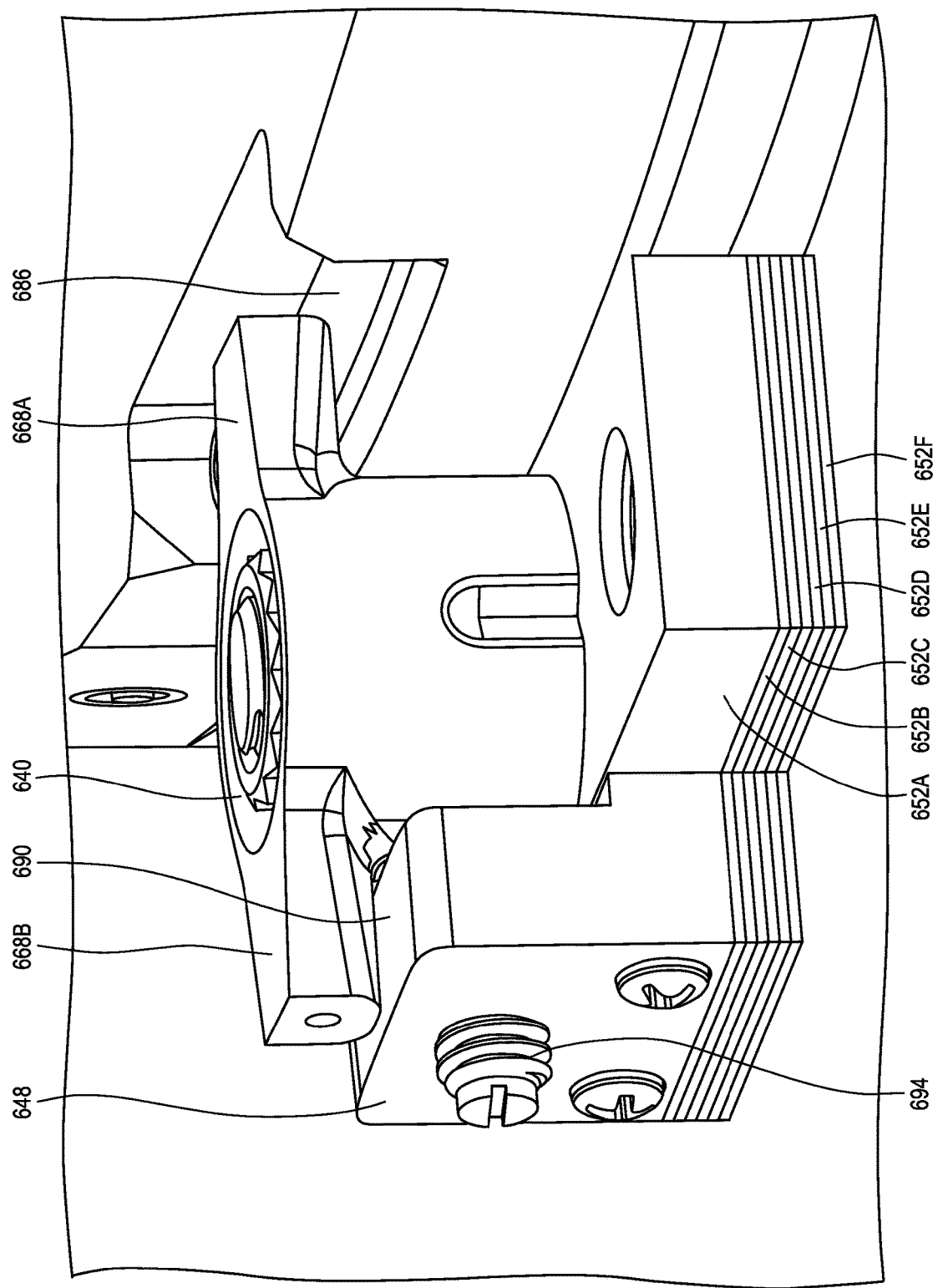

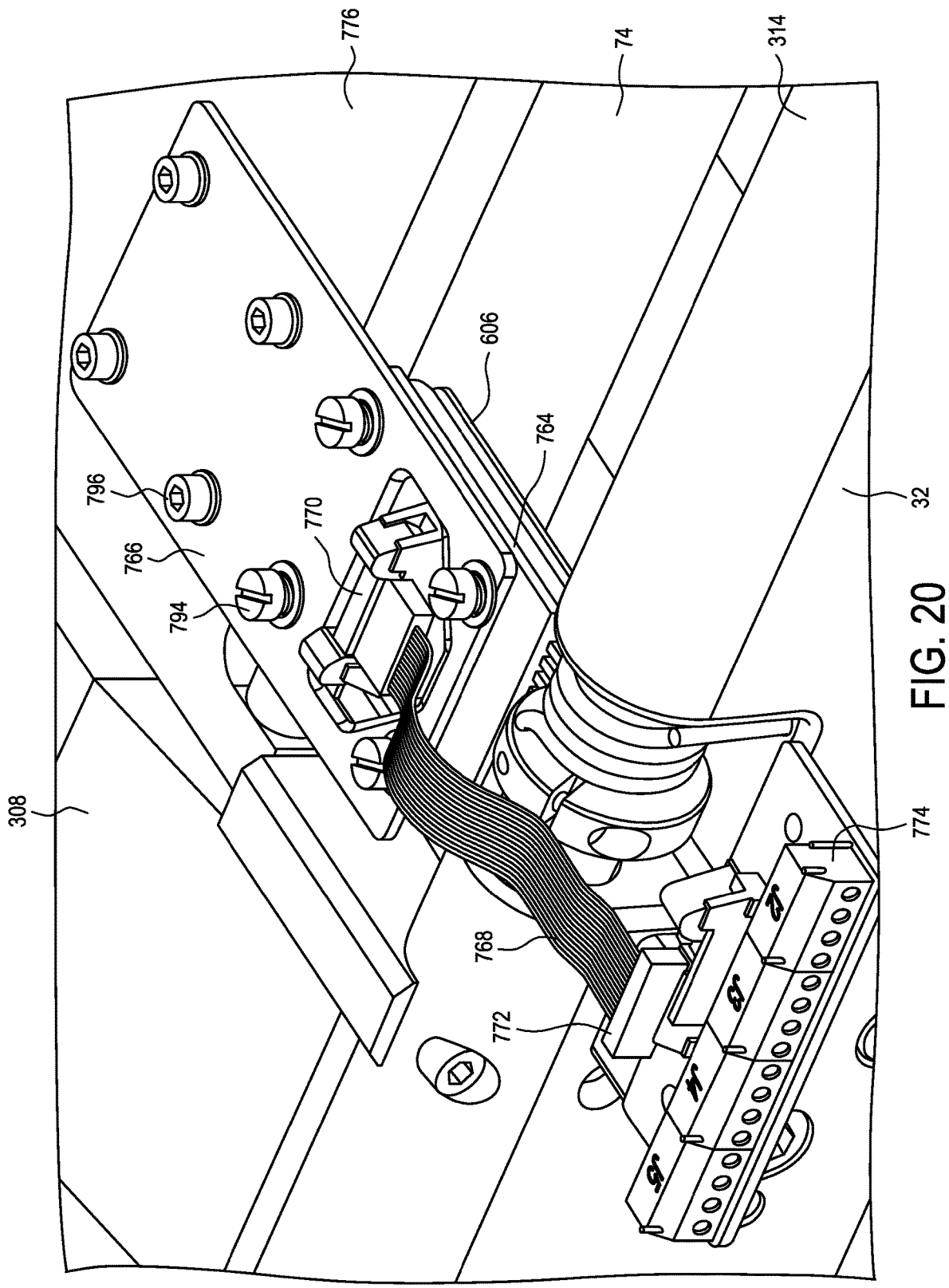

ELECTRONICS TESTER

CROSS-REFERENCE TO RELATED APPLICATIONS

This application is a division of U.S. patent application Ser. No. 17/493,847, filed on Oct. 5, 2021, which claims priority from U.S. Provisional Patent Application No. 63/088,635, filed on Oct. 7, 2020, which are hereby incorporated by reference into the present application in their entirety.

BACKGROUND OF THE INVENTION

1). Field of the Invention

This invention relates to a tester apparatus that is used for testing microelectronic circuits.

2). Discussion of Related Art

Microelectronic circuits are usually fabricated in and on semiconductor wafers. Such a wafer is subsequently "singulated" or "diced" into individual dies. Such a die is typically mounted to a supporting substrate for purposes of providing rigidity thereto and for electronic communication with an integrated or microelectronic circuit of the die. Final packaging may include encapsulation of the die and the resulting package can then be shipped to a customer.

It is required that the die or the package be tested before being shipped to the customer. Ideally, the die should be tested at an early stage for purposes of identifying defects that occur during early stage manufacture. Wafer level testing may be accomplished by providing a handler and a contactor with contacts and then using the handler to move the wafer so that contacts on the wafer make contact with the contacts on the contactor. Power and electronic signals can then be provided through the contactor to and from microelectronic circuits formed in the wafer.

According to various embodiments a wafer includes a substrate such as a silicon substrate or a printed circuit board and one or more devices fabricated in the substrate or mounted to the substrate.

Alternatively, the wafer can be located within a portable wafer pack having an electrical interface and a thermal chuck. Power and signals can be provided through the electric interface to and from the wafer while a temperature of the wafer is thermally controlled by heating or cooling the thermal chuck.

After the wafer is singulated it may again be required to test the individual dies, and it may again be required to test the die after it is mounted to a supporting substrate.

SUMMARY OF THE INVENTION

The invention provides a microelectronic circuit testing pack, including a portable supporting structure including first and second components for holding a substrate therebetween, the substrate carrying a microelectronic circuit and having a plurality of terminals connected to the microelectronic circuit, a plurality of contacts on the second component, the contacts matching the terminals for making contact to the terminals, a pressure differential cavity seal between the first and second components, the pressure differential cavity seal forming an enclosed pressure differential cavity together with surfaces of the first and second components, a pressure reduction passage formed through one of the first and second components, the pressure reduction passage having an inlet opening at the pressure differential cavity and an outlet opening outside the pressure differential cavity, a pressure reduction valve connected to the pressure reduction passage, opening of the pressure reduction valve allowing air out of the pressure differential cavity to move the first and second components relatively towards one another for ensuring proper contact between the contacts and the terminals, and closing of the pressure reduction valve keeping air from entering the pressure differential cavity, a first interface, on the portable supporting structure and connected to the contacts, for connection to a second interface on a stationary structure when the portable supporting structure is removably held by the stationary structure, and a latch system that includes a first latch assembly that may include a first part that engages with the first component, a second part that engages with the second component, connecting part having opposing ends secured to the first and second parts respectively to form a locking arrangement, and an engaging mechanism connected to the locking arrangement and operable to move the locking arrangement between a locking position wherein the locking arrangement maintains the first and second components locked in a closed position and an unlocked position wherein the locking arrangement permits movement of the first and second components from the closed relationship into a spaced relationship.

The microelectronic circuit testing pack may include that the engaging mechanism causes the second component to move between the locking position and the unlocked position.

The microelectronic circuit testing pack may include that the second component rotates between the locking position and the unlocked position.

The microelectronic circuit testing pack may include that the engaging mechanism includes a surface on the first part that forms a seat for contacting with a surface on a jaw of a tool, the jaw of the tool being rotatable to rotate the first part and the first part rotating the second part through the connecting part to move between the locking position and the unlocked position.

The microelectronic circuit testing pack may include that the surface on the first part that forms the seat is an external surface of the first part.

The microelectronic circuit testing pack may include that the first part has a tool pin opening therein for aligning a pin of the tool with the first part.

The microelectronic circuit testing pack may include that the second part has a body and at least a first wing piece extending from the body, wherein the first wing piece moves over a shoulder of the first component when moving into a first locking position and off the shoulder when moving out of the first locking position towards the unlocked position.

The microelectronic circuit testing pack may include that the second part has a second wing piece extending from the body, wherein the second wing piece moves over the shoulder of the first component when moving into a second locking position and off the shoulder when moving out of the second locking position towards the unlocked position.

The microelectronic circuit testing pack may include that the latch system may further include a tuning block mounted in a stationary position relative to the first component, the tuning block having a levelling surface over which the second wing piece is located when the first wing piece is located over the shoulder, the second part being adjustable relative to the first part to adjust a gap between the levelling surface and the second wing piece.

The microelectronic circuit testing pack may include that the latch system may further include a locking nut that has thread that engages with a thread on the connecting part to adjust the second part rotationally relative to the connecting part.

The microelectronic circuit testing pack may include that the latch system may further include a shim between the tuning block and the first component, to adjust a distance between the levelling surface and the first component.

The microelectronic circuit testing pack may include that the latch system may further include a snap mechanism having a snap surface that snaps into a first snap depression to resist movement of the second component out of the locking position and into a second snap depression to resist movement of the second component out of the unlocked position.

The microelectronic circuit testing pack may include that the first and second snap depressions are located on the locking arrangement.

The microelectronic circuit testing pack may include that the first and second snap depressions are located on the second part.

The microelectronic circuit testing pack may include that the first component includes a backing plate and a signal distribution board, wherein a portion of the signal distribution board is located between the backing plate and the second component, the signal distribution board having an opening through which the connecting part is inserted, the opening having a first dimension on an axis towards a center point of the signal distribution board that is larger than a second dimension transverse to the axis, the connecting part having a first portion that is smaller than the first dimension in a direction of the axis to allow for thermal expansion of the signal distribution board and the backing plate relative to one another and the first portion being dimensioned to slidably fit within the second dimension of the opening to prevent movement of the signal distribution board in a direction transverse to the axis relative to the backing plate.

The microelectronic circuit testing may include that the connecting part has a second portion with a first thickness that can fit through the opening in the direction of the axis during said insertion and is larger than the second dimension of the opening, and a second thickness transverse to the first thickness that can fit through the second dimension of the opening during said insertion.

The microelectronic circuit testing pack may include that the latch system may further include a second latch assembly, wherein each respective latch assembly that may include a first part that engages with the first component, a second part that engages with the second component, a connecting part having opposing ends secured to the first and second parts respectively to form a locking arrangement, and an engaging mechanism connected to the locking arrangement and operable to move the locking arrangement between a locking position wherein the locking arrangement maintains the first and second components locked in the closed position and an unlocked position wherein the locking arrangement permits movement of the first and second components from the closed relationship into the spaced relationship.

The microelectronic circuit testing pack may include that the first and second latch assemblies have respective second parts that are on different sides of the second component.

The microelectronic circuit testing pack may include that the pressure differential cavity seal surrounds the contacts and the terminals.

The microelectronic circuit testing pack may include that the pressure differential cavity seal is secured to the first component when the first and second components are apart.

The microelectronic circuit testing pack may include that the pressure differential cavity seal is a lip seal.

The microelectronic circuit testing pack may include that the pressure reduction valve is a pressure reduction check valve, a vacuum release passage being formed through a component having the pressure reduction check valve, the vacuum release passage having an inlet opening at the pressure differential cavity and an outlet opening outside the pressure differential cavity, further including a second valve, being a vacuum release valve connected to the vacuum release passage, opening of the vacuum release valve allowing air into the pressure differential cavity and closing of the vacuum release valve keeping air from escaping out of the pressure differential cavity.

The microelectronic circuit testing pack may include that the substrate is a wafer with a plurality of microelectronic circuits.

The microelectronic circuit testing pack may include that the contacts are pins, each pin having a spring that is depressed against a spring force thereof when the respective contact is depressed by a respective one of the terminals.

The invention also provides a tester apparatus, including a portable supporting structure including first and second components for holding a substrate therebetween, the substrate carrying a microelectronic circuit and having a plurality of terminals connected to the microelectronic circuit, a plurality of contacts on the second component, the contacts matching the terminals for making contact to the terminals, a pressure differential cavity seal between the first and second components, the pressure differential cavity seal forming an enclosed pressure differential cavity together with surfaces of the first and second components, a pressure reduction passage formed through one of the first and second components, the pressure reduction passage having an inlet opening at the pressure differential cavity and an outlet opening outside the pressure differential cavity, a pressure reduction valve connected to the pressure reduction passage, opening of the pressure reduction valve allowing air out of the pressure differential cavity to move the first and second components relatively towards one another for ensuring proper contact between the contacts and the terminals, and closing of the pressure reduction valve keeping air from entering the pressure differential cavity, a first interface on the portable supporting structure and connected to the contacts, a first latch assembly that may include a first part that engages with the first component, a second part that engages with the second component, a connecting part having opposing ends secured to the first and second parts respectively to form a locking arrangement, and an engaging mechanism connected to the locking arrangement and operable to move the locking arrangement between a locking position wherein the locking arrangement maintains the first and second components locked in a closed position and an unlocked position wherein the locking arrangement permits movement of the first and second components from the closed relationship into a spaced relationship, a stationary structure, the portable supporting structure being receivable to be held by the stationary structure and being removable from the stationary structure, a second interface on the stationary structure, the second interface being connected to the first interface when the portable supporting structure is held by the stationary structure, and being disconnected from the first interface when the portable supporting structure is removed from the stationary structure, and an electrical tester connected through the second interface, the first interface, and the contacts to the terminals so that signals are transmitted between the electrical tester and the microelectronic circuit to test the microelectronic circuit.

The tester apparatus may include that the engaging mechanism causes the second component to move between the locking position and the unlocked position.

The tester apparatus may include that the second component rotates between the locking position and the unlocked position.

The tester apparatus may include that the engaging mechanism includes a surface on the first part that forms a seat for contacting with a surface on a jaw of a tool, the jaw of the tool being rotatable to rotate the first part and the first part rotating the second part through the connecting part to move between the locking position and the unlocked position.

The tester apparatus may include that the surface on the first part that forms the seat is an external surface of the first part.

The tester apparatus may include that the first part has a tool pin opening therein for aligning a pin of the tool with the first part.

The tester apparatus may include that the second part has a body and at least a first wing piece extending from the body, wherein the first wing piece moves over a shoulder of the first component when moving into a first locking position and off the shoulder when moving out of the first locking position towards the unlocked position.

The tester apparatus may include that the second part has a second wing piece extending from the body, wherein the second wing piece moves over the shoulder of the first component when moving into a second locking position and off the shoulder when moving out of the second locking position towards the unlocked position.

The tester apparatus may include that the latch system may further include a tuning block mounted in a stationary position relative to the first component, the tuning block having a levelling surface over which the second wing piece is located when the first wing piece is located over the shoulder, the second part being adjustable relative to the first part to adjust a gap between the levelling surface and the second wing piece.

The tester apparatus may include that the latch system may further include a locking nut that has thread that engages with a thread on the connecting part to adjust the second part rotationally relative to the connecting part.

The tester apparatus may include that the latch system may further include a shim between the tuning block and the first component, to adjust a distance between the levelling surface and the first component.

The tester apparatus may include that the latch system may further include a snap mechanism having a snap surface that snaps into a first snap depression to resist movement of the second component out of the locking position and into a second snap depression to resist movement of the second component out of the unlocked position.

The tester apparatus may include that the first and second snap depressions are located on the locking arrangement.

The tester apparatus may include that the first and second snap depressions are located on the second part.

The tester apparatus may include that the first component includes a backing plate and a signal distribution board, wherein a portion of the signal distribution board is located between the backing plate and the second component, the signal distribution board having an opening through which the connecting part is inserted, the opening having a first dimension on an axis towards a center point of the signal distribution board that is larger than a second dimension transverse to the axis, the connecting part having a first portion that is smaller than the first dimension in a direction of the axis to allow for thermal expansion of the signal distribution board and the backing plate relative to one another and the first portion being dimensioned to slidably fit within the second dimension of the opening to prevent movement of the signal distribution board in a direction transverse to the axis relative to the backing plate.

The tester apparatus may include that the connecting part has a second portion with a first thickness that can fit through the opening in the direction of the axis during said insertion and is larger than the second dimension of the opening, and a second thickness transverse to the first thickness that can fit through the second dimension of the opening during said insertion.

The tester apparatus may include that the latch system may further include a second latch assembly, wherein each respective latch assembly may have a first part that engages with the first component, a second part that engages with the second component, a connecting part having opposing ends secured to the first and second parts respectively to form a locking arrangement, and an engaging mechanism connected to the locking arrangement and operable to move the locking arrangement between a locking position wherein the locking arrangement maintains the first and second components locked in the closed position and an unlocked position wherein the locking arrangement permits movement of the first and second components from the closed relationship into the spaced relationship.

The tester apparatus may include that the first and second latch assemblies have respective second parts that are on different sides of the second component.

The tester apparatus may include that the pressure differential cavity seal surrounds the contacts and the terminals.

The tester apparatus may include that the pressure differential cavity seal is secured to the first component when the first and second components are apart.

The tester apparatus may include that the pressure differential cavity seal is a lip seal.

The tester apparatus may include that the pressure reduction valve is a pressure reduction check valve, a vacuum release passage being formed through a component having the pressure reduction check valve, the vacuum release passage having an inlet opening at the pressure differential cavity and an outlet opening outside the pressure differential cavity, further including a second valve, being a vacuum release valve connected to the vacuum release passage, opening of the vacuum release valve allowing air into the pressure differential cavity and closing of the vacuum release valve keeping air from escaping out of the pressure differential cavity.

The tester apparatus may include that the stationary structure includes a thermal chuck, the second component of the portable supporting structure including a thin chuck contacting the thermal chuck to allow for transfer of heat between the portable supporting structure and the thermal chuck.

The tester apparatus may include that the substrate is a wafer with a plurality of microelectronic circuits.

The tester apparatus may include that the contacts are pins, each pin having a spring that is depressed against a spring force thereof when the respective contact is depressed by a respective one of the terminals.

The invention further provides a method of testing a microelectronic circuit held by a substrate, including holding the substrate between first and second components of a portable supporting structure, the second component having contacts against terminals of the substrate connected to the microelectronic circuit, wherein a pressure reduction passage is formed through one of the first and second components, a pressure reduction passage having an inlet opening at the pressure differential cavity and an outlet opening outside the pressure differential cavity, locating a pressure differential cavity seal between the first and second components to form an enclosed cavity by surfaces of the first and second components and the pressure differential cavity seal, opening a pressure reduction valve to allow air out of the pressure differential cavity and reducing a pressure within the pressure differential cavity to move the first and second components relatively towards one another to ensure proper contact between the contacts and the terminals, closing the pressure reduction valve, keeping air from entering the pressure differential cavity, operating an engaging mechanism to move a locking arrangement between a locking position wherein the locking arrangement maintains the first and second components locked in a closed position and an unlocked position wherein the locking arrangement permits movement of the first and second components from a closed relationship into a spaced relationship, the locking arrangement may include a first part that engages with the first component, a second part that engages with the second component, a connecting part having opposing ends secured to the first and second parts respectively, receiving the portable supporting structure by a stationary structure with a first interface on the portable supporting structure connected to a second interface on the stationary structure, and transmitting signals between an electrical tester and the microelectronic circuit through the terminals, contacts, and first and second interfaces to test the microelectronic circuit.

The method may include that the engaging mechanism causes the second component to move between the locking position and the unlocked position.

The method may include that the second component rotates between the locking position and the unlocked position.

The method may include that the engaging mechanism includes a surface on the first part that forms a seat for contacting with a surface on a jaw of a tool, the jaw of the tool being rotatable to rotate the first part and the first part rotating the second part through the connecting part to move between the locking position and the unlocked position.

The method may include that the surface on the first part that forms the seat is an external surface of the first part.

The method may include that the first part has a tool pin opening therein for aligning a pin of the tool with the first part.

The method may include that the second part has a body and at least a first wing piece extending from the body, wherein the first wing piece moves over a shoulder of the first component when moving into a first locking position and off the shoulder when moving out of the first locking position towards the unlocked position.

The method may include that the second part has a second wing piece extending from the body, wherein the second wing piece moves over the shoulder of the first component when moving into a second locking position and off the shoulder when moving out of the second locking position towards the unlocked position.

The method may include that the latch system may further include a tuning block mounted in a stationary position relative to the first component, the tuning block having a levelling surface over which the second wing piece is located when the first wing piece is located over the shoulder, the second part being adjustable relative to the first part to adjust a gap between the levelling surface and the second wing piece.

The method may include that the latch system may further include a locking nut that has thread that engages with a thread on the connecting part to adjust the second part rotationally relative to the connecting part.

The method may include that the latch system may further include locating a shim between the tuning block and the first component, to adjust a distance between the levelling surface and the first component.

The method may include that the latch system may further include a snap mechanism having a snap surface that snaps into a first snap depression to resist movement of the second component out of the locking position and into a second snap depression to resist movement of the second component out of the unlocked position.

The method may include that the first and second snap depressions are located on the locking arrangement.

The method may include that the first and second snap depressions are located on the second part.

The method may include that the first component includes a backing plate and a signal distribution board, wherein a portion of the signal distribution board is located between the backing plate and the second component, the signal distribution board having an opening through which the connecting part is inserted, the opening having a first dimension on an axis towards a center point of the signal distribution board that is larger than a second dimension transverse to the axis, the connecting part having a first portion that is smaller than the first dimension in a direction of the axis to allow for thermal expansion of the signal distribution board and the backing plate relative to one another and the first portion being dimensioned to slidably fit within the second dimension of the opening to prevent movement of the signal distribution board in a direction transverse to the axis relative to the backing plate.

The method may include that the connecting part has a second portion with a first thickness that can fit through the opening in the direction of the axis during said insertion and is larger than the second dimension of the opening, and a second thickness transverse to the first thickness that can fit through the second dimension of the opening during said insertion.

The method may include that the latch system may include a second latch assembly, each respective latch assembly having: a first part that engages with the first component, a second part that engages with the second component, a connecting part having opposing ends secured to the first and second parts respectively to form a locking arrangement, and an engaging mechanism connected to the locking arrangement and operable to move the locking arrangement between a locking position wherein the locking arrangement maintains the first and second components locked in the closed position and an unlocked position wherein the locking arrangement permits movement of the first and second components from the closed relationship into the spaced relationship.

The method may include that the first and second latch assemblies have respective second parts that are on different sides of the second component.

The method may include that the pressure differential cavity seal surrounds the contacts and the terminals.

The method may include that the pressure differential cavity seal is secured to the first component when the first and second components are apart.

The method may include that the pressure differential cavity seal is created with a lip seal.

The method may include that the pressure reduction valve is a pressure reduction check valve, a vacuum release passage being formed through a component having the pressure reduction check valve, the vacuum release passage having an inlet opening at the pressure differential cavity and an outlet opening outside the pressure differential cavity, further including opening a second valve, being a vacuum release valve connected to the vacuum release passage, to allow air into the pressure differential cavity.

The method may include that the stationary structure includes a thermal chuck, the second component of the portable supporting structure including a thin chuck.

The method may include that the substrate is a wafer with a plurality of microelectronic circuits.

The method may include that the contacts are pins, each pin having a spring that is depressed against a spring force thereof when the respective contact is depressed by a respective one of the terminals.

The invention also provides a microelectronic circuit testing pack, including a portable supporting structure including first and second components for holding a substrate therebetween, the substrate carrying a microelectronic circuit and having a plurality of terminals connected to the microelectronic circuit, a plurality of contacts on the second component, the contacts matching the terminals for making contact to the terminals, a pressure differential cavity seal between the first and second components, the pressure differential cavity seal forming an enclosed pressure differential cavity together with surfaces of the first and second components, a pressure reduction passage formed through one of the first and second components, the pressure reduction passage having an inlet opening at the pressure differential cavity and an outlet opening outside the pressure differential cavity, a pressure reduction valve connected to the pressure reduction passage, opening of the pressure reduction valve allowing air out of the pressure differential cavity to move the first and second components relatively towards one another for ensuring proper contact between the contacts and the terminals, and closing of the pressure reduction valve keeping air from entering the pressure differential cavity, a first interface, on the portable supporting structure and connected to the contacts, for connection to a second interface on a stationary structure when the portable supporting structure is removably held by the stationary structure, a pressure sensor positioned to detect a pressure in the pressure differential cavity, and an electrical pressure sensor interface connected to the pressure sensor to communicate the pressure with an electric tester.

The microelectronic circuit testing pack may include that the pressure sensor is positioned distant from the pressure differential cavity and a pressure sensing passage connects the pressure differential cavity with the pressure sensor.

The microelectronic circuit testing pack may include that the pressure reduction passage is formed in the first component.

The microelectronic circuit testing pack may include that the first component includes a backing plate and a signal distribution board, wherein a portion of the signal distribution board is located between the backing plate and the second component, wherein the pressure sensing passage is formed in the backing plate.

The microelectronic circuit testing pack may include that the pressure sensing passage is formed through the signal distribution board.

The microelectronic circuit testing pack may include that the pressure sensor is secured to the portable supporting structure.

The microelectronic circuit testing pack may include that the pressure differential cavity seal is secured to the first component when the first and second components are apart.

The microelectronic circuit testing pack may include that the pressure differential cavity seal is a lip seal.

The microelectronic circuit testing pack may include that the pressure reduction valve is a pressure reduction check valve, a vacuum release passage being formed through a component having the pressure reduction check valve, the vacuum release passage having an inlet opening at the pressure differential cavity and an outlet opening outside the pressure differential cavity, further including a second valve, being a vacuum release valve connected to the vacuum release passage, opening of the vacuum release valve allowing air into the pressure differential cavity and closing of the vacuum release valve keeping air from escaping out of the pressure differential cavity.

The microelectronic circuit testing pack may include that the substrate is a wafer with a plurality of microelectronic circuits.

The microelectronic circuit testing pack may include that the contacts are pins, each pin having a spring that is depressed against a spring force thereof when the respective contact is depressed by a respective one of the terminals.

The invention further provides a tester apparatus, including a portable supporting structure including first and second components for holding a substrate therebetween, the substrate carrying a microelectronic circuit and having a plurality of terminals connected to the microelectronic circuit, a plurality of contacts on the second component, the contacts matching the terminals for making contact to the terminals, a pressure differential cavity seal between the first and second components, the pressure differential cavity seal forming an enclosed pressure differential cavity together with surfaces of the first and second components, a pressure reduction passage formed through one of the first and second components, the pressure reduction passage having an inlet opening at the pressure differential cavity and an outlet opening outside the pressure differential cavity, a pressure reduction valve connected to the pressure reduction passage, opening of the pressure reduction valve allowing air out of the pressure differential cavity to move the first and second components relatively towards one another for ensuring proper contact between the contacts and the terminals, and closing of the pressure reduction valve keeping air from entering the pressure differential cavity, a first interface on the portable supporting structure and connected to the contacts, a stationary structure, the portable supporting structure being receivable to be held by the stationary structure and being removable from the stationary structure, a second interface on the stationary structure, the second interface being connected to the first interface when the portable supporting structure is held by the stationary structure, and being disconnected from the first interface when the portable supporting structure is removed from the stationary structure, an electrical tester connected through the second interface, the first interface, and the contacts to the terminals so that signals are transmitted between the electrical tester and the microelectronic circuit to test the microelectronic circuit. a pressure sensor positioned to detect a pressure in the pressure differential cavity, and a pressure monitoring system that includes an electrical pressure sensor interface connected to the pressure sensor to communicate the pressure with an electric tester.

The tester apparatus may include that the pressure sensor is positioned distant from the pressure differential cavity and a pressure sensing passage connects the pressure differential cavity with the pressure sensor.

The tester apparatus may include that the pressure reduction passage is formed in the first component.

The tester apparatus may include that the first component includes a backing plate and a signal distribution board, wherein a portion of the signal distribution board is located between the backing plate and the second component, wherein the pressure sensing passage is formed in the backing plate.

The tester apparatus may include that the pressure sensing passage is formed through the signal distribution board.

The tester apparatus may include that the pressure sensor is secured to the portable supporting structure.

The tester apparatus may include that the pressure monitoring system may include an electrical pressure connector interface on the stationary structure, the electrical pressure sensor interface releasably making contact with the electrical pressure connector interface to communicate the pressure with the electric tester.

The tester apparatus may include that the electrical pressure sensor interface includes at least a first contact and the pressure monitoring system includes at least a first terminal, wherein the first contact engages with the first terminal when the portable supporting structure is received by the stationary structure and the first contact disengages from the first terminal when the portable supporting structure is removed from the stationary structure.

The tester apparatus may include that the electrical pressure sensor interface is in a printed circuit board having a substrate and the first contact is formed on the substrate.

The tester apparatus may include that the electrical pressure sensor interface includes at least a second contact and the pressure monitoring system includes at least a second terminal, wherein the second contact engages with the second terminal when the portable supporting structure is received by the stationary structure and the second contact disengages from the second terminal when the portable supporting structure is removed from the stationary structure.

The tester apparatus may include that the pressure differential cavity seal surrounds the contacts and the terminals.

The tester apparatus may include that the pressure differential cavity seal is secured to the first component when the first and second components are apart.

The tester apparatus may include that the pressure differential cavity seal is a lip seal.

The tester apparatus may include that the pressure reduction valve is a pressure reduction check valve, a vacuum release passage being formed through a component having the pressure reduction check valve, the vacuum release passage having an inlet opening at the pressure differential cavity and an outlet opening outside the pressure differential cavity, further includes a second valve, being a vacuum release valve connected to the vacuum release passage, opening of the vacuum release valve allowing air into the pressure differential cavity and closing of the vacuum release valve keeping air from escaping out of the pressure differential cavity.

The tester apparatus may include that the stationary structure includes a thermal chuck, the second component of the portable supporting structure including a thin chuck contacting the thermal chuck to allow for transfer of heat between the portable supporting structure and the thermal chuck.

The tester apparatus may include that the substrate is a wafer with a plurality of microelectronic circuits.

The tester apparatus may include that the contacts are pins, each pin having a spring that is depressed against a spring force thereof when the respective contact is depressed by a respective one of the terminals.

The invention also provides a method of testing a microelectronic circuit held by a substrate, including holding the substrate between first and second components of a portable supporting structure, the second component having contacts against terminals of the substrate connected to the microelectronic circuit, wherein a pressure reduction passage is formed through one of the first and second components, a pressure reduction passage having an inlet opening at the pressure differential cavity and an outlet opening outside the pressure differential cavity, locating a pressure differential cavity seal between the first and second components to form an enclosed cavity by surfaces of the first and second components and the pressure differential cavity seal, opening a pressure reduction valve to allow air out of the pressure differential cavity and reducing a pressure within the pressure differential cavity to move the first and second components relatively towards one another to ensure proper contact between the contacts and the terminals, closing the pressure reduction valve, keeping air from entering the pressure differential cavity, receiving the portable supporting structure by a stationary structure with a first interface on the portable supporting structure connected to a second interface on the stationary structure, transmitting signals between an electrical tester and the microelectronic circuit through the terminals, contacts, and first and second interfaces to test the microelectronic circuit, detecting a pressure in the pressure differential cavity of the pressure monitoring system, and communicating the pressure with an electric tester.

The method may include that the pressure sensor is positioned distant from the pressure differential cavity and a pressure sensing passage connects the pressure differential cavity with the pressure sensor.

The method may include that the pressure reduction passage is formed in the first component.

The method may include that the first component includes a backing plate and a signal distribution board, wherein a portion of the signal distribution board is located between the backing plate and the second component, wherein the pressure sensing passage is formed in the backing plate.

The method may include that the pressure sensing passage is formed through the signal distribution board.

The method may include that the pressure sensor is secured to the portable supporting structure.

The method may include that the pressure monitoring system may include an electrical pressure connector interface on the stationary structure, the electrical pressure sensor interface releasably making contact with the electrical pressure connector interface to communicate the pressure with the electric tester.

The method may include that the electrical pressure sensor interface includes at least a first contact and the pressure monitoring system includes at least a first terminal, wherein the first contact engages with the first terminal when the portable supporting structure is received by the stationary structure and the first contact disengages from the first terminal when the portable supporting structure is removed from the stationary structure.

The method may include that the electrical pressure sensor interface is in a printed circuit board having a substrate and the first contact is formed on the substrate.

The method may include that the electrical pressure sensor interface includes at least a second contact and the pressure monitoring system includes at least a second terminal, wherein the second contact engages with the second terminal when the portable supporting structure is received by the stationary structure and the second contact disengages from the second terminal when the portable supporting structure is removed from the stationary structure.

The method may include that the pressure differential cavity seal surrounds the contacts and the terminals.

The method may include that the pressure differential cavity seal is secured to the first component when the first and second components are apart.

The method may include that the pressure differential cavity seal is created with a lip seal.

The method may include that the pressure reduction valve is a pressure reduction check valve, a vacuum release passage being formed through a component having the pressure reduction check valve, the vacuum release passage having an inlet opening at the pressure differential cavity and an outlet opening outside the pressure differential cavity, further including opening a second valve, being a vacuum release valve connected to the vacuum release passage, to allow air into the pressure differential cavity.

The method may include that the stationary structure includes a thermal chuck, the second component of the portable supporting structure including a thin chuck.

The method may include that the substrate is a wafer with a plurality of microelectronic circuits.

The method may include that the contacts are pins, each pin having a spring that is depressed against a spring force thereof when the respective contact is depressed by a respective one of the terminals.

BRIEF DESCRIPTION OF THE DRAWINGS

The invention is further described by way of examples with reference to the accompanying drawings, wherein:

FIGS. 5A, 5B and 5C are perspective views of the tester apparatus illustrating insertion or removal of portable wafer packs into or out of an oven defined by a frame;

FIGS. 9A, 9B and 10 are side views illustrating an apparatus that is used for insertion and removal of portable wafer packs into and out of the oven;

FIGS. 18a(i) and 18a(ii) are views in the direction of arrows A and B in FIG. 15 with a latch mechanism in an unlocked configuration;

FIGS. 18b(i) and 18b(ii) are views similar to FIGS. 18a(i) and 18a(ii) with the latch mechanism in a locked position;

FIG. 19 is a perspective view illustrating how shims are used to set a height of wing pieces of the latch mechanism;

FIG. 20 is a perspective view of components of a pressure monitoring system;

DETAILED DESCRIPTION OF THE INVENTION

Figure 1:
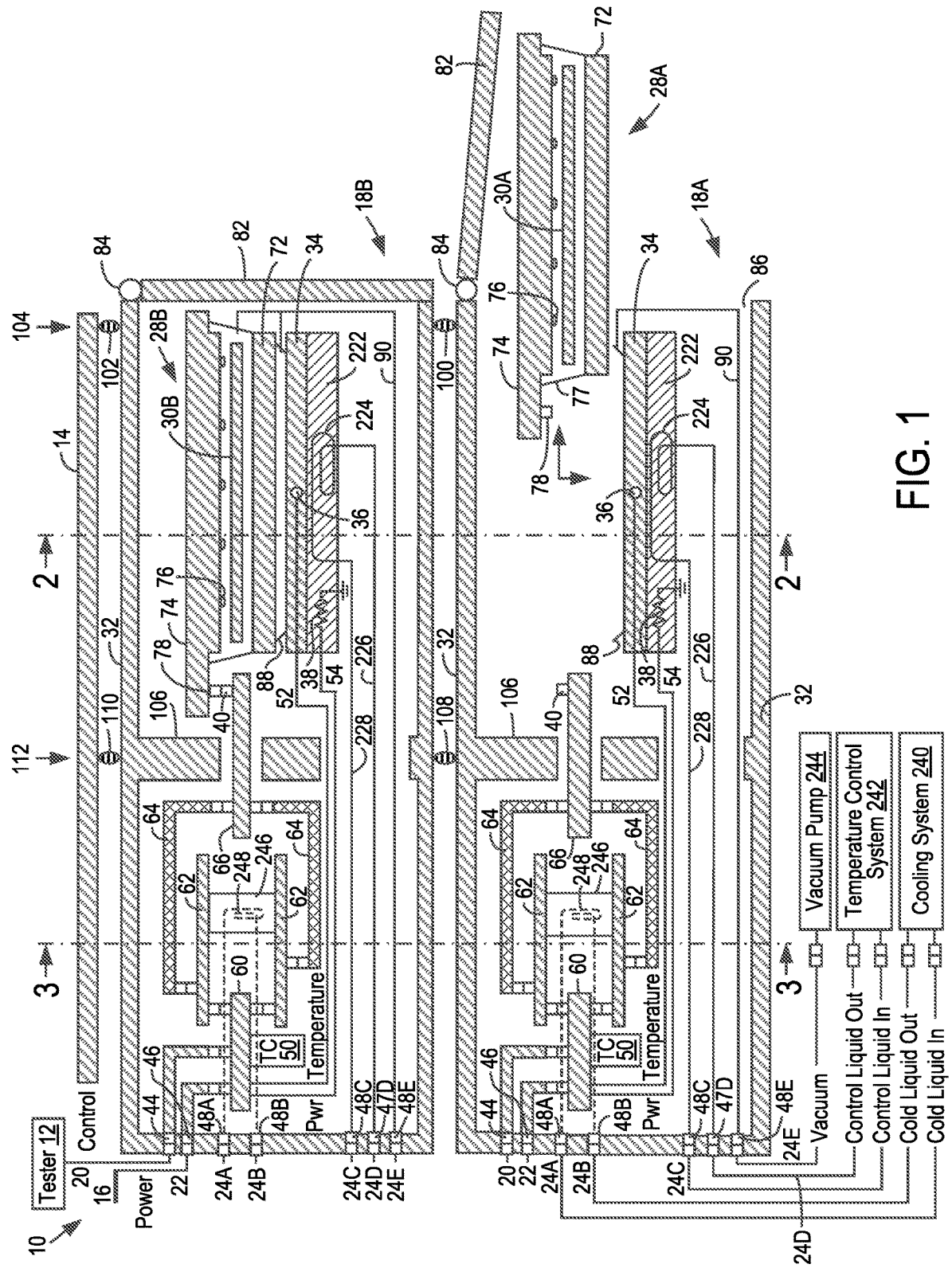
FIG. 1 is a cross-sectional side view of a tester apparatus having slot assemblies according to one embodiment of the invention.

FIG. 1 of the accompanying drawings illustrates a tester apparatus 10, according to an embodiment of the invention, that comprising (i) a stationary structure that includes a tester 12, a frame 14, a power bus 16, first and second slot assemblies 18A and 18B, a tester cable 20, a power cable 22, a cold liquid supply line 24A, a cold liquid return line 24B, a control liquid supply line 24C, a control liquid return line 24D, a vacuum line 24E, (ii) a portable arrangement that includes first and second wafer packs 28A and 28B, and (iii) first and second wafers 30A and 30B. The first and second wafer packs 28A and 28B are described herein as "wafer packs" and their use is described for testing wafers. It should be understood that the first and second wafers 28A and 28B can be used for testing microelectronic circuits generally and can be classified as "first and second microelectronic circuit testing packs 28A and 28B" instead.

The slot assembly 18A includes a slot assembly body 32, a thermal chuck 34, a temperature detector 36, a temperature modification device in the form of a heating resistor 38, a first slot assembly interface 40, and a plurality of second slot assembly interfaces, including a control interface 44, a power interface 46 and a cold liquid supply interface 48A, a cold liquid return interface 48B, a control liquid supply interface 48C, a control liquid return interface 48D and a vacuum interface 48E.

The first slot assembly interface 40 is located within the slot assembly body 32 and is mounted to the slot assembly body 32. The second interfaces in the form of the control interface 44, the power interface 46 and the interfaces 48A to 48E are mounted in a left wall of the slot assembly body 32.

The slot assembly 18A is insertable from left to right into and is removable from right to left from the frame 14. The tester cable 20, the power cable 22 and the lines 24A to 24E are manually connected to the control interface 44, the power interface 46 and the interfaces 48A to 48E, respectively. Before removing the slot assembly 18A from the frame 14, the tester cable 20, power cable 22 and the lines 24A to 24E are first manually disconnected from the control interface 44, power interface 46 and the interfaces 48A to 48E, respectively.

The slot assembly 18A includes a motherboard 60 having test electronics, a plurality of channel module boards 62 having test electronics, flexible connecters 64, and a connection board 66. The control interface 44 and the power interface 46 are connected to the motherboard 60 and a thermal controller 50 is mounted to the motherboard 60. The channel module boards 62 are electrically connected to the motherboard 60. The flexible connectors 64 connect the channel module boards 62 to the connection board 66. Control functionality is provided through electrical conductors connecting the control interface 44 to the motherboard 60. Power is provided through the power interface 46 to the motherboard 60. Both power and control are provided from the motherboard 60 through conductors to the channel module boards 62. The flexible connectors 64 provide conductors that connect the channel module boards 62 to the connection board 66. The connection board 66 includes a conductor that connects the flexible connectors 64 to the first slot assembly interface 40. This first slot assembly interface 40 is thus connected through various conductors to the control interface 44 and power interface 46 so that power and control can be provided via the control interface 44 and power interface 46 to the first slot assembly interface 40.

The second slot assembly 18B includes similar components to the first slot assembly 18A and like reference numerals indicate like components. The second slot assembly 18B is inserted into the frame 14 and the control interface 44, power interface 46 and interfaces 48A to 48E of the second slot assembly 18B are manually connected to a separate set of connecting components including a separate tester cable 20, a separate power cable 22 and separate lines 24A to 24E, respectively.

The wafer pack 28A includes a wafer pack body formed by a thin chuck 72 and a backing plate 74. The wafer 30A has a plurality of microelectronic devices formed therein. The wafer 30A is inserted into the wafer pack body between the thin chuck 72 and backing plate 74. Wafer pack contacts 76 make contact with respective contacts (not shown) on the wafer 30A. The wafer pack 28A further includes a wafer pack interface 78 on the backing plate 74. Conductors in the backing plate 74 connect the wafer pack interface 78 to the wafer pack contacts 76.

The wafer pack 28A has a lip seal 77 (also referred to herein as a "pressure differential cavity seal") connected between the backing plate 74 and the thin chuck 72. A vacuum is applied to an area defined by the lip seal 77, backing plate 74 and the thin chuck 72. The vacuum keeps the wafer pack 28A together and ensures proper contact between the wafer pack contacts 76 and the contacts on the wafer 30A.

The temperature detector 36 is in located in the thermal chuck 34 and therefore close enough to the wafer 30A to detect a temperature of the wafer 30A or to within five degrees Celsius, preferably to within one or two degrees Celsius of the wafer 30A.

The slot assembly 18A further has a door 82 connected to the slot assembly body 32 by a hinge 84. When the door 82 is rotated into an open position, the wafer pack 28A can be inserted through a door opening 86 into the slot assembly body 32. The wafer pack 28A is then lowered onto the thermal chuck 34 and the door 82 is closed. The thermal chuck 34 is mounted to the slot assembly body 32. The thermal chuck 34 then essentially forms a holder having a testing station for a wafer.

The slot assembly 18A further has a thermal interface cavity seal 88 that is located between the thermal chuck 34 and the thin chuck 72. A vacuum is applied through the vacuum interface 48E and a vacuum line 90 to an area defined by the thermal interface cavity seal 88, thermal chuck 34 and thin chuck 72. A good thermal connection is thereby provided between the thermal chuck 34 and the thin chuck 72. When heat is created by the heating resistor 38, the heat conducts through the thermal chuck 34 and the thin chuck 72 to reach the wafer 30A. Heat conducts in an opposite direction when the thermal chuck 34 is at a lower temperature than the wafer 30A.

The wafer pack interface 78 engages with the first slot assembly interface 40. Power and signals are provided via the first slot assembly interface 40, wafer pack interface 78 and wafer pack contacts 76 to the wafer 30A. A performance of devices within the wafer 30A is measured through the wafer pack contacts 76, wafer pack interface 78 and first slot assembly interface 40.

The door 82 of the slot assembly 18B is shown in a closed position. A front seal 100 is mounted on an upper surface of the slot assembly 18A and seals with a lower surface of the slot assembly 18B. A front seal 102 is mounted to an upper surface of the slot assembly 18B and seals with a lower surface of the frame 14. A continuous sealed front wall 104 is provided by the door 82 of the slot assemblies 18A and 18B and the front seals 100 and 102.

The slot assembly 18A further includes a thermal controller 50. The temperature detector 36 is connected through a temperature feedback line 52 to the thermal controller 50. Power is provided through the power interface 46 and a power line 54 to the heating resistor 38 so that the heating resistor 38 heats up. The heating resistor 38 then heats the thermal chuck 34 and the wafer 30A on the thermal chuck 34. The heating resistor 38 is controlled by the thermal controller 50 based on the temperature detected by the temperature detector 36.

The thermal chuck 34 has a thermal fluid passage 224 formed therein. The thermal fluid passage 224 holds a thermal fluid. The thermal fluid is preferably a liquid as opposed to a gas because liquid is not compressible and heat convects faster to or from a liquid. Different thermal fluids are used for different applications with oil being used for applications where temperatures are the highest.

Control liquid supply and return lines 226 and 228 connect opposing ends of the thermal fluid passage 224 to the cold liquid supply and return interfaces 48C and 48D, respectively. The heating resistor 38 serves as a heater that is mounted in a position to heat the thermal chuck 34, which heats the thermal fluid. By recirculating the thermal fluid through the thermal fluid passage 224, a more uniform distribution of heat is provided by the thermal chuck 222 to the thermal chuck 34 and ultimately to the wafer 30A. The temperature of the fluid can also be controlled to add heat to the thermal chuck 34 or to cool the thermal chuck 34 down.

The tester apparatus 10 further includes a cooling system 240, a temperature control system 242 and a vacuum pump 244. The two cold liquid supply lines 24A that are connected to the first and second slot assemblies 18A and 18B are also connected through a manifold (not shown) to the cooling system 240. Additional manifolds connect the cold liquid return lines 24B to the cooling system 240, the control liquid supply lines 24C to the temperature control system 242, the control liquid return lines 24D to the temperature control system 242 and the vacuum lines 24E to the vacuum pump 244. Each slot assembly 18A or 18B has a respective cold plate 246 with a respective fluid passage 248. The cooling system 240 circulates a fluid through the fluid passage 248 to cool the cold plate 246. The cold plate 246 then keeps the channel module boards 62 cool. The temperature control system 242 circulates a fluid through the thermal fluid passage 224 to control a temperature of the thermal chuck 34 and transfer heat from or to the wafers 30A and 30B. The vacuum pump 244 provides air at vacuum pressure to the vacuum line 90.

The slot assembly 18A includes a separator seal 108 mounted to an upper surface the slot assembly body 32 above the internal wall 106 thereof. The separator seal 108 seals with a lower surface of the slot assembly 18B. The slot assembly 18B has a separator seal 110 mounted to an upper surface of the slot assembly body 32 thereof. The separator seal 108 seals with a lower surface of the frame 14. A continuous sealed separator wall 112 is provided by the internal walls 106 of the slot assemblies 18A and 18B and the separator seals 108 and 110.

Figure 2:
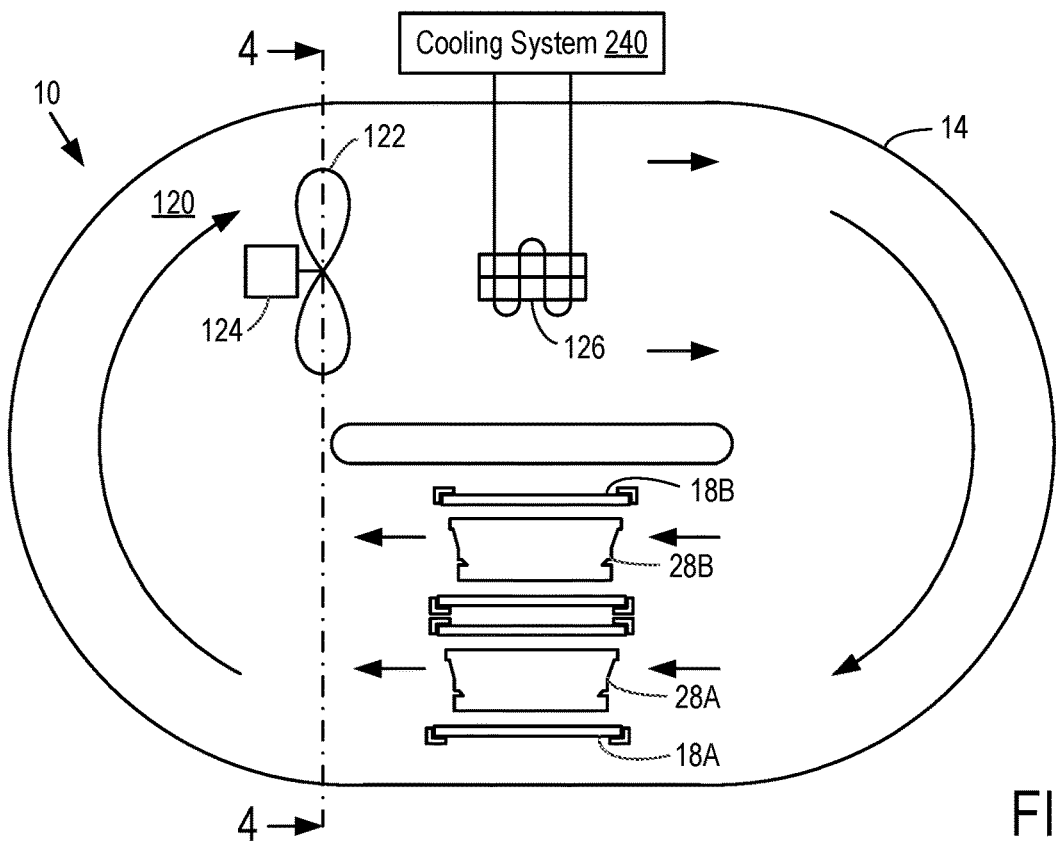
FIG. 2 is a cross-sectional side view of the tester apparatus on line 2-2 in FIG. 1.

FIG. 2 illustrates the tester apparatus 10 on 2-2 in FIG. 1. The frame 14 defines a first closed loop air path 120. Air inlet and outlet openings (not shown) can be opened to change the first closed loop air path 120 into an open air path wherein air at room temperature passes through the frame 14 without being recirculated. A closed loop path is particularly useful in a clean room environment because it results in less particulate material being released into the air.

The tester apparatus 10 further includes a first fan 122, a first fan motor 124 and a temperature modification device in the form of a water cooler 126.

The first fan 122 and first fan motor 124 are mounted in an upper portion of the first closed loop air path 120. The water cooler 126 is mounted to the frame 14 within an upper portion of the first closed loop air path 120.

The wafer packs 28A and 28B are positioned with the slot assemblies 18A and 18B and are within a lower half of the first closed loop air path 120.

In use, current is provided to the first fan motor 124. The first fan motor 124 rotates the first fan 122. The first fan 122 recirculates air in a clockwise direction through the first closed loop air path 120.

The water cooler 126 then cools the air in the first closed loop air path 120. The air then flows through the slot assemblies 18A and 18B over the wafer packs 28A or 28B. The wafer packs 28A or 28B are then cooled by the air through convection.

Figure 3:
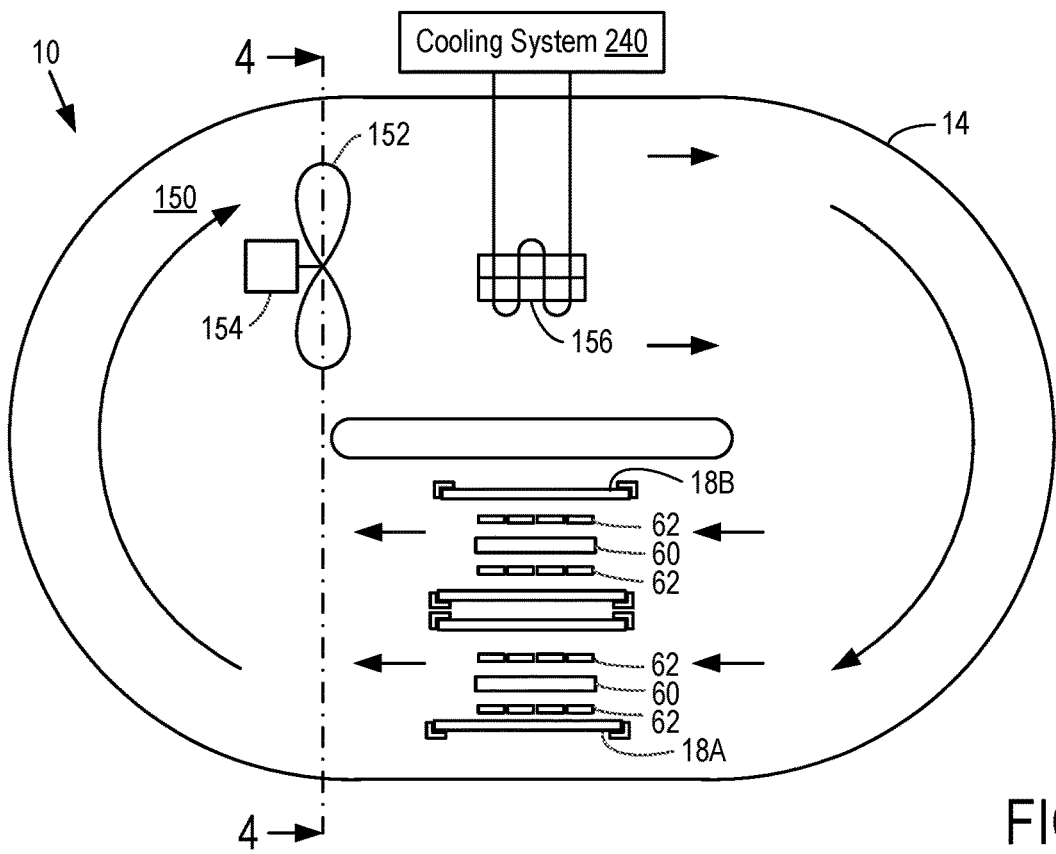
FIG. 3 is a cross-sectional side view of the tester apparatus on line 3-3 in FIG. 1.

FIG. 3 shows the tester apparatus 10 on 3-3 in FIG. 1. The frame 14 defines a second closed loop air path 150. The tester apparatus 10 further includes a second fan 152, a second fan motor 154 and a temperature modification device in the form of a water cooler 156. No electric heater or damper is provided as in FIG. 2. Air inlet and outlet openings (not shown) can be opened to change the second closed loop air path 150 into an open air path wherein air at room temperature passes through the frame 14 without being recirculated.

A closed loop path is particularly useful in a clean room environment because it results in less particulate material being released into the air. The second fan 152 and second fan motor 154 are located in an upper portion of the second closed loop air path 150. The water cooler 156 is located slightly downstream from the second fan 152 within the second closed loop air path 150. The motherboard 60 and channel module boards 62 that form a part of the slot assemblies 18A and 18B are located within a lower half of the second closed loop air path 150.

In use, electric current is provided to the second fan motor 154, which rotates the second fan 152. The second fan 152 then recirculates air in a clockwise direction through the second closed loop air path 150. The air is cooled by the water cooler 156. The cooled air then passes over the motherboard 60 and channel module boards 62 so that heat transfers from the motherboard 60 and channel module boards 62 to the air through convection.

Air recirculating through the first closed loop air path 120 in FIG. 2 is kept separate from air in the second closed loop air path 150 in FIG. 3 by the continuous sealed separator wall 112 shown in FIG. 1. The continuous sealed front wall 104 shown in FIG. 1 prevents air from escaping out of the first closed loop air path 120.

Figure 4:
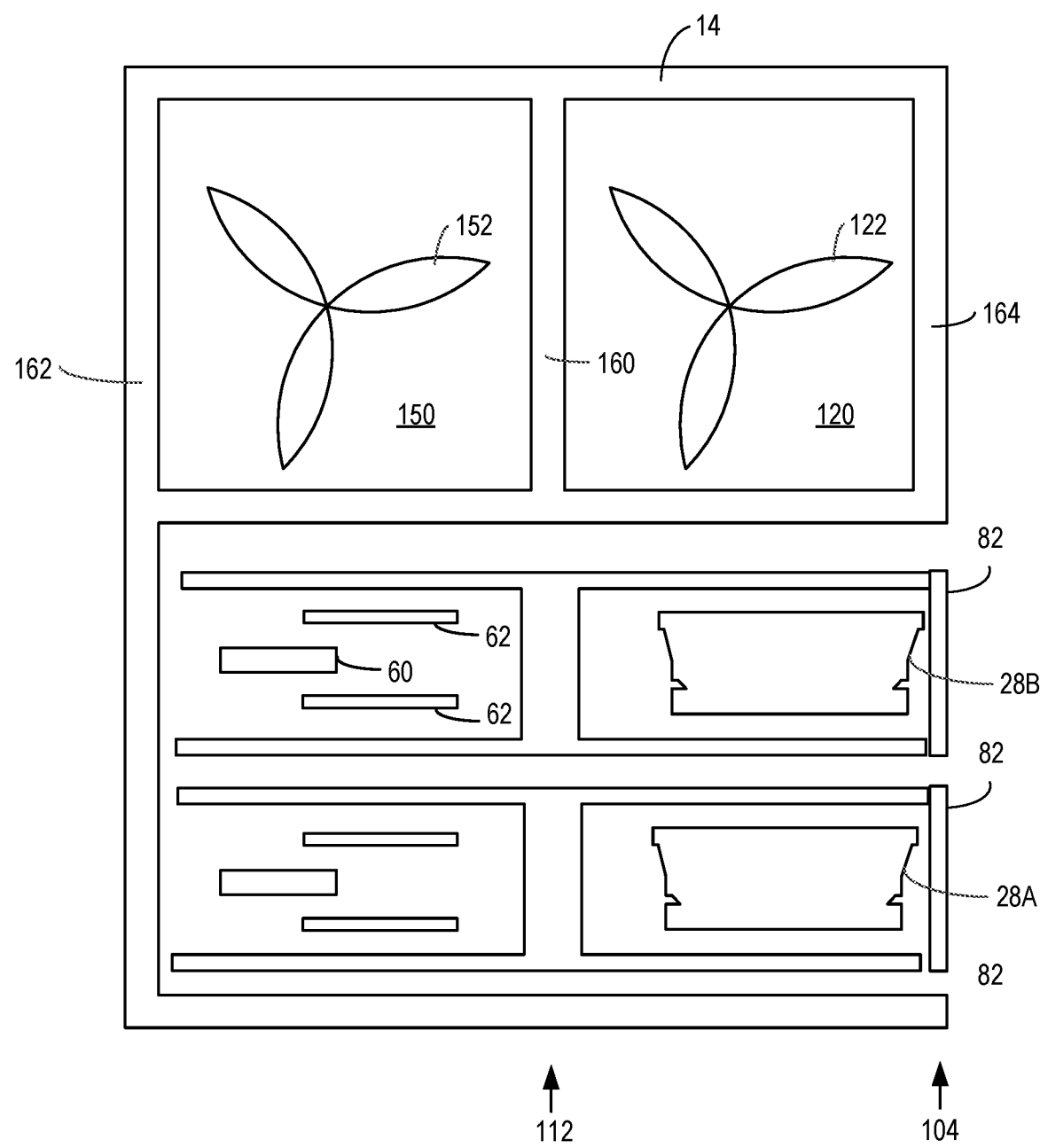
FIG. 4 is a cross-sectional side view of the tester apparatus on line 4-4 in FIGS. 2 and 3.

As shown in FIGS. 2 and 3, the same cooling system 240 that is used in FIG. 1 is also used to cool the water coolers 126. As shown in FIG. 4, a plenum 160 separates the first closed loop air path 120 from the second closed loop air path 150 in all areas except those provided by the continuous sealed separator wall 112. The frame 14 has left and right walls 162 and 164 that further define the closed loop air paths 120 and 150.

Figure 5A:
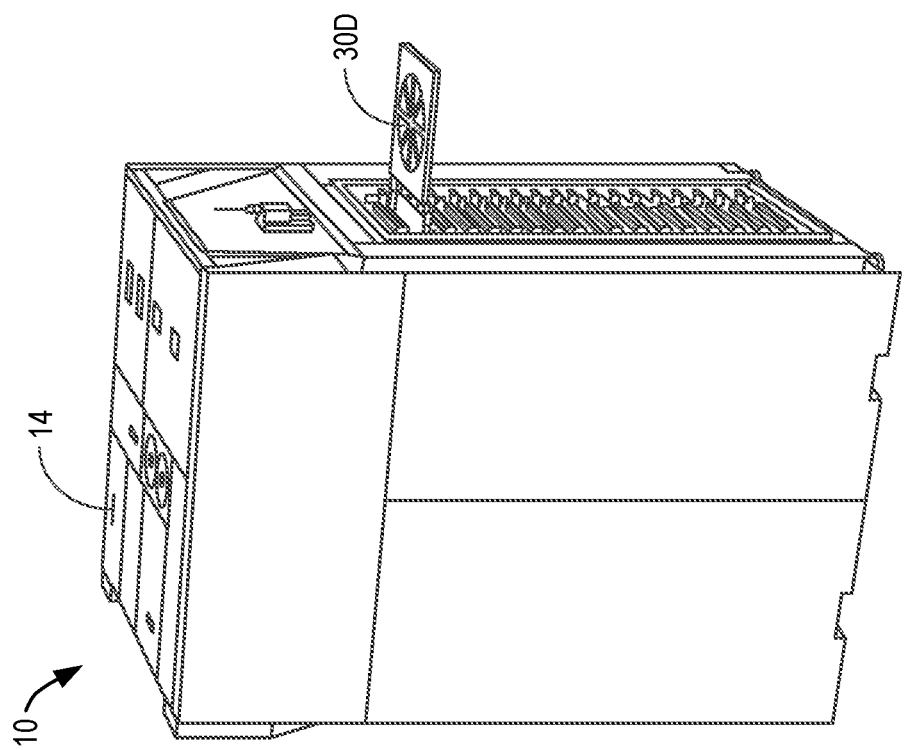
Figure 5B:
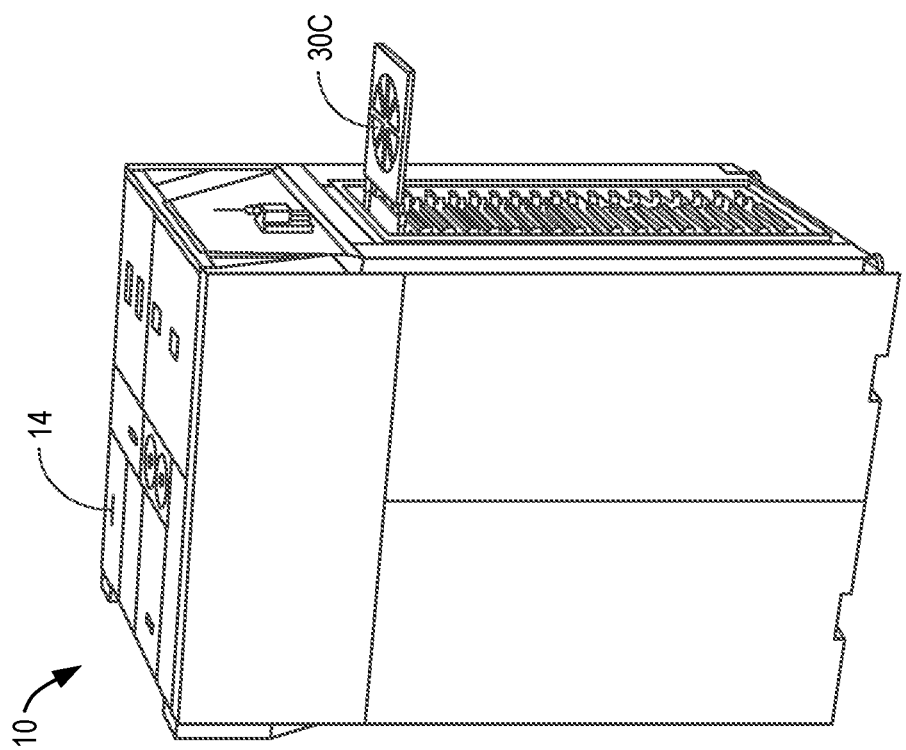
Figure 6:
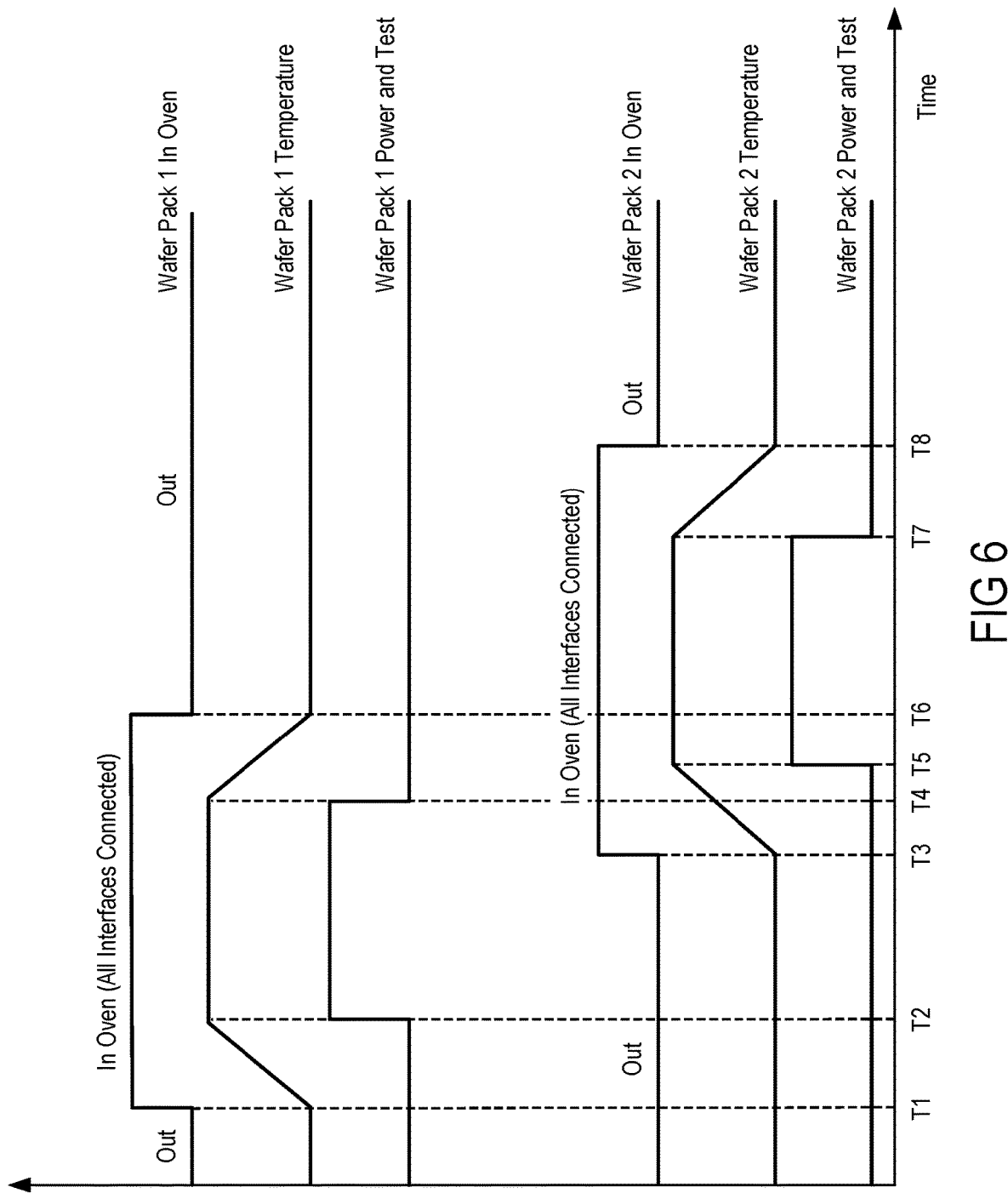
FIG. 6 is a time chart showing how one wafer pack can be inserted and used for testing electronic devices of wafers and subsequent insertion of another wafer pack.

FIGS. 5A, 5B and 5C illustrate how wafer packs 30C, 30D and 30E can be inserted or be removed at any time while all other wafer packs are being used to test devices of wafers and may be in various states of temperature ramps. FIG. 6 illustrates the concept in more detail. At time T1 a first wafer pack is inserted into the frame 14 while a second wafer pack is outside the frame 14. At T1 heating of the first wafer pack is initiated. Between T1 and T2 the temperature of the first wafer pack increases from room temperature, i.e. about 22° C., to a testing temperature that is 50° C. to 150° C. higher than room temperature at T2. At T2 power is applied to the first wafer pack and the devices in the first wafer pack are tested. At T3, a second wafer pack is inserted into the frame 14 and heating of the second wafer pack is initiated. At T4, testing of the first wafer pack is terminated. At T4, cooling of the first wafer pack is also initiated. At T5, the second wafer pack reaches testing temperature and power is provided to the second wafer pack and the wafer in the second wafer pack is tested. At T6, the second wafer pack reaches a temperature close to room temperature and is removed from the frame 14. A third wafer pack can then be inserted in place of the first wafer pack. At T7, testing of the second wafer pack is terminated and cooling thereof is initiated. At T8, the second wafer pack has cooled down to room temperature or close to room temperature and is removed from the frame 14.

Different tests can be conducted at different temperatures. By way of example, a wafer pack may be inserted, and a test be run at room temperature. Another test can be conducted during an upward ramp in temperature. A further test can be conducted at an elevated temperature. A further test can be conducted during a downward ramp in temperature. Two of these tests can be a single test that runs from one temperature stage to the next.

Figure 7:
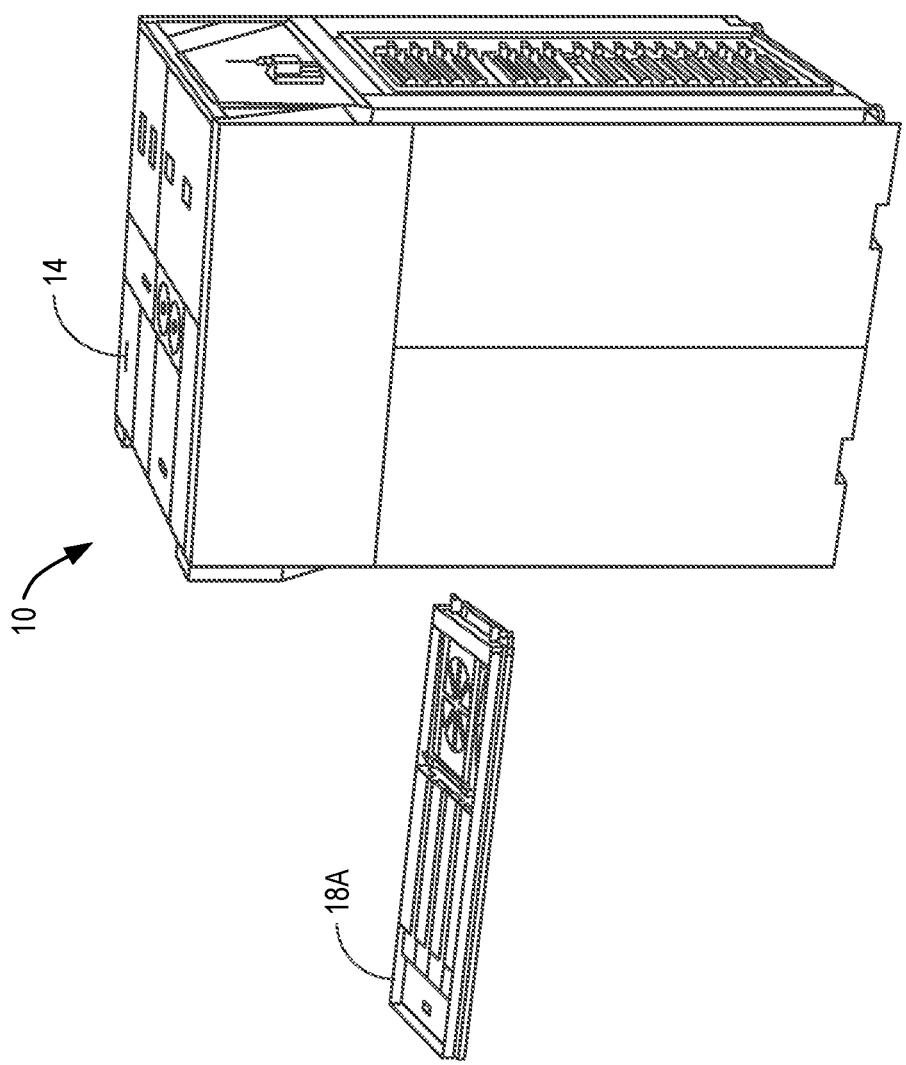
FIG. 7 is a perspective view of the tester apparatus illustrating insertion or removal of one slot assembly.

As shown in FIG. 7, one slot assembly 18A can be removed or be inserted into the frame 14. The slot assembly 18A can be inserted or be removed while the other slot assemblies within the frame 14 are used for testing devices of wafers as described with reference to FIG. 6.

Figure 8A:
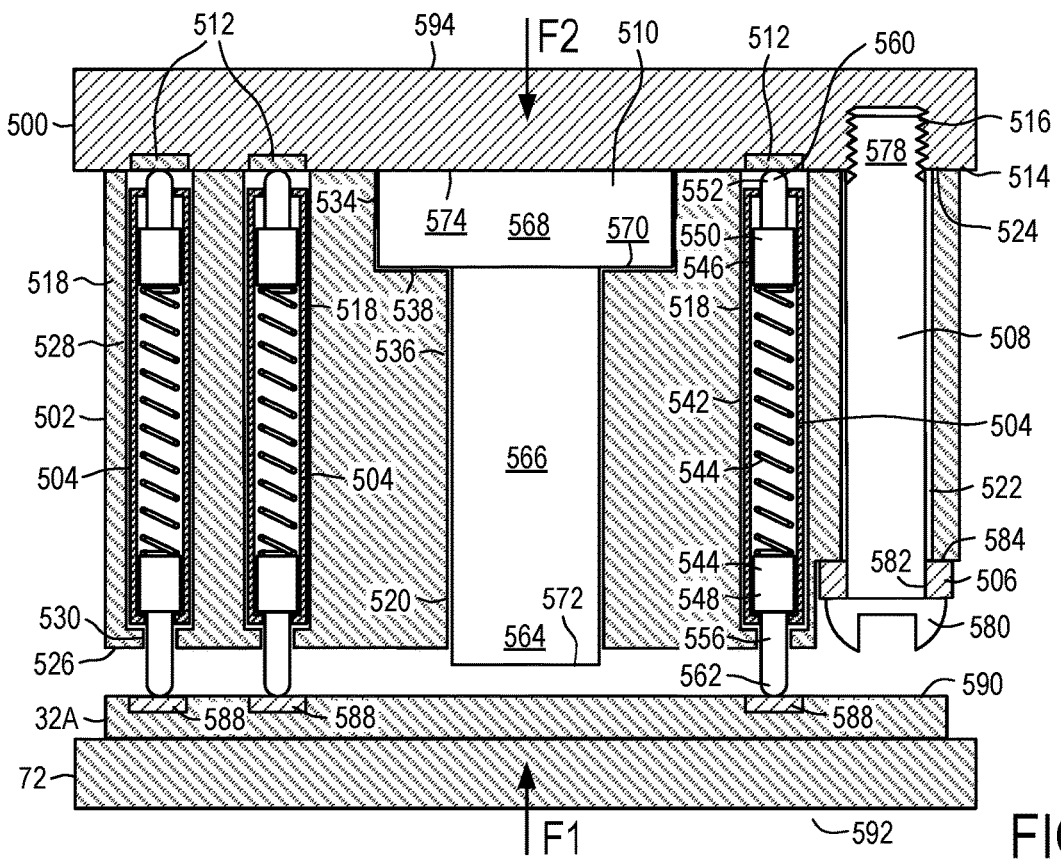
FIGS. 8A and 8B are cross-sectional side views illustrating the use of a stand-off in the configuration of the wafer pack described with respect to FIGS. 1-7.

As shown in FIG. 8A further show a signal distribution board 500, a contactor 502, a plurality of pins 504, a contactor hold-down ring 506, a fastener 508, and a post 510.

The signal distribution board 500 is primarily made of an insulative material and has a circuit (not shown) formed therein. Contacts 512 are formed on a lower side 514 of the signal distribution board 500. A threaded opening 516 is formed into the lower side 514.

The contactor 502 has a plurality of pin openings 518, a post opening 520 and a fastener opening 522 formed from an upper side 524 to a lower side 526 therethrough. Each one of the pin openings 518 has a first section 528 and a second section 530. The first and second sections 528 and 530 are both circular when viewed in plan view. The first section 528 has a larger diameter than the second section 530. The larger diameter of the first section 528 when compared to the diameter of the second section 530 results in the first section 528 being wider than the second section 530 when view in the cross-sectional side view of FIG. 8A.

The post opening 520 has a first section 534 and a second section 536. The first section 534 and the second section 536 are both circular when viewed in plan view. A diameter of the first section 534 is larger than a diameter of the second section 536. Because the diameter of the first section 534 is more than the diameter of the second section 536, the first section 534 is wider than the second section 536 when view in the cross-sectional side view of FIG. 8A. The first and second sections 534 and 536 have vertical side walls. A horizontal landing 538 connects the vertical side walls of the first and second sections 534 and 536.

Each pin 504 includes an electrically conductive retainer portion 542, a coil spring 544 and first and second end pieces 546 and 548. The first end piece 546 has a first inner portion 550 and a first tip 552. The second end piece 548 has a second inner portion 554 and a second tip 556. The coil spring 544 and the first and second inner portions 550 and 554 are retained with the retainer portion 542 with the coil spring 544 located between the first and second inner portions 550 and 554. The first and second tips 552 and 556 protrude out of upper and lower ends, respectively, of the retainer portion 542.

An upper surface of the first tip 552 forms a terminal 560. A lower end of the second tip 556 forms a contact 562. The coil spring 544 and the first and second end pieces 546 and 548 are made of metal and, therefore, electrically conductive material. The coil spring 544 and the first and second end pieces 546 and 548 form a conductor that is capable of conducting current between the terminal 560 and the contact 562.

A respective pin is inserted through the upper side 524 into a respective pin opening 518. The second tip 556 is slightly smaller than the second section 530 so that it passes through the second section 530 and protrudes from the lower side 526. The retainer portion 542 is slightly narrower than the first section 528, but is wider than the second section 530 to prevent the pin 504 from falling out of the lower side 526. When the pin 504 is fully inserted into the pin opening 518, and before the contactor 502 is mounted to the signal distribution board 500, the first tip 552 still protrudes above the upper side 524 of the contactor 502.

The post 510 has a stand-off 564, a force transfer potion 566 and a force delivery portion 568. The post 510 is made out of a single piece of metal or other material that is chosen because of its strength when compared to the strength and brittleness of the ceramic material of the contactor 502.

The post 510 is inserted through the upper side 524 into the post opening 520. The stand-off 564 and the force transfer portion 566 are slightly narrower than the second section 536. The force delivery portion 568 is slightly narrower than the first section 534, but wider than the second section 536. A lower surface 570 of the force delivery portion 568 abuts against the landing 538. The post 510 is thereby prevented from falling out of the lower side 526.

The post 510 has a surface 572 that, when the post 510 is fully inserted as shown in FIG. 8A, is in a plane that is parallel and below a surface of the lower side 526. When the post 510 is fully inserted, the force delivery portion 568 has a surface 574 that is in the same plane as the upper side 524.

The signal distribution board 500 is positioned on top of the contactor 502. Each one of the contacts 512 makes contact with a respective one of the terminals 560. Because the terminals 560 are in a plane above a plane of the upper side 524, the lower side 514 is initially spaced from the upper side 524.

The fastener 508 has a threaded shaft 578 and a head 580. The contactor hold-down ring 506 has a ring opening 582. The contactor hold-down ring 506 is located on a lower surface 584 of the contactor 502. The threaded shaft 578 is inserted from the bottom through the ring opening 582 and then through the fastener opening 522. The head 580 comes into contact with a lower surface of the contactor hold-down ring 506. The head 580 is then turned so that thread on the threaded shaft 578 screws into thread on the threaded opening 516. The threading action moves the signal distribution board 500 closer to the contactor 502 and the contactor hold-down ring 506. The lower side 514 eventually comes into contact with the upper side 524. The contacts 512 move the first end piece 546 downward into the pin opening 518 until the terminals 560 are in the same plane as the upper side 524. The coil spring 544 compress, and therefore deform slightly to allow for relative movement of the first end piece 546 relatively towards the second end piece 548.

The lower side 514 has a section that comes to a standstill against the surface 574 forming part of the post 510. Because the post 510 abuts against the signal distribution board 500, the post 510 is in a position to transfer a force through the surface 572 to the signal distribution board 500.

The first wafer 32A has a plurality of electronic devices formed therein. Each electronic device has a plurality of terminals 588 at an upper surface 590 of the first wafer 32A. When bringing the backing plate 74 and the first wafer 32A together, the first wafer 32A is aligned with the backing plate 74 to ensure that each one of the terminals 588 makes contact with a respective one of the contacts 562.

A vacuum pressure is created in an area between the upper surface 590 and the lower side 526 while a pressure below a lower surface 592 of the thin chuck 72 and an upper surface 594 of the signal distribution board 500 remain at atmospheric pressure. The pressure differential creates equal and opposing forces F1 and F2 on the signal distribution board 500 and thin chuck 72.

Figure 8B:
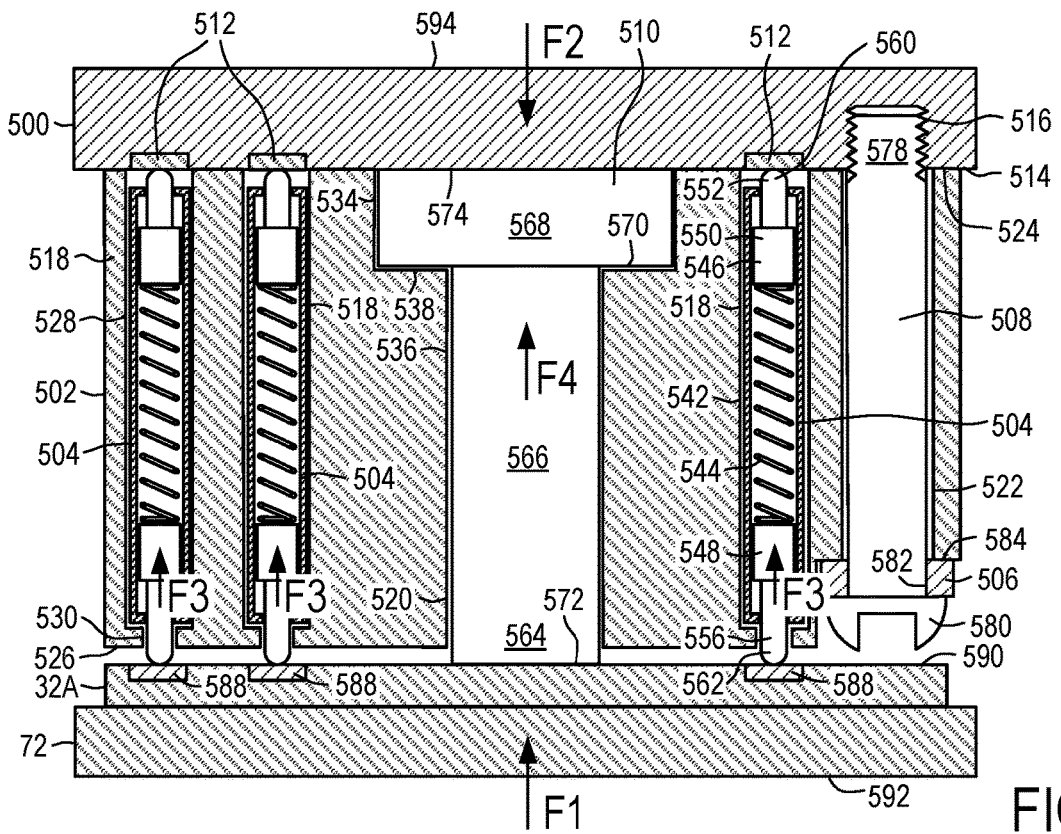

As shown in FIG. 8B, the forces F1 and F2 move the backing plate 74 relatively towards the first wafer 32A and the thin chuck 72. The coil springs 544 compress more to allow for the second end piece 548 to move into the pin opening 518. Each coil spring 544 is deformed against a spring force thereof, for example F3. The force F1 is, however, still more than the total of all the forces F3 added together. The upper surface 590 eventually comes to rest against the surface 572 of the stand-off 564. Because the post 510 abuts against the signal distribution board 500, the stand-off 564 prevents the upper surface 590 to move closer and into contact with the lower side 526 of the contactor 502. The first wafer 32A transfers a forces F4 onto the stand-off 564. The force transfer portion 566 transfers the force F4 through the second section 536 of the post opening 520. The force delivery portion 568 receives the force F4 from the force transfer portion 566 and delivers the force F4 via the surface 574 to the signal distribution board 500.

It can thus be seen that the force F4 is not carried by the contactor 502, thereby preventing stresses that could cause damage to the brittle ceramic material of the contactor 502. Instead, the force F4 is transferred directly from an electronic device in the form of the first wafer 32A through the post 510 onto the signal distribution board 500.

In the embodiment described in FIGS. 8A and 8B, the contactor 502 serves as a supporting board having a post opening 520 therethrough. The signal distribution board 500 serves as a backing structure, on a first side of the supporting board, and including at least a circuit board having a contact 512. The pin 504 serves as a conductor having a contact 562 to make contact with a terminal 588 on an electronic device positioned on a second side of the supporting board opposing the first side of the supporting board. The retainer portion 542 serves as a portion of the conductor that is held by the supporting board. The conductor further has a terminal 560 that is connected to the contact 512 on the signal distribution board 500. A spring in the form of the coil spring 544 is provided. The thin chuck 72 serves as a force generation device on a side of the electronic device in the form of the first wafer 32A opposing the supporting board. The force generation device and the supporting board are moveable relative to one another to move the electronic device closer to the supporting board and to deform the spring. The post 510 has a stand-off 564 with a surface 572 in a plane spaced from a plane of a surface of the supporting board to prevent movement of the electronic device closer to the supporting board, a force transfer portion 566 extending from the stand-off 564 at least partially through the post opening 520 and a force delivery portion 568 extending from the force transfer portion 566, the force delivery portion 568 being held by the backing structure.

FIG. 9A illustrates a portion of the tester apparatus 10 that is used for insertion of a wafer pack into each slot assembly, for example into the slot assembly 18A, and removal therefrom. The components of the tester apparatus 10 shown in FIG. 9A are components of the stationary structure, including include a frame 300, a portion of the first slot assembly 18A, the first slot assembly interface 40, a holding structure 302, a horizontal transportation apparatus 304, a vertical transportation apparatus 306, a push bar blade 308, and a locking mechanism 310.

The frame 300 includes first and second mounts 312 and 314 that are spaced from one another. The horizontal transportation apparatus 304 is a slide that is mounted between the first and second mounts 312 and 314. The holding structure 302 is mounted for sliding movement along the horizontal transportation apparatus 304. Opposing ends of the push bar blade 308 are mounted to the first and second mounts 312 and 314, respectively.

The locking mechanism 310 includes a connection lever 316, a control lever 318 and a pressure lever 320. The control lever 318 is mounted to the first mount 312 on a pivot connection 322. The vertical transportation apparatus 306 is a rigid beam. A connection 324 connects center points of the vertical transportation apparatus 306 and the push bar blade 308 to one another. The pressure lever 320 has a first link 326 rotatably connected to the control lever 318 and a second link 328 rotatably connected to an end of the vertical transportation apparatus 306. In the unlocked configuration shown in FIG. 9A, a line 330 connects the pivot connection 322 with the second link 328 and the first link 326 is to the left of the line 330.

In use, the first wafer pack 28A is located on the holding structure 302. The first wafer pack 28A is then moved together with the holding structure 302 from left to right into the first slot assembly 18A. The placement and movement of the first wafer pack 28A may be manually executed or may be executed using a robot.

The holding structure 302 slides along the horizontal transportation apparatus 304. The connection lever 316 connects an end of the control lever 318 to the holding structure 302. When the holding structure 302 moves in a horizontal direction along the horizontal transportation apparatus 304, the connection lever 316 rotates the control lever 318 in a counterclockwise direction about the pivot connection 322.

The first link 326 rotates together with the control lever 318 in a counterclockwise direction. The pressure lever 320 translates movement of the first link 326 to downwards movement of the second link 328. At first, the downward movement is minimal, but when the first wafer pack 28A is fully inserted into the first slot assembly 18A, vertical movement becomes more pronounced and the vertical transportation apparatus 306 engages the first wafer pack 28A with the first slot assembly 18A. The horizontal transportation apparatus 304 is thus operable to move the first wafer pack 28A horizontally from a first position to a second position into the first slot assembly 18A and the vertical transportation apparatus 306 is operable to move the first wafer pack 28A and the first slot assembly 18A in a first vertical direction relative to one another to engage the slot assembly interface 40 with a wafer pack interface on the first wafer pack 28A.

Figure 10:
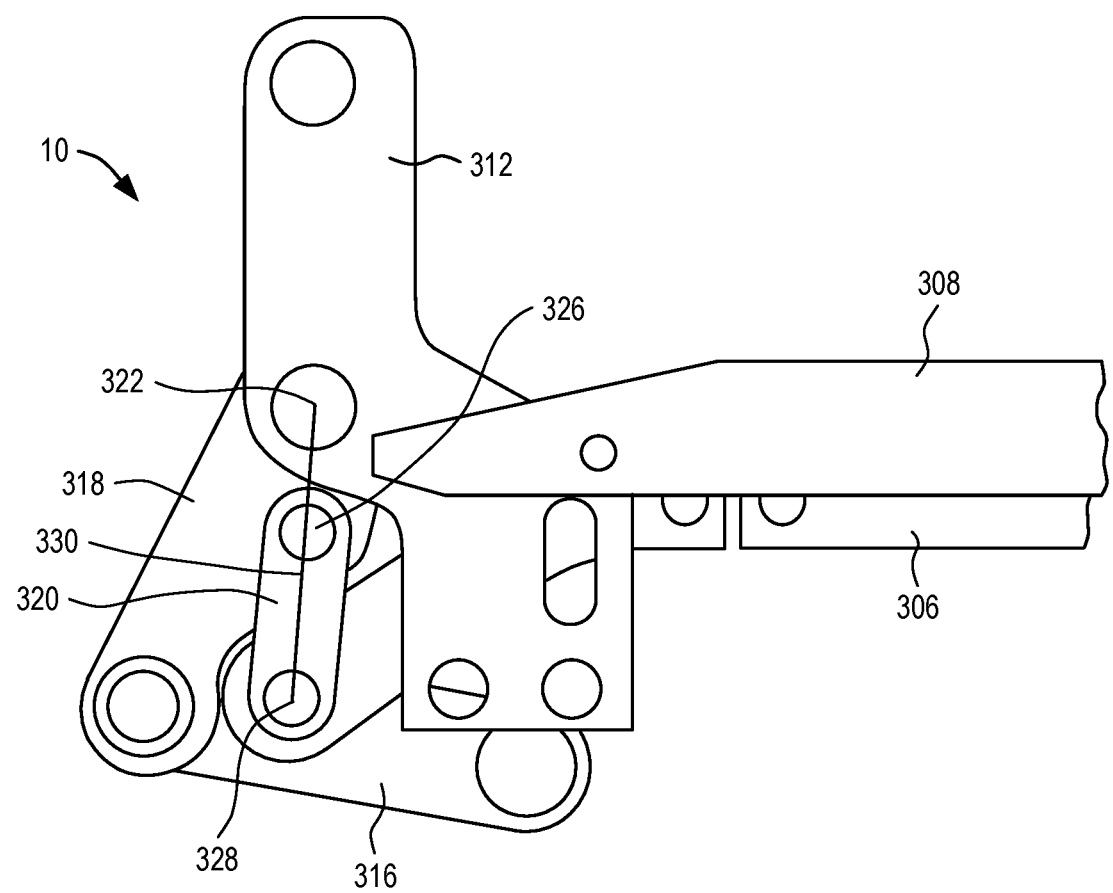

The control lever 318 is shown in an unlocked position in FIG. 9A where the first link 326 is on a first side of the line 330 connecting the pivot connection 322 and the second link 328. The control lever 318 rotates from the unlocked position shown in FIG. 9A through a compression position where the push bar blade 308 is deformed by the vertical transportation apparatus 306 through the connection 324 by bending the push bar blade 308 against a spring force thereof and the first link 326 is in line with the pivot connection 322 and the second link 328. The control lever 318 continues to rotate from the compressed position to a locked position as shown in FIGS. 9B and 10. In the locked position, the first link 326 is on the right of the line 330, and therefore on a second side of the line 330 opposing the first side. Because the first link 326 has passed through the line 330, and the push bar blade 308 has deformed against a spring force thereof, the first wafer pack 28A is locked in position against the slot assembly interface 40.

The system can be unlocked by moving the holding structure 302 from right to left. The control lever 318 rotates in a clockwise direction and the first link 326 moves right to left past the line 330. The vertical transportation apparatus 306 moves in an upward direction, i.e. a second vertical direction opposing the first vertical direction, to release the first wafer pack 28A from the slot assembly interface 40. Further movement of the holding structure 302 along the horizontal transportation apparatus 304 removes the first wafer pack FIGS. 11 and 12 illustrate further components of the first wafer pack 28A, including a pressure reduction check valve 600, a vacuum release check valve 602, components of a latch system that includes first, second, third and fourth latch assemblies 604A to 604D, and an electrical pressure sensor interface 606 forming part of a pressure monitoring system.

Figure 11:
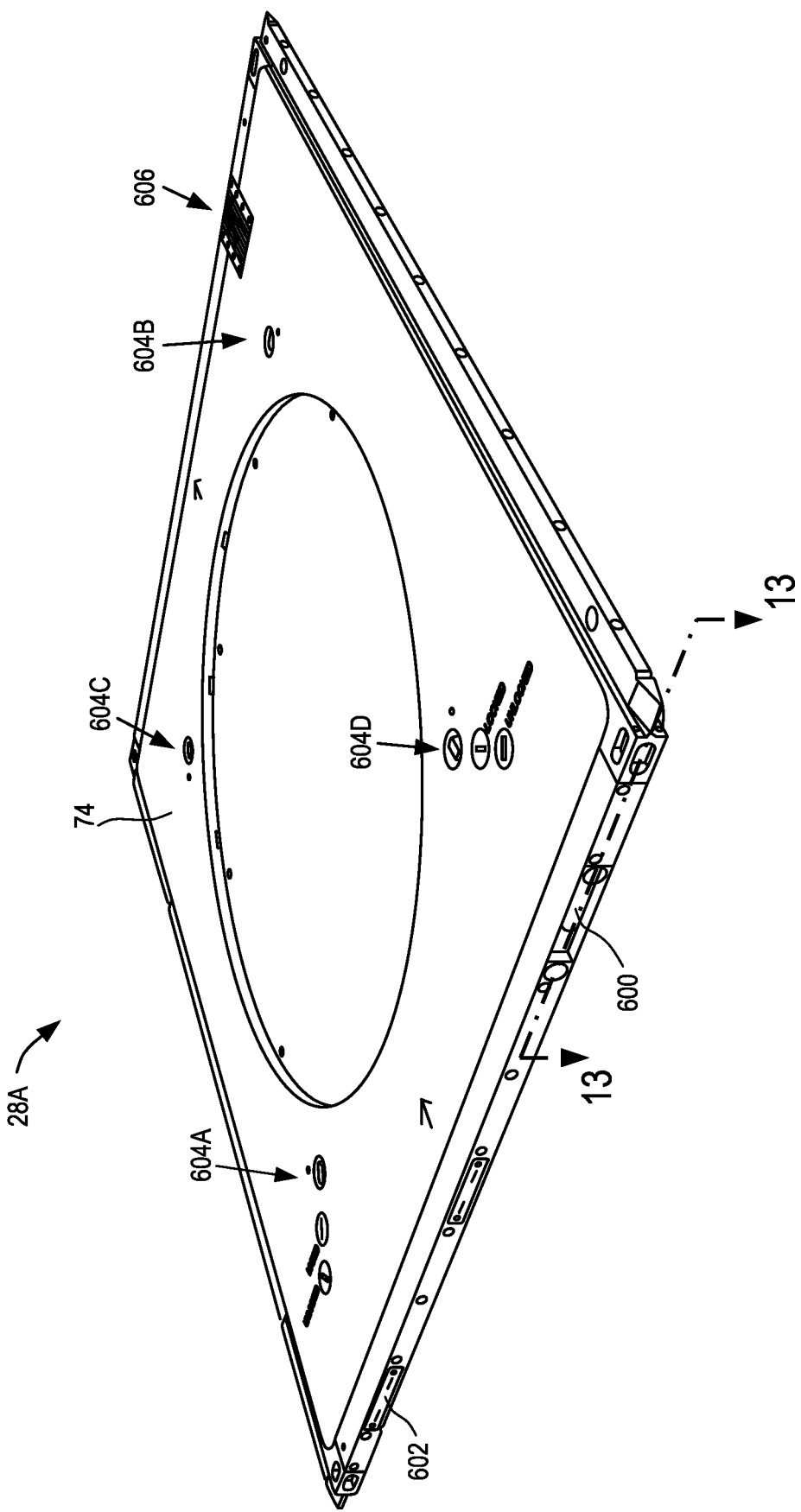
FIG. 11 is a perspective view from above of the first wafer pack.
Figure 12:
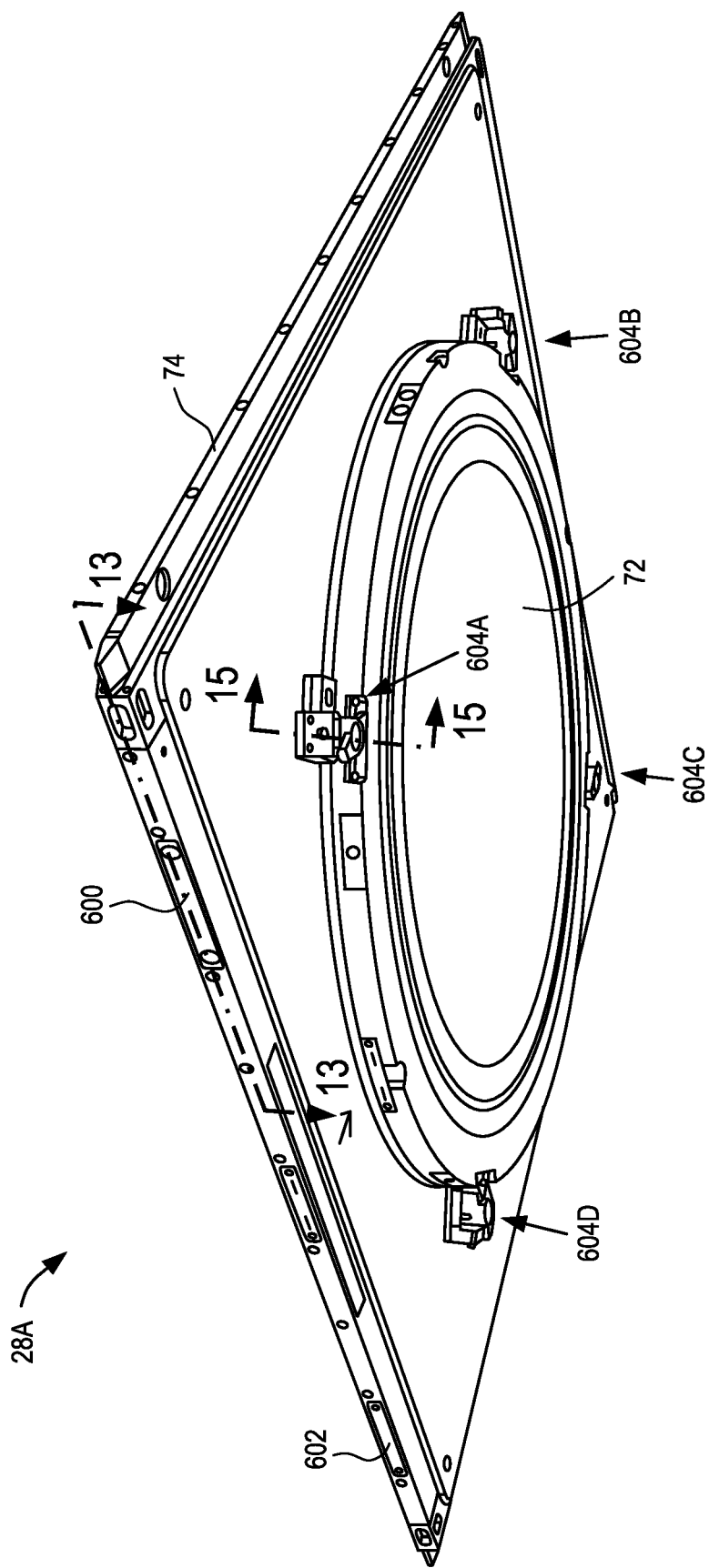
FIG. 12 is perspective view from below of the first wafer pack.
Figure 13:
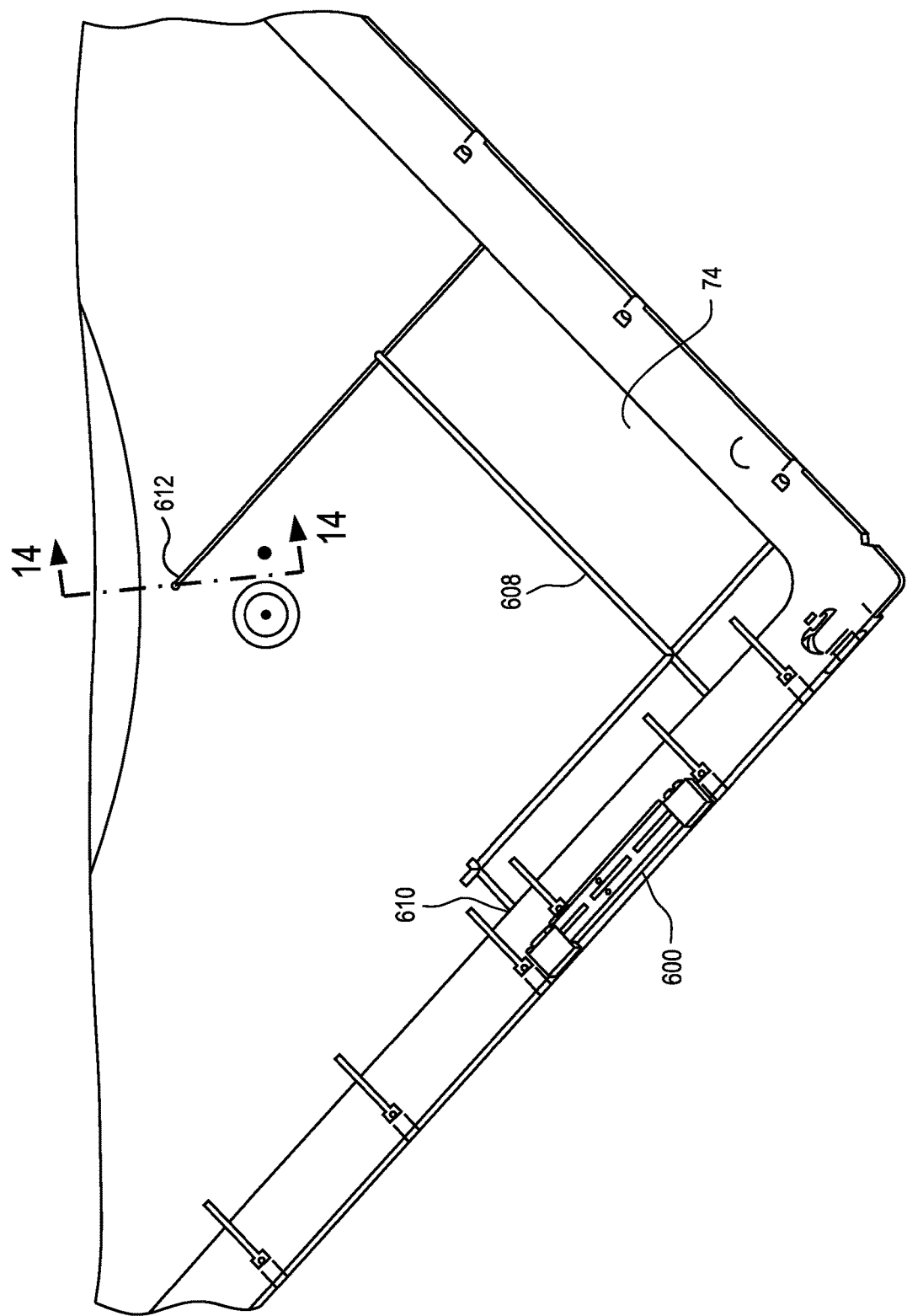
FIG. 13 is a cross-section on 13-13 in FIGS. 11 and 12 of the first wafer pack.

FIG. 13 is a cross-section on 13-13 in FIGS. 11 and 12. A pressure reduction passage 608 is formed in the backing plate 74. The pressure reduction passage 608 has an outlet opening 610 and an intermediate location 612 that are located in the same plane. The outlet opening 610 is connected to the pressure reduction check valve 600. The intermediate location 612 is closer to a center point of the backing plate 74 than the outlet opening 610. The pressure reduction passage 608 is formed by first drilling four passages into a backing plate 74 and then closing one end of three of the passages so that the resulting pressure reduction passage 608 is completely isolated from an atmospheric pressure external to the backing plate 74.

Figure 14:
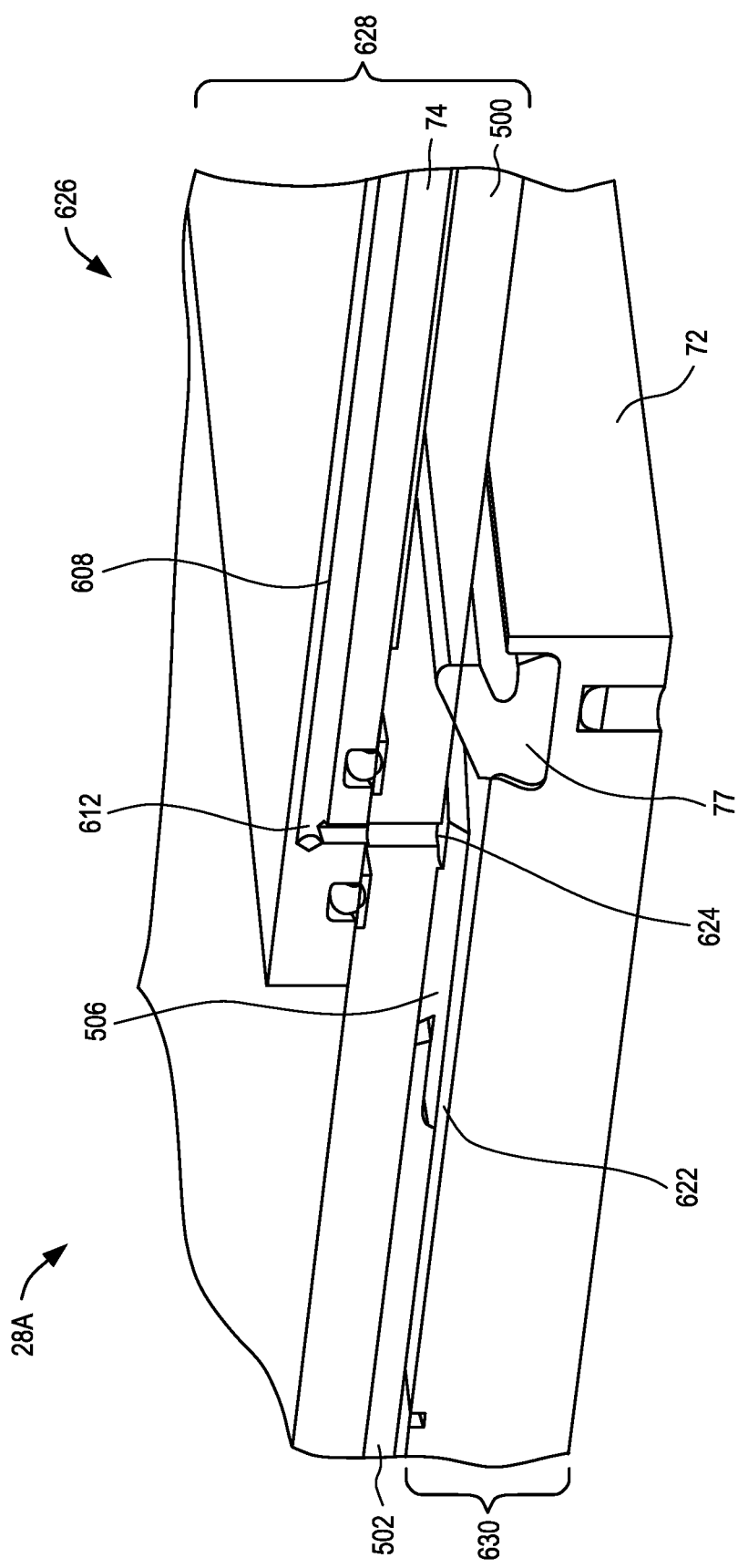
FIG. 14 is a cross-section on 14-14 in FIG. 13 of the first wafer pack.

FIG. 14 is cross-section on 14-14 in FIG. 13. The pressure reduction passage 608 continues downward from the intermediate location 612 through the backing plate 74 and through the signal distribution board 500. The pressure reduction passage 608 has an inlet opening 624 that is in communication with the pressure differential cavity 622. The lip seal 77 is located within a recess of the thin chuck 72. A pressure differential cavity 622 is formed jointly by the thin chuck 72 that forms a lower side of the pressure differential cavity 622, the contactor 502, the contactor hold-down ring 506, and the signal distribution board 500 forming an upper side of the pressure differential cavity 622, and the lip seal 77 forming a connection between the upper and lower sides of the pressure differential cavity 622. The lip seal 77 is completely circular and entirely surrounds the contactor 502 and the wafer that is located between the contactor 502 and the thin chuck 72.

The components shown in FIG. 14 form a portable supporting structure 626. The portable supporting structure 626 has a first component 628 that includes the signal distribution board 500 and the backing plate 74, and a second component 630 that includes the thin chuck 72.

In use, the first component 628 is separated from the second component 630. A wafer is then placed on the thin chuck 72. The first component 628 is then positioned on the second component 630. An upper periphery of the lip seal 77 makes contact with the signal distribution board 500. The wafer is thus held in the portable supporting structure 626.

Referring now to FIGS. 13 and 14 in combination, a pump is connected to the pressure reduction check valve 600. The pressure reduction check valve 600 is then opened. The pressure reduction passage 608 may initially be at atmospheric pressure and the pump subsequently reduces the pressure within the pressure reduction passage 608. The pressure differential cavity 622 is exposed to the lower-than-atmospheric pressure. External surfaces of the first wafer pack 28A are still exposed to atmospheric pressure. Because a pressure differential is created between the pressure differential cavity 622 and external surfaces of the first wafer pack 28A, the springs within the contactor 502 compress as described with reference to FIG. 8B. The lip seal 77 is made of a resilient elastomeric material which causes it to compress against a spring force thereof. Because the lip seal 77 compresses against a spring force thereof an improved seal is created between the lip seal 77 and the signal distribution board 500 so that a pressure within the pressure differential cavity 622 can be maintained. The pressure reduction check valve 600 is then closed, thereby isolating the pressure reduction passage 608 from external atmospheric pressure. The pump can then be disconnected from the pressure reduction check valve 600.

The first wafer pack 28A with the wafer loaded inside of it can now be moved within a fabrication environment without being connected to a pump or to a tester. Should it later be required to remove the wafer, positive pressure can be applied to the vacuum release check valve 602 shown in FIGS. 11 and 12. The vacuum release check valve 602 is spring loaded which requires a predetermined amount of pressure to be applied before it opens. Air can then flow through a vacuum release passage in the backing plate 74 to the pressure differential cavity 622 and bring the pressure differential cavity 622 to atmospheric pressure. The first and second components 628 and 630 can then be separated from one another and the wafer can be removed. The vacuum release check valve 602 is subsequently closed when a new wafer is loaded in the first wafer pack 28A and when it is required to reduce the pressure within the pressure differential cavity 622 using the pressure reduction check valve 600.

Figure 15:
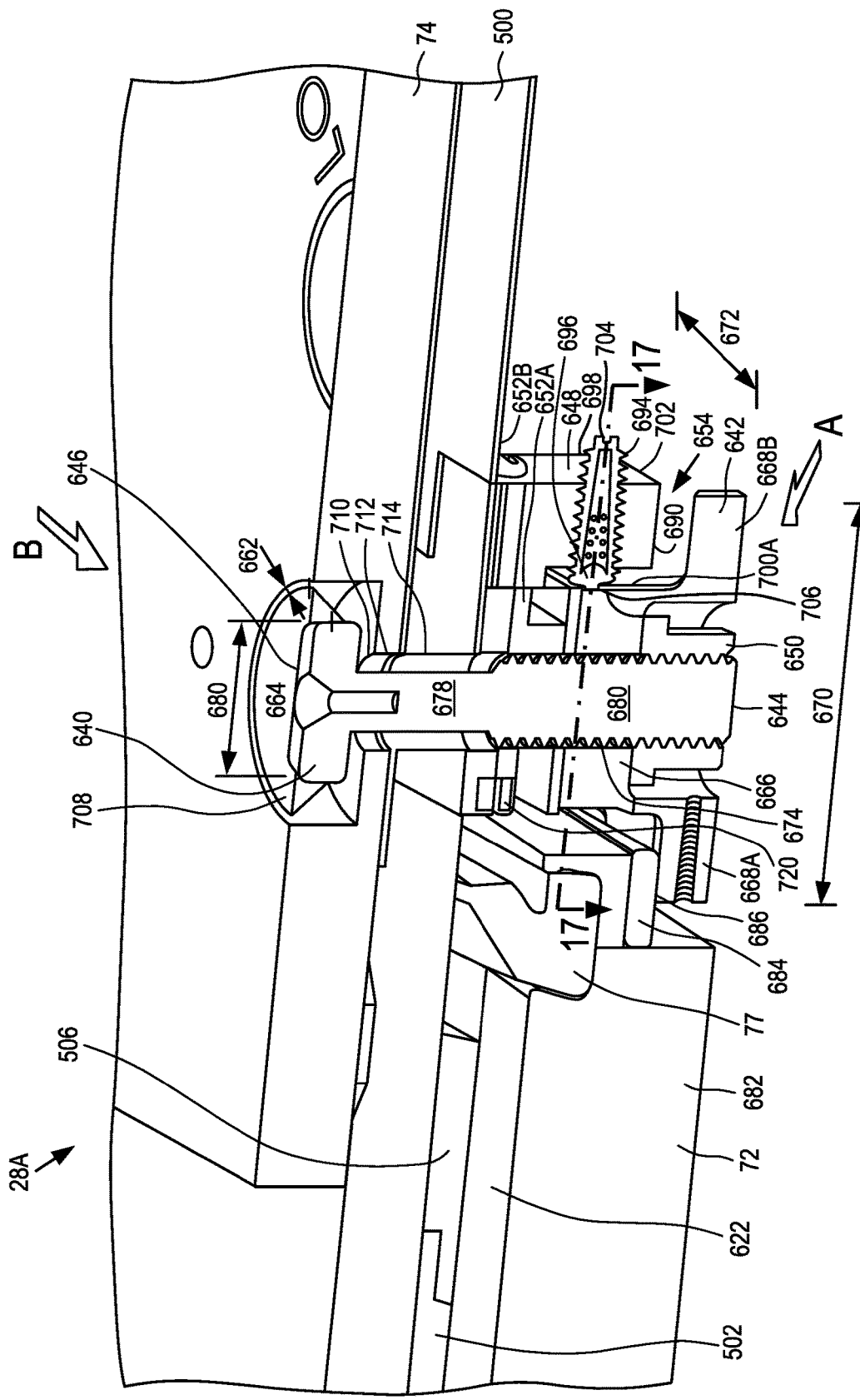
FIG. 15 is a cross-section on 15-15 in FIG. 12 of the first wafer pack.

FIG. 15 is cross-section on 15-15 in FIG. 12. The first latch assembly 604A includes a first part 640, a second part 642, a connecting part 644, an engaging mechanism 646, a tuning block 648, a locking nut 650, a spacer 652A, a shim 652B and a snap mechanism 654.

The first part 640 and the connection part 644 are machined out of one piece and are thus secured to each other. The first part 640 has a length 660 and a width 662. In cross-section only half of the width 662 is represented. The length 660 is larger than the width 662. The length 660 is also larger than a diameter of the connecting part 644. The first part 640 has a tool pin opening 664 formed therein.

The second part 642 has a body 666 and first and second wing pieces 668A and 668B extending from the body 666. The second part 642 has a length 670 that includes the wing pieces 668A and 668B and a width 672. Only half the width 672 is represented in cross-section. Because the first and second wing pieces 668A and 668B form part of the length 670 but are not part of the width 672, the length 670 is much larger than the width 672. The body 666 further has an opening 674 through which the connecting part 644 can be inserted.

The connecting part 644 includes a first portion 678 and a second portion 680. The second portion 680 has external thread formed thereon.

The engaging mechanism 646 is formed by opposing surfaces defining the width 662 of the first part 640. The opposing surfaces forming the engaging mechanism 646 are parallel to one another to promote engagement of parallel surfaces on a jaw of a tool capable of then rotating the first part 640.

The tuning block 648 is mounted in a fixed position to the spacer 652A. The thin chuck 72 includes a metal portion 682 and a protective piece 684. The protective piece 684 forms a shoulder 686 on the thin chuck 72. The shim 652B is located between the spacer 652A and the signal distribution board 500. Only a single shim 652B is shown. Additional shims are typically inserted one on top of the other until a levelling surface 690 of the tuning block 648 is at the same vertical elevation as the shoulder 686.

The snap mechanism 654 includes a retainer body 694, a spherical ball 696 and a spring 698. The body 666 of the second part 642 forms part of the snap mechanism 654 because the body 666 has a first snap depression 700A formed therein.

The retainer body 694 has an outer surface with a screw thread 702 thereon. The retainer body 694 further has an end with a slot 704 formed therein that is capable of receiving a tool such as screwdriver. The spring 698 is located within the retainer body 694. The spherical ball 696 is positioned within a mouth of the retainer body 694. The mouth of the retainer body 694 has a slightly reduced sized to prevent the spherical ball 696 from falling out of the retainer body 694. An external surface of the spherical ball 696 forms a snap surface 706. The screw thread 702 engages with complementary screw thread within the tuning block 648. A tools such as a screwdriver is inserted within the slot 704 and is then rotated to adjust how far the snap surface 706 is spaced from the tuning block 648.

An intermediate protective component 708 is inserted into a complementary recess in an upper surface of the backing plate 74. Openings 710, 712 and 714 have been made in the intermediate protective component 708, the backing plate 74 and the signal distribution board 500, respectively. The second portion 680 of the connecting part 644 is inserted from above through the openings 710, 712 and 714. The length 660 of the first part 640 is more than a length of any one of the openings 710, 712 and 714 in the same direction, which prevents the first part 640 from entering the openings 710, 712 and 714. A lower surface of the first part 640 comes to rest on an upper surface that is formed within the intermediate protective component 708. The first portion 678 of the connecting part 644 is then located within the openings 710, 712 and 714 and the second portion 680 of the connecting part 644 is located below the openings 710, 712 and 714. A spring-loaded washer 720, the shim 652B and the spacer 652A are then positioned from below over the connecting part 644. The second part 642 is then positioned from below over the connecting part 644. The opening 674 forms a sliding fit with an outer diameter of the thread on the second portion 680 of the connecting part 644.

As the second part 642 slides upwardly over the connecting part 644, the first snap depression 700A also comes into contact with the snap surface 706. The spherical ball 696 moves by a small amount from right to left against a spring force of the spring 698. The locking nut 650 then engages with a protruding end of the second portion 680. Rotation of the locking nut 650 causes tightening of the body 666 of the second part 642 against a spring force of the washer 720. A feeler gauge or other instrument may be used to determine a gap between the second wing piece 668B and the levelling surface 690. The locking nut 650 can be rotated until an acceptable gap is formed between the second wing piece 668B and the levelling surface 690. The gap will typically be the same as a desired gap between the first wing piece 668A and the shoulder 686. A locking arrangement is then formed by the first part 640, the second part 642, a connecting part 644.

As the locking nut 650 is rotated, the first snap depression 700A also moves upwardly. The first snap depression 700A is an elongated slot. The snap surface 706 and the first snap depression 700A can thus slide over one another as the second part 642 continues to move upwardly with continued rotation of the locking nut 650.

As shown in the drawings, the thin chuck 72 is in place while the first latch assembly 604A is assembled. Additionally, a negative pressure exists with the pressure differential cavity 622. By having the first wafer pack 28A in a compressed state, it is possible to gauge whether the first and second wing pieces 668A and 668B are equivalently spaced from the shoulder 686 and the levelling surface 690. It may also be possible to assemble the first latch assembly 604A without the thin chuck 72 in place by simply gauging a spacing between the second wing piece 668B and the levelling surface 690, provided that the levelling surface 690 has been set at the correct height using one or more shims such as the shim 652B.

Figure 16:
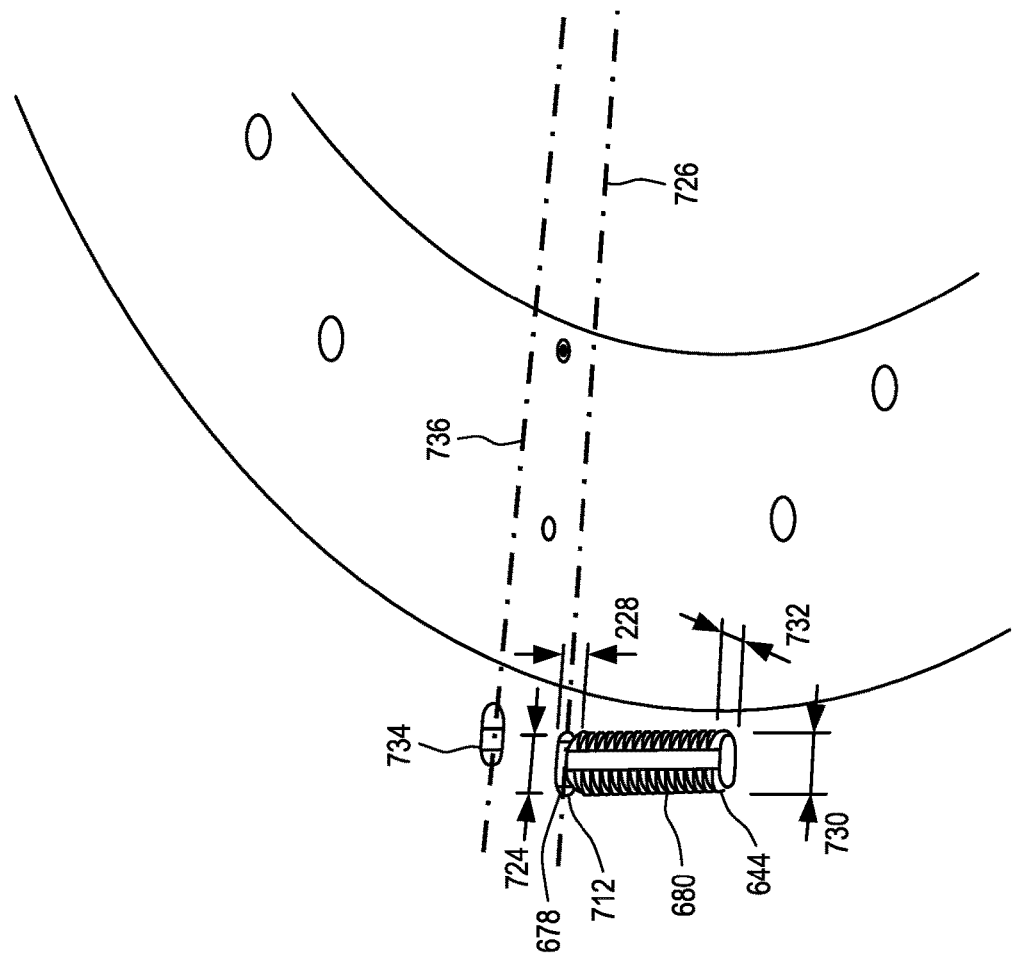
FIG. 16 is a view in a direction of an arrow A in FIG. 15 with components thereof removed.

FIG. 16 is a view in a direction A in FIG. 15, but only showing the connecting part 644 and the signal distribution board 500.

The opening 712 has a first dimension 724 on an axis 726 towards a center point of the signal distribution board 500 that is larger than a second dimension 728 transverse to the axis 726. The first portion 678 of the connecting part 644 is smaller than the first dimension 724 in the direction of the axis 726 to allow for thermal expansion of the signal distribution board 500 and the backing plate 74 (see FIG. 15) relative to one another. The first portion 678 is dimensioned to slidably fit within the second dimension 728 to prevent movement of the signal distribution board 500 in a direction transverse to the axis 726 relative to the backing plate 74.

The second portion 680 of the connecting part 644 has a first thickness 730 and a second thickness 732. The first thickness 730 can fit through the opening 712 in the direction of the axis 726 and is larger than the second dimension 728 of the opening 712. The second thickness 732 is transverse to the first thickness 730 and can fit through the second dimension 728 of the opening 712. Because the second dimension 728 is relatively large, it allows for thread that can be formed thereon and it is still relatively strong. The entire second portion 680 is located below the opening 712, which allows for the connecting part 644 to be rotated about a longitudinal axis thereof without the second portion 680 catching on the relatively narrow opening 712. The first portion 678 has a circular cross-section with a diameter that is no more than the second dimension 728, which allows for the first portion 678 to rotate freely within the relatively narrow second dimension 728 of the opening 712.

A further opening 734 is formed in the signal distribution board 500 for a further anchor of the shim or shims. The opening 734 is similarly proportioned to the opening 712, having a longer dimension on an axis 736 towards a center point of the signal distribution board 500. The anchor passing through the opening 734 does not have to rotate when used in a fabrication environment and the dimensions of the opening 734 only serve to allow for thermal expansion of the signal distribution board 500 relative to the backing plate 74.

Figure 17:
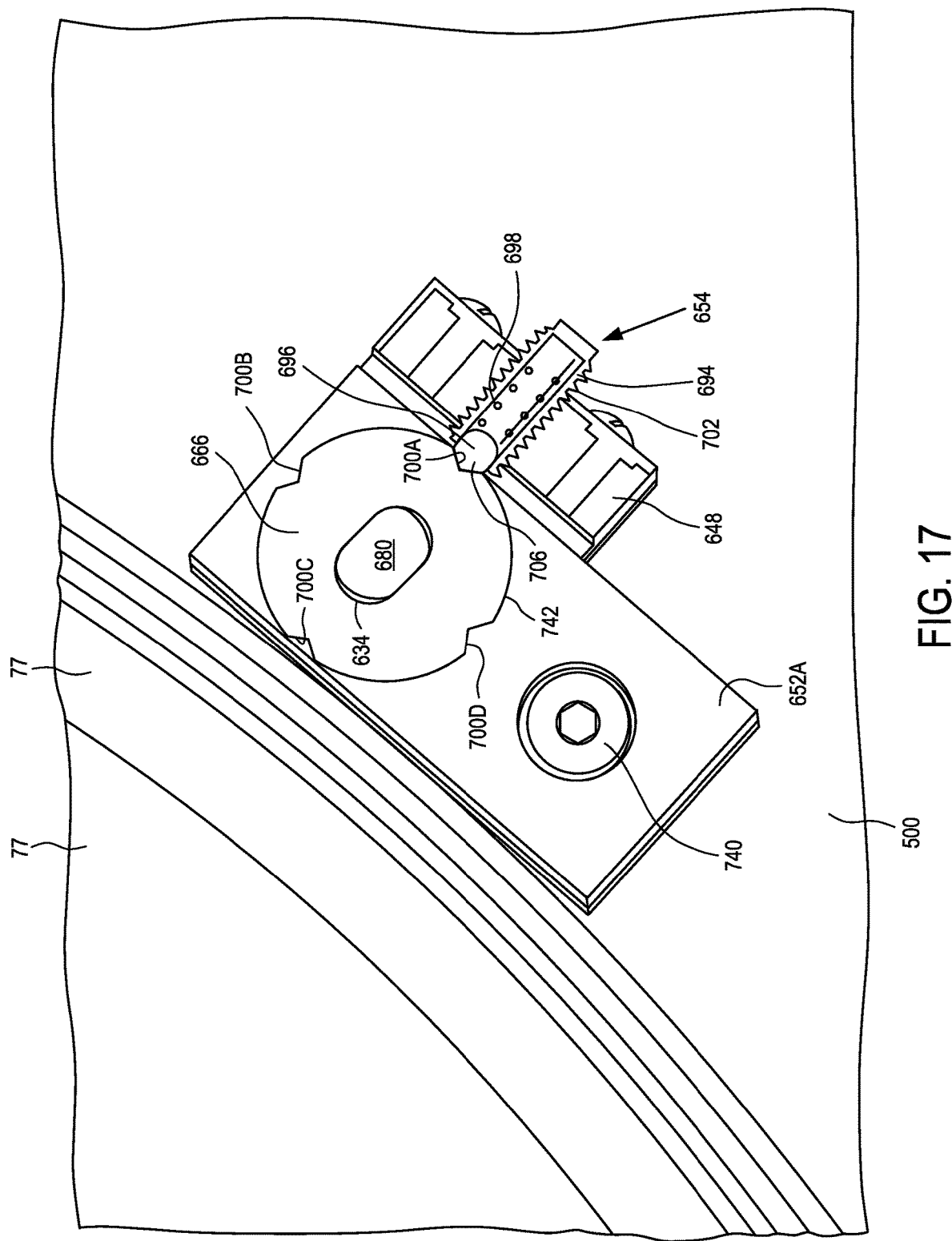
FIG. 17 is a is a cross-section on 17-17 in FIG. 15.
Figure 21:
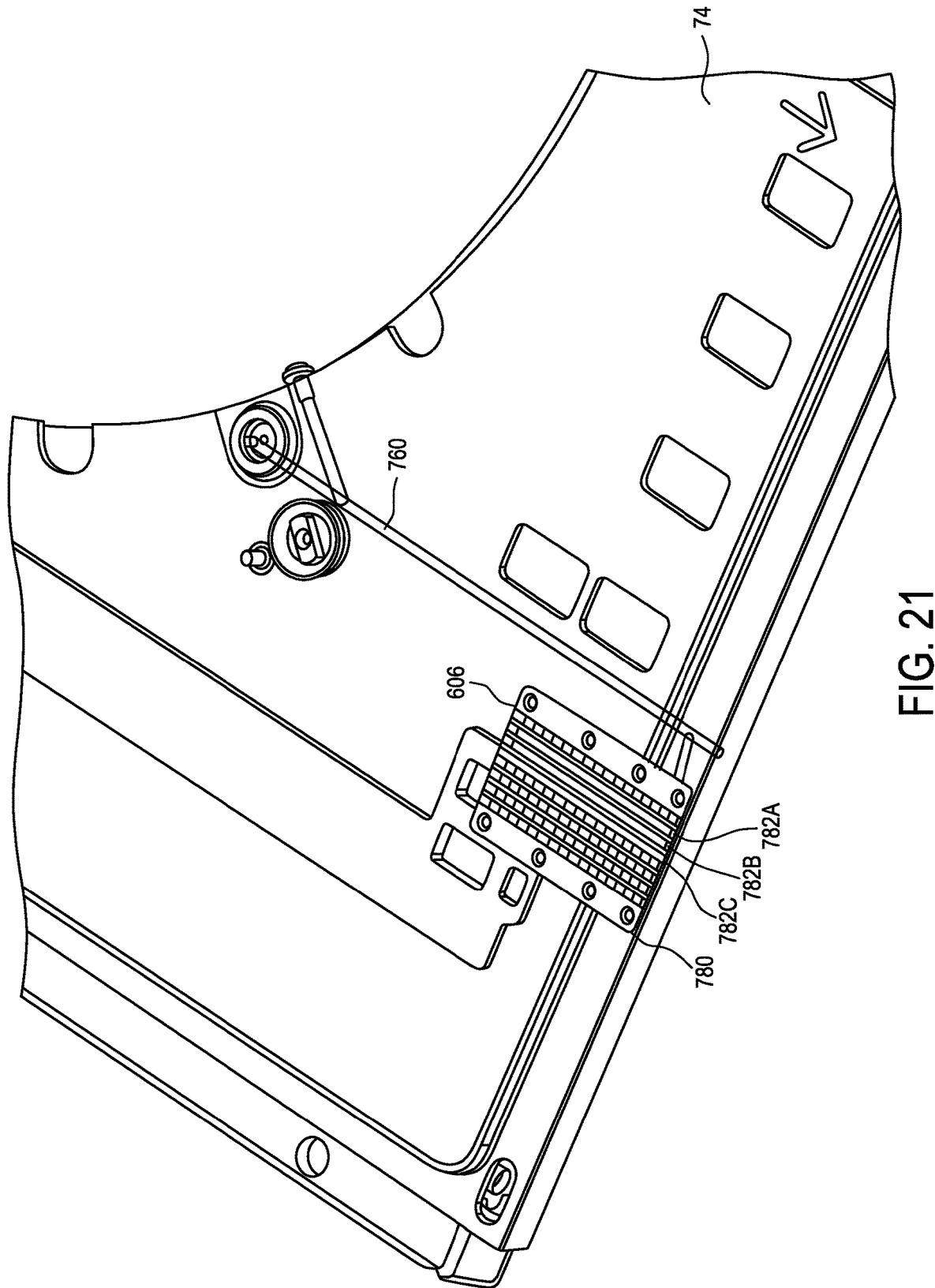
FIG. 21 is a perspective view of further components of the pressure monitoring system.
Figure 22A:
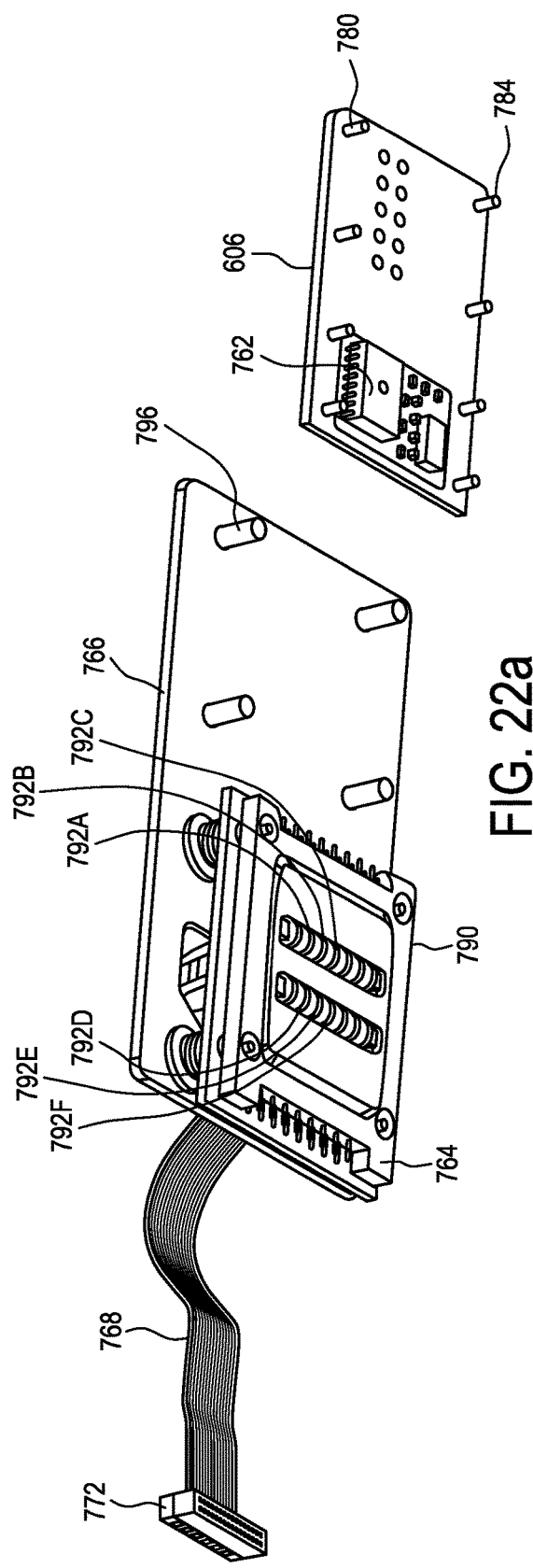
FIGS. 22a and 22b are a perspective view and a side view of the components of the pressure monitoring system before engagement.
Figure 22B:
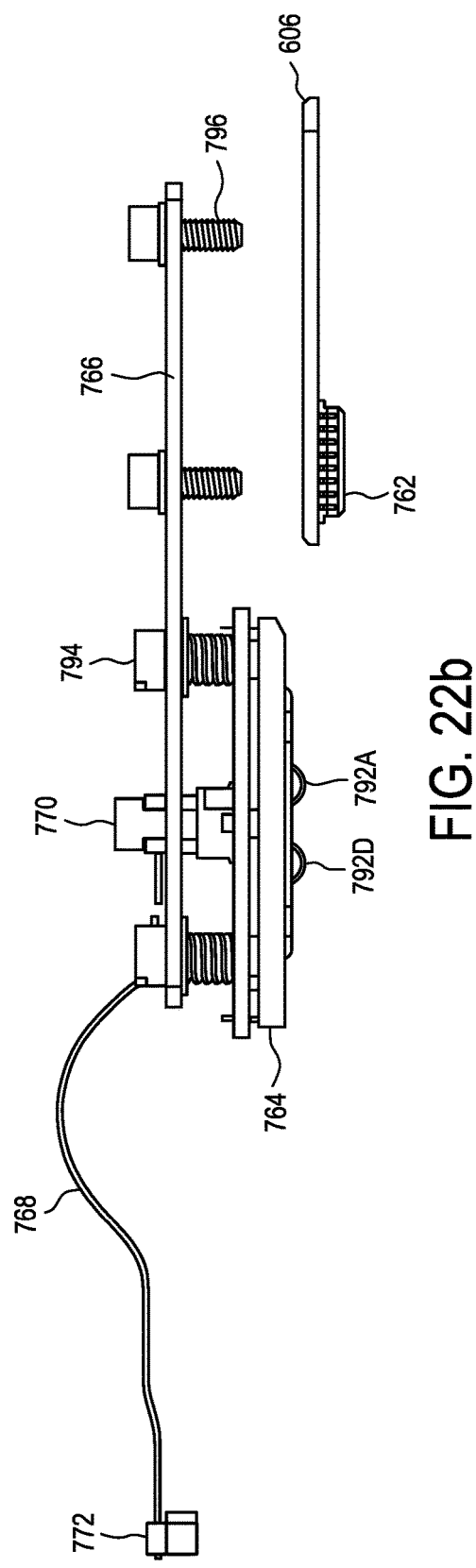

FIG. 17 is a cross-section on 17-17 in FIG. 15. An anchor 740 is inserted through the opening 734 in FIG. 16 to secure the spacer 652A and the shim 652B to the backing plate 74. The anchor 740 includes a bolt and a nut with a head of the bolt on one side and the nut on the opposite side.

The body 666 has a circular outer surface 742 with first, second, third and fourth snap depressions 700A to 700D formed therein. The snap surface 706 of the spherical ball 696 is located within the first snap depression 700A, which prevents the body 666 from rotating. The opening 674 within the body 666 is keyed to accept the shape of the second portion 680 so that the second portion 680 cannot rotate if the body 666 remains stationary.

A small amount of torque is required to rotate the body 666 and have the spherical ball 696 come out of the first snap depression 700A. Should the body 666 be rotated clockwise, the snap surface 706 rides on the circular outer surface 742 between the first snap depression 700A and the second snap depression 700B. As the body 666 rotates, the second portion 680 rotates together with the body 666 through the same angle. As the body 666 approaches 90 degrees of rotation, the snap surface 706 snaps into the second snap depression 700B. The second snap depression 700B then resists rotation of the body 666 and the second portion 680. The first to fourth snap depressions 700A to 700D lightly lock the body 666 at four different rotational angles, including 0 degrees, 90 degrees, 180 degrees and 270 degrees.

FIGS. 18*a*(i) and 18*a*(ii) are views in the directions of the arrows A and B in FIG. 15 but with the locking arrangement rotated into an unlocked position. A human operator may compare an orientation of the first part 640 to a reference 750 on an upper surface of the thin chuck 72 which, in FIG.

18a(ii), shows that the first latch assembly 604A is unlocked. The shoulder 686 is unencumbered from below by either the first wing piece 668A or the second piece 668B. The wing pieces 668A and 668B are held in the position shown in FIG. 18a(i) by the snap mechanism 654 shown in FIGS. 15 and 17. A pressure within the first wafer pack 28A can be reduces and the thin chuck 72 can be removed for inserting or replacing a wafer. After the wafer has been replaced, the pressure within the first wafer pack 28A is again reduced to hold the first wafer pack 28A together.

When the first wafer pack 28A is fully assembled, it may be required to provide a further failsafe so that the electrical contact with the wafer is maintained even if the negative pressure within the first wafer pack 28A cannot be maintained due to a system failure. An operator may use a tool (not shown) having a jaw and a pin. The pin is inserted into the tool pin opening 664. The tool pin opening 664 is tapered so that the tool progressively becomes more aligned with the first part 640 the further the pin is inserted into the tool pin opening 664. An operator then engages opposing parallel surfaces of the jaw of the tool with opposing parallel surfaces formed by the engaging mechanism 646. Once the tool is engaged with the engaging mechanism 646, the operator rotates the tool, and the tool rotates the first part 640. The connecting part 644 and the second part 642 together with its first and second wing pieces 668A and 668B rotate together with the first part 640. Referring to FIG. 17, the snap surface 706 leaves the fourth snap depression 700D and slides on the circular outer surface 742. The snap surface 706 then snaps into the first snap depression 700A.

FIGS. 18b(i) and 18b(ii) show the first latch assembly after the first and second parts 640 and 642 have rotated through an angle 752 of 90 degrees. An operator can see that the orientation of the first part 640 matches a locked position as shown in the reference 750. The first wing piece 668A is now located over the shoulder 686, which prevents movement of the thin chuck 72 in a vertically downward direction away from the rest of the wafer pack 28A. The second wing piece 668B is located over the tuning block 648. The first wing piece 668A can be disengaged from the shoulder 686 by rotating the first part 640 clockwise or counterclockwise through 90 degrees. Either wing piece 668A or 668B can be used to lock the thin chuck 72 in position.

FIG. 19 illustrates how one or more shims 652B to 652F can be used to adjust a height of the levelling surface 690 of the tuning block 648. The tuning block 648 should ideally be at the same height as shoulder 686. Because the tuning block 648 is mounted to the spacer 652A, the tuning block 648 moves up and down with the spacer 652A as more of the shims 652B to 652F are inserted. More shims can be inserted to raise the levelling surface 690 if it is below the shoulder 686, or shims can be removed if the levelling surface 690 is above the height of the shoulder 686.

The engaging mechanism 646 is conveniently located directly on the first part 640. In another arrangement, an engaging mechanism may be formed directly on the second part 642 or directly on the connecting part 644.

In a further embodiment, an engaging mechanism may be a separate mechanism from the first and second parts 640 and 642 and from the connecting part 644. For example, a worm gear may be formed on the connecting part 644 and the engaging mechanism may be a separate turnable mechanism that rotates the worm gear.

The engaging mechanism may also be located between the first part 640 and the connecting part 644. For example, the first wing piece 668A may be pivoted downwardly away from the shoulder 686 and back towards the shoulder 686 with a cam system that is located between the first part 640 and the connecting part 644. Such a cam system serving as an engaging mechanism may alternatively be located between the connecting part 644 and the second part 642. Alternatively, the connecting part 644 can be made in two pieces and the engaging mechanism can connect the two pieces and adjust a spacing the two pieces and the spacing adjustment can then pivot the wing piece.

The first latch assembly 604A uses primarily incompressible and non-pliable materials. In alternate embodiment, straps or other pliable materials can be used with the same or similar objectives in mind.

Instead of having the engaging mechanism 646 on an external surface of the first part 640, an engaging mechanism may alternatively be on an internal surface of any part.

Referring again to FIG. 12, the first, second, third and fourth latch assemblies 604A to 604D are identical except for their respective locations an orientations. The first and third latch assemblies 604A and 6040C are on opposite sides of the thin chuck 72 and the second and fourth latch assemblies 604B and 604D are on opposite sides of the thin chuck 72. Because the latch assemblies 604A to 604D are located on more than just one side of the thin chuck 72, i.e. they cover more than 180 degrees around a periphery of the thin chuck 72, they can collectively hold all sides of the thin chuck 72 in place around its entire periphery.

The latch system provided by the first, second, third and fourth latch assemblies 604A to 604D helps to facilitate movement of the first wafer pack 28A through a fabrication environment without the need for human oversight. Without the latch system, human oversight may be required to determine when the negative pressure within the first wafer pack 28A has failed and the wafer 28A has come apart. The latch system provides a structural failsafe to prevent the first wafer pack 28A from coming apart even if it were to take in air from the outside.

FIGS. 20, 21, 22a and 22b illustrate further components of the pressure monitoring system, including a pressure sensing passage 760 (FIG. 21), a pressure sensor 762 (FIGS. 22a and 22b), the electrical pressure sensor interface 606 (FIGS. 20, 21, 22a and 22b)) mentioned with reference to FIG. 11, an electrical pressure connector interface 764, a mounting bracket 766, a ribbon cable 768 having first and second connectors 770 and 772 at opposing ends thereof (FIGS. 20, 22a and 22b), a connector block 774, and a stiffener plate 776 (FIG. 20).

The pressure sensing passage 760 is formed in the backing plate 74 in a manner similar to the pressure reduction passage 608 described with reference to FIG. 13. The pressure sensing passage 760 has a first end within the pressure differential cavity 622 shown in FIG. 14. The pressure sensing passage 760 has a second end, opposing the first end, near an outer edge of the backing plate 74.

The electrical pressure sensor interface 606 is in the form of a printed circuit board having a substrate 780 and a plurality of contacts, including first, second and third contacts 782A, 782B and 782C formed on the substrate 780.

The pressure sensor 762 is mounted to the substrate 780 on a side of the substrate 780 opposing the first, second and third contacts 782A, 782B and 782C. The pressure sensor 762 is electrically connected through the substrate 780 to the first, second and third contacts 782A, 782B and 782C. The pressure sensor 762 is capable of sensing a pressure of a gas, in the present case air, and converting the pressure to an electrical signal wherein a magnitude of the pressure is indicated by a magnitude or another variable of the signal.

Pressure can be conveniently detected using a diaphragm that displaces by a known distance as the pressure increases or decreases. Other pressure sensors are also within the scope of the invention, for example pressure sensors that use piezoelectric crystals or pressure sensors that use stress gauges. In the case of a moving diaphragm, the movement can be converted to a voltage, for example by moving an inductive coil and a magnitude of the voltage is then indicative of the displacement and therefore the pressure. The pressure sensor may, for example be the MLX90809 sold by Melexis (www.melexis.com). The electrical pressure sensor interface 606 is mounted to the backing plate 74 using fasteners 784. The diaphragm of the pressure sensor 762 is then exposed to the air at the second end of the pressure sensing passage 760. The pressure sensor 762 can thus sense a pressure within the pressure differential cavity 622.

The electrical pressure connector interface 764 has a board 790 and a plurality of terminals, including first through sixth terminals 792A to 792F secured to the board 790. The board 790 is mounted through fasteners 794 to the mounting bracket 766. The stiffener plate 776 is secured between the two push bar blades 308. The mounting bracket 766 is secured with fasteners 796 to the stiffener plate 776. The slot assembly body 32 together with the push bar blades 308 and stiffener plate 776 form part of the stationary structure and the electrical pressure connector interface 764 is thus mounted to the stationary structure.

The connector block 774 is mounted to the slot assembly body 32. The connectors 770 and 772 are connected to the electrical pressure connector interface 764 and the connector block 774, respectively. The first to sixth terminals 792A to 792F are connected through the first connector 770, ribbon cable 768, and second connector 772 to a pressure sensing board of the electric tester.

Figure 23A:
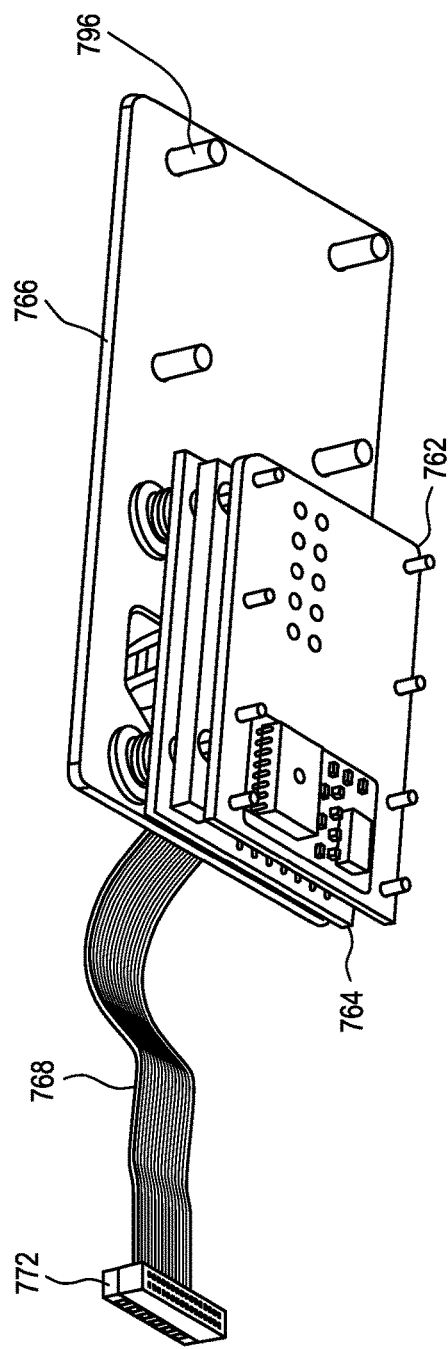
FIGS. 23a and 23b are view similar to FIGS. 22a and 22b after engagement of the components of the pressure monitoring system.
Figure 23B:
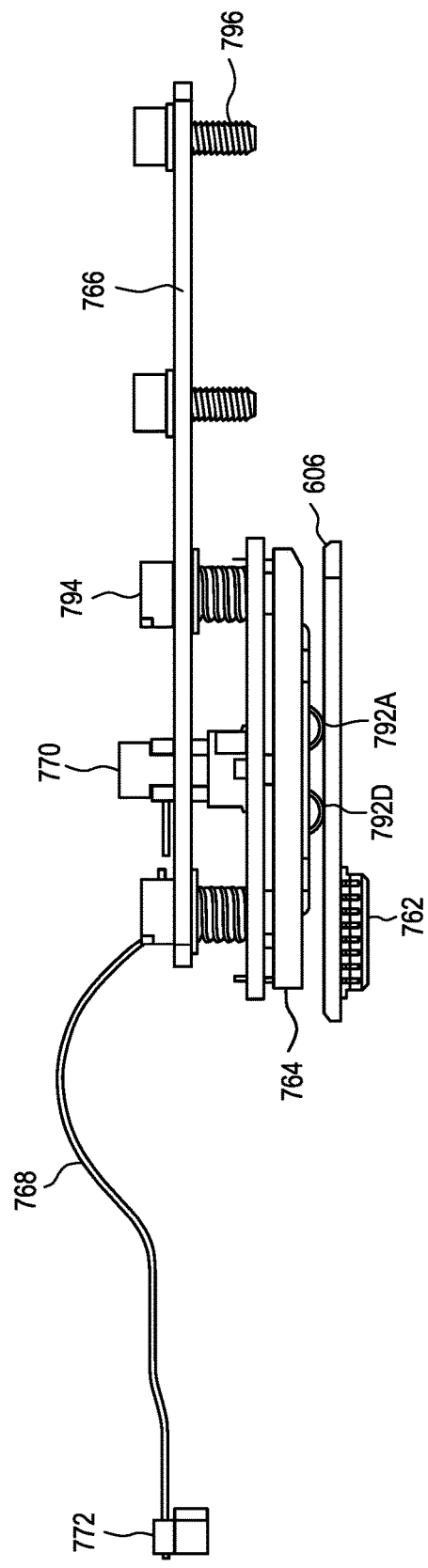

FIGS. 23a and 23b illustrate engagement of the electrical pressure sensor interface 606 with the electrical pressure connector interface 764 when the first wafer pack 28A is inserted into the slot assembly. The first, second and third contacts 782A, 782B and 782C first come into contact with the first, second and third terminals 792A, 792B and 792C, respectively. Further movement of the electrical pressure sensor interface 606 causes engagement of the first, second and third contacts 782A, 782B and 782C with the fourth, fifth and sixth terminals 792D, 792E and 792F, respectively. The first contact 782A thus makes contact with both the first terminal 792A and the fourth 792D. Similarly, each one of the contacts 782B and 782C makes contacts with two of the terminals 792B, 792C, 792E and 792F.

The terminals 792A to 792F are resiliently depressable relative to the board 790 to ensure proper contact with the contacts 782A to 782C. The ribbon cable 768 allows for a small amount of movement of the stiffener plate 776 relative to the slot assembly body 32 when the first wafer pack 28A is inserted.

The pressure within the pressure differential cavity 622 can be monitored throughout the entire process while a wafer is under test. Should a wafer fail testing, the tester can be programmed to determine whether such testing may be the result of a failure of the negative pressure within the pressure differential cavity 622.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A microelectronic circuit testing pack, comprising:
    a portable supporting structure including first and second components for holding a substrate therebetween, the substrate carrying a microelectronic circuit and having a plurality of terminals connected to the microelectronic circuit;
    a plurality of contacts on the second component, the contacts matching the terminals for making contact to the terminals;
    a pressure differential cavity seal between the first and second components, the pressure differential cavity seal forming an enclosed pressure differential cavity together with surfaces of the first and second components;
    a pressure reduction passage formed through one of the first and second components, the pressure reduction passage having an inlet opening at the pressure differential cavity and an outlet opening outside the pressure differential cavity;
    a pressure reduction valve connected to the pressure reduction passage, opening of the pressure reduction valve allowing air out of the pressure differential cavity to move the first and second components relatively towards one another for ensuring proper contact between the contacts and the terminals, and closing of the pressure reduction valve keeping air from entering the pressure differential cavity;
    a first interface, on the portable supporting structure and connected to the contacts, for connection to a second interface on a stationary structure when the portable supporting structure is removably held by the stationary structure;
    a pressure sensor positioned to detect a pressure in the pressure differential cavity; and
    an electrical pressure sensor interface connected to the pressure sensor to communicate the pressure with an electric tester.

2. The microelectronic circuit testing pack of claim 1, wherein the pressure sensor is positioned distant from the pressure differential cavity and a pressure sensing passage connects the pressure differential cavity with the pressure sensor.

3. The microelectronic circuit testing pack of claim 2, wherein the pressure reduction passage is formed in the first component.

4. The microelectronic circuit testing pack of claim 3, wherein the first component includes a backing plate and a signal distribution board, wherein a portion of the signal distribution board is located between the backing plate and the second component, wherein the pressure sensing passage is formed in the backing plate.

5. The microelectronic circuit testing pack of claim 4, wherein the pressure sensing passage is formed through the signal distribution board.

6. The microelectronic circuit testing pack of claim 1, wherein the pressure sensor is secured to the portable supporting structure.

7. The microelectronic circuit testing pack of claim 1, wherein the pressure differential cavity seal is secured to the first component when the first and second components are apart.

8. The microelectronic circuit testing pack of claim 1, wherein the pressure differential cavity seal is a lip seal.

9. The microelectronic circuit testing pack of claim 1, wherein the pressure reduction valve is a pressure reduction check valve, a vacuum release passage being formed through a component having the pressure reduction check valve, the vacuum release passage having an inlet opening at the pressure differential cavity and an outlet opening outside the pressure differential cavity, further comprising:
a second valve, being a vacuum release valve connected to the vacuum release passage, opening of the vacuum release valve allowing air into the pressure differential cavity and closing of the vacuum release valve keeping air from escaping out of the pressure differential cavity.

10. The microelectronic circuit testing pack of claim 1, wherein the substrate is a wafer with a plurality of microelectronic circuits.

11. The microelectronic circuit testing pack of claim 1, wherein the contacts are pins, each pin having a spring that is depressed against a spring force thereof when the respective contact is depressed by a respective one of the terminals.

12. A tester apparatus, comprising:
a portable supporting structure including first and second components for holding a substrate therebetween, the substrate carrying a microelectronic circuit and having a plurality of terminals connected to the microelectronic circuit;
a plurality of contacts on the second component, the contacts matching the terminals for making contact to the terminals;
a pressure differential cavity seal between the first and second components, the pressure differential cavity seal forming an enclosed pressure differential cavity together with surfaces of the first and second components;
a pressure reduction passage formed through one of the first and second components, the pressure reduction passage having an inlet opening at the pressure differential cavity and an outlet opening outside the pressure differential cavity;
a pressure reduction valve connected to the pressure reduction passage, opening of the pressure reduction valve allowing air out of the pressure differential cavity to move the first and second components relatively towards one another for ensuring proper contact between the contacts and the terminals, and closing of the pressure reduction valve keeping air from entering the pressure differential cavity;
a first interface on the portable supporting structure and connected to the contacts;
a stationary structure, the portable supporting structure being receivable to be held by the stationary structure and being removable from the stationary structure;
a second interface on the stationary structure, the second interface being connected to the first interface when the portable supporting structure is held by the stationary structure, and being disconnected from the first interface when the portable supporting structure is removed from the stationary structure;
an electrical tester connected through the second interface, the first interface, and the contacts to the terminals so that signals are transmitted between the electrical tester and the microelectronic circuit to test the microelectronic circuit; and
a pressure monitoring system that includes:
a pressure sensor positioned to detect a pressure in the pressure differential cavity; and
an electrical pressure sensor interface connected to the pressure sensor to communicate the pressure with an electric tester.

13. The tester apparatus of claim 12, wherein the pressure sensor is positioned distant from the pressure differential cavity and a pressure sensing passage connects the pressure differential cavity with the pressure sensor.

14. The tester apparatus of claim 13, wherein the pressure reduction passage is formed in the first component.

15. The tester apparatus of claim 14, wherein the first component includes a backing plate and a signal distribution board, wherein a portion of the signal distribution board is located between the backing plate and the second component, wherein the pressure sensing passage is formed in the backing plate.

16. The tester apparatus of claim 15, wherein the pressure sensing passage is formed through the signal distribution board.

17. The tester apparatus of claim 12, wherein the pressure sensor is secured to the portable supporting structure.

18. The tester apparatus of claim 12, wherein the pressure monitoring system includes:
an electrical pressure connector interface on the stationary structure, the electrical pressure sensor interface releasably making contact with the electrical pressure connector interface to communicate the pressure with the electric tester.

19. The tester apparatus of claim 18, wherein the electrical pressure sensor interface includes at least a first contact and the pressure monitoring system includes at least a first terminal, wherein the first contact engages with the first terminal when the portable supporting structure is received by the stationary structure and the first contact disengages from the first terminal when the portable supporting structure is removed from the stationary structure.

20. The tester apparatus of claim 19, wherein the electrical pressure sensor interface is in a printed circuit board having a substrate and the first contact is formed on the substrate.

21. The tester apparatus of claim 19, wherein the electrical pressure sensor interface includes at least a second contact and the pressure monitoring system includes at least a second terminal, wherein the second contact engages with the second terminal when the portable supporting structure is received by the stationary structure and the second contact disengages from the second terminal when the portable supporting structure is removed from the stationary structure.

22. The tester apparatus of claim 12, wherein the pressure differential cavity seal surrounds the contacts and the terminals.

23. The tester apparatus of claim 12, wherein the pressure differential cavity seal is secured to the first component when the first and second components are apart.

24. The tester apparatus of claim 12, wherein the pressure differential cavity seal is a lip seal.

25. The tester apparatus of claim 12, wherein the pressure reduction valve is a pressure reduction check valve, a vacuum release passage being formed through a component having the pressure reduction check valve, the vacuum release passage having an inlet opening at the pressure differential cavity and an outlet opening outside the pressure differential cavity, further comprising:
a second valve, being a vacuum release valve connected to the vacuum release passage, opening of the vacuum release valve allowing air into the pressure differential cavity and closing of the vacuum release valve keeping air from escaping out of the pressure differential cavity.

26. The tester apparatus of claim 12 wherein the stationary structure includes a thermal chuck, the second component of the portable supporting structure including a thin chuck contacting the thermal chuck to allow for transfer of heat between the portable supporting structure and the thermal chuck.

27. The tester apparatus of claim 12 wherein the substrate is a wafer with a plurality of microelectronic circuits.

28. The tester apparatus of claim 12 wherein the contacts are pins, each pin having a spring that is depressed against a spring force thereof when the respective contact is depressed by a respective one of the terminals.

29. A method of testing a microelectronic circuit held by a substrate, comprising:
holding the substrate between first and second components of a portable supporting structure, the second component having contacts against terminals of the substrate connected to the microelectronic circuit, wherein a pressure reduction passage is formed through one of the first and second components, the pressure reduction passage having an inlet opening at a pressure differential cavity and an outlet opening outside the pressure differential cavity;
locating a pressure differential cavity seal between the first and second components to form an enclosed cavity by surfaces of the first and second components and the pressure differential cavity seal;
opening a pressure reduction valve to allow air out of the pressure differential cavity and reducing a pressure within the pressure differential cavity to move the first and second components relatively towards one another to ensure proper contact between the contacts and the terminals;
closing the pressure reduction valve, keeping air from entering the pressure differential cavity;
receiving the portable supporting structure by a stationary structure with a first interface on the portable supporting structure connected to a second interface on the stationary structure;
transmitting signals between an electrical tester and the microelectronic circuit through the terminals, contacts, and first and second interfaces to test the microelectronic circuit;
detecting a pressure in the pressure differential cavity of a pressure monitoring system; and
communicating the pressure with an electric tester.

30. The method of claim 29 wherein the pressure sensor is positioned distant from the pressure differential cavity and a pressure sensing passage connects the pressure differential cavity with the pressure sensor.

31. The method of claim 30 wherein the pressure reduction passage is formed in the first component.

32. The method of claim 31, wherein the first component includes a backing plate and a signal distribution board, wherein a portion of the signal distribution board is located between the backing plate and the second component, wherein the pressure sensing passage is formed in the backing plate.

33. The method of claim 32, wherein the pressure sensing passage is formed through the signal distribution board.

34. The method of claim 29, wherein the pressure sensor is secured to the portable supporting structure.

35. The method of claim 29, wherein the pressure monitoring system includes:
an electrical pressure connector interface on the stationary structure, the electrical pressure sensor interface releasably making contact with the electrical pressure connector interface to communicate the pressure with the electric tester.

36. The method of claim 35, wherein the electrical pressure sensor interface includes at least a first contact and the pressure monitoring system includes at least a first terminal, wherein the first contact engages with the first terminal when the portable supporting structure is received by the stationary structure and the first contact disengages from the first terminal when the portable supporting structure is removed from the stationary structure.

37. The method of claim 36, wherein the electrical pressure sensor interface is in a printed circuit board having a substrate and the first contact is formed on the substrate.

38. The method of claim 36, wherein the electrical pressure sensor interface includes at least a second contact and the pressure monitoring system includes at least a second terminal, wherein the second contact engages with the second terminal when the portable supporting structure is received by the stationary structure and the second contact disengages from the second terminal when the portable supporting structure is removed from the stationary structure.

39. The method of claim 33, wherein the pressure differential cavity seal surrounds the contacts and the terminals.

40. The method of claim 34, wherein the pressure differential cavity seal is secured to the first component when the first and second components are apart.

41. The method of claim 29, wherein the pressure differential cavity seal is created with a lip seal.

42. The method of claim 29, wherein the pressure reduction valve is a pressure reduction check valve, a vacuum release passage being formed through a component having the pressure reduction check valve, the vacuum release passage having an inlet opening at the pressure differential cavity and an outlet opening outside the pressure differential cavity, further comprising:
opening a second valve, being a vacuum release valve connected to the vacuum release passage, to allow air into the pressure differential cavity.

43. The method of claim 29, wherein the stationary structure includes a thermal chuck, the second component of the portable supporting structure including a thin chuck.

44. The method of claim 29, wherein the substrate is a wafer with a plurality of microelectronic circuits.

45. The method of claim 29, wherein the contacts are pins, each pin having a spring that is depressed against a spring force thereof when the respective contact is depressed by a respective one of the terminals.

* * * * *